US012176203B2

United States Patent
Zhou et al.

(10) Patent No.: US 12,176,203 B2
(45) Date of Patent: *Dec. 24, 2024

(54) METHODS AND APPARATUSES FOR FORMING SEMICONDUCTOR DEVICES CONTAINING TUNGSTEN LAYERS USING A TUNGSTEN GROWTH SUPPRESSANT

(71) Applicant: SANDISK TECHNOLOGIES LLC, Addison, TX (US)

(72) Inventors: Fei Zhou, San Jose, CA (US); Rahul Sharangpani, Fremont, CA (US); Raghuveer S. Makala, Campbell, CA (US); Yujin Terasawa, Yokkaichi (JP); Naoki Takeguchi, Nagoya (JP); Kensuke Yamaguchi, Yokkaichi (JP); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 354 days.

This patent is subject to a terminal disclaimer.

(21) Appl. No.: 17/573,452

(22) Filed: Jan. 11, 2022

(65) Prior Publication Data

US 2023/0223248 A1 Jul. 13, 2023

(51) Int. Cl.
*H01L 21/02* (2006.01)
*C23C 16/458* (2006.01)

(52) U.S. Cl.
CPC .... *H01L 21/02175* (2013.01); *C23C 16/4583* (2013.01); *H01L 21/02271* (2013.01)

(58) Field of Classification Search
CPC ......... H01L 21/28568; H01L 21/76876; H01L 21/76846; H01L 29/40111; H01L 29/40114; H01L 29/40117; H01L 21/28562; H01L 21/76877; C23C 16/14; C23C 16/45525; C23C 16/45534;
(Continued)

(56) References Cited

U.S. PATENT DOCUMENTS 4,746,549 A * 5/1988 Ito ..................... H01L 21/76879
427/124
8,928,061 B2 1/2015 Chien et al.
9,159,739 B2 10/2015 Makala et al.
(Continued)

FOREIGN PATENT DOCUMENTS

KR 10-2021-0117343 A 9/2021
WO WO2020-118100 A1 6/2020

OTHER PUBLICATIONS

Notification of Transmittal of the International Search Report and Written Opinion of the International Searching Authority for International Patent Application No. PCT/US2022/029861, mailed Oct. 11, 2022, 11 pages.
(Continued)

*Primary Examiner* — Julia Slutsker
(74) *Attorney, Agent, or Firm* — THE MARBURY LAW GROUP PLLC

(57) ABSTRACT

A method of depositing a metal includes providing a structure a process chamber, and providing a metal fluoride gas and a growth-suppressant gas into the process chamber to deposit the metal over the structure. The metal may comprise a word line or another conductor of a three-dimensional memory device.

4 Claims, 59 Drawing Sheets

(58) Field of Classification Search
CPC ........ H10B 41/27; H10B 43/27; H10B 51/20; H10B 63/84
See application file for complete search history.

(56) References Cited

U.S. PATENT DOCUMENTS

| | | |
|---|---|---|
| 9,397,046 B1 | 7/2016 | Sharangpani et al. |
| 9,698,152 B2 | 7/2017 | Peri et al. |
| 9,748,174 B1 | 8/2017 | Amano |
| 9,780,182 B2 | 10/2017 | Peri et al. |
| 9,793,139 B2 | 10/2017 | Sharangpani et al. |
| 9,799,671 B2 | 10/2017 | Pachamuthu et al. |
| 9,842,907 B2 | 12/2017 | Makala et al. |
| 9,984,963 B2 | 5/2018 | Peri et al. |
| 10,115,897 B1 | 10/2018 | Sato |
| 10,128,261 B2 | 11/2018 | Makala et al. |
| 10,229,931 B1 | 3/2019 | Hinoue et al. |
| 10,276,583 B2 | 4/2019 | Sharangpani et al. |
| 10,290,652 B1 | 5/2019 | Sharangpani et al. |
| 10,355,139 B2 | 7/2019 | Sharangpani et al. |
| 10,361,213 B2 | 7/2019 | Sharangpani et al. |
| 10,381,372 B2 | 8/2019 | Amano et al. |
| 10,529,620 B2 | 1/2020 | Sharangpani et al. |
| 10,608,010 B2 | 3/2020 | Terasawa et al. |
| 10,615,123 B2 | 4/2020 | Hinoue et al. |
| 10,707,233 B1 | 7/2020 | Cui et al. |
| 10,741,572 B2 | 8/2020 | Sharangpani et al. |
| 10,818,542 B2 | 10/2020 | Cui et al. |
| 10,818,545 B2 | 10/2020 | Shimabukuro et al. |
| 10,916,504 B2 | 2/2021 | Mukae et al. |
| 11,217,532 B2 | 1/2022 | Sharangpani et al. |
| 2005/0031786 A1 | 2/2005 | Lee et al. |
| 2013/0302980 A1* | 11/2013 | Chandrashekar .... H10B 12/488 438/666 |
| 2014/0319614 A1 | 10/2014 | Paul et al. |
| 2016/0225866 A1 | 8/2016 | Peri et al. |
| 2016/0300848 A1 | 10/2016 | Pachamuthu et al. |
| 2016/0351497 A1 | 12/2016 | Peri et al. |
| 2017/0125538 A1 | 5/2017 | Sharangpani et al. |
| 2017/0352669 A1 | 12/2017 | Sharangpani et al. |
| 2017/0373079 A1 | 12/2017 | Sharangpani et al. |
| 2017/0373197 A1 | 12/2017 | Sharangpani et al. |
| 2018/0019256 A1 | 1/2018 | Amano et al. |
| 2018/0033646 A1 | 2/2018 | Sharangpani et al. |
| 2018/0090373 A1 | 5/2018 | Sharangpani et al. |
| 2019/0280001 A1 | 9/2019 | Terasawa et al. |
| 2019/0287916 A1 | 9/2019 | Sharangpani et al. |
| 2019/0287982 A1 | 9/2019 | Hinoue et al. |
| 2020/0006131 A1 | 1/2020 | Shimabukuro et al. |
| 2020/0251488 A1* | 8/2020 | Iwai ....................... H10B 43/27 |
| 2020/0395310 A1 | 12/2020 | Mukae et al. |
| 2023/0089397 A1* | 3/2023 | Chun ................ C23C 16/45536 118/725 |
| 2024/0006180 A1 | 1/2024 | Pan et al. |

OTHER PUBLICATIONS

USPTO Office Communication, Non-Final Office Action for U.S. Appl. No. 17/573,429, mailed Apr. 25, 2024, 30 pages.

U.S. Appl. No. 16/987,717, filed Aug. 7, 2020, SanDisk Technologies LLC.

U.S. Appl. No. 17/085,735, filed Oct. 30, 2020, SanDisk Technologies LLC.

U.S. Appl. No. 17/166,393, filed Feb. 3, 2021, SanDisk Technologies LLC.

U.S. Appl. No. 17/509,323, filed Oct. 25, 2021, SanDisk Technologies LLC.

Zhou, F. et al., "Methods and Apparatuses for Forming Semiconductor Devices Containing Tungsten Layers Using a Tungsten Growth Suppressant," U.S. Appl. No. 17/573,429, filed Jan. 11, 2022.

Sharangpani, R. et al., "Methods and Apparatuses for Forming Semiconductor Devices Containing Tungsten Layers Using a Tungsten Growth Suppressant," U.S. Appl. No. 17/573,466, filed Jan. 11, 2022.

* cited by examiner

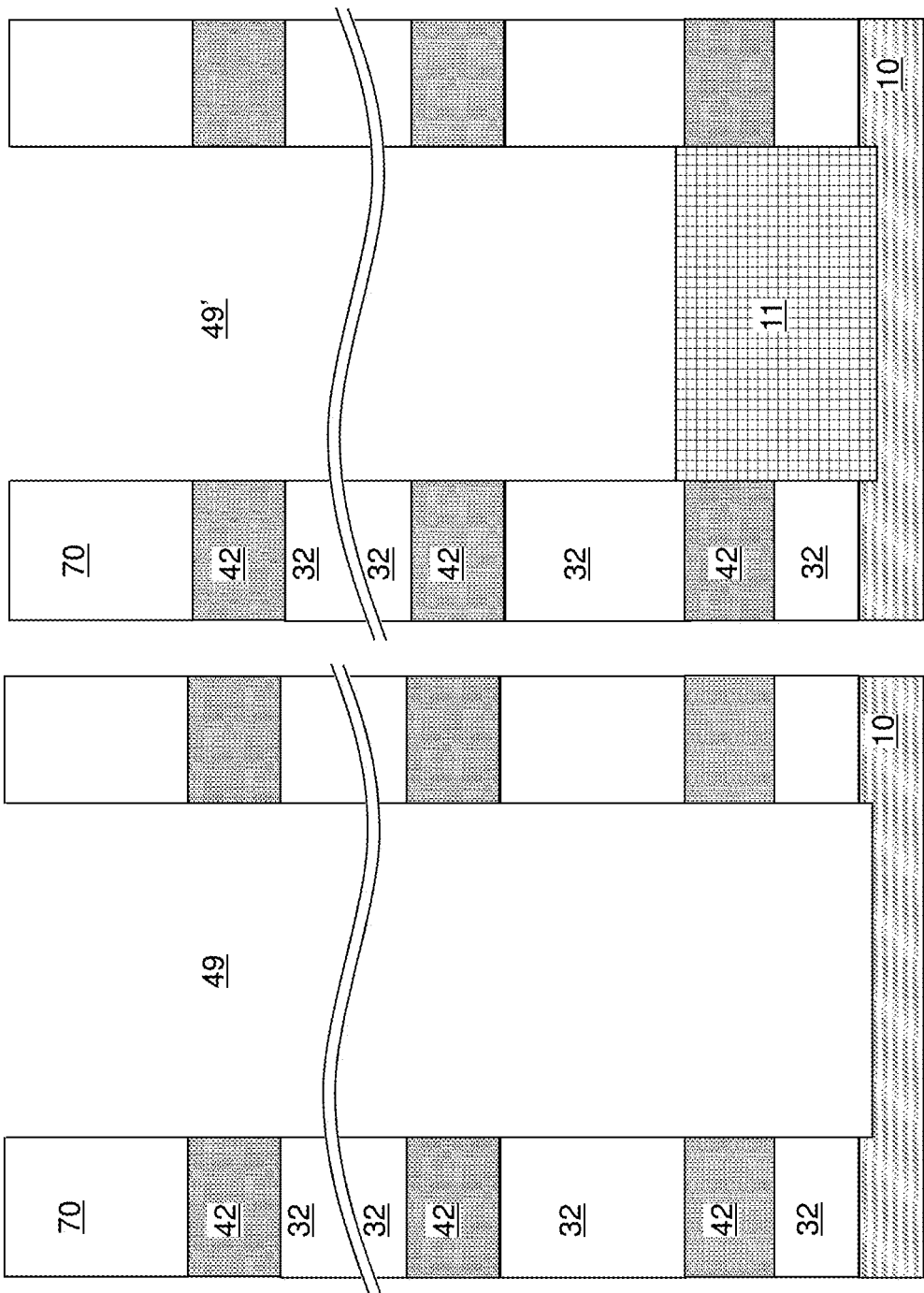

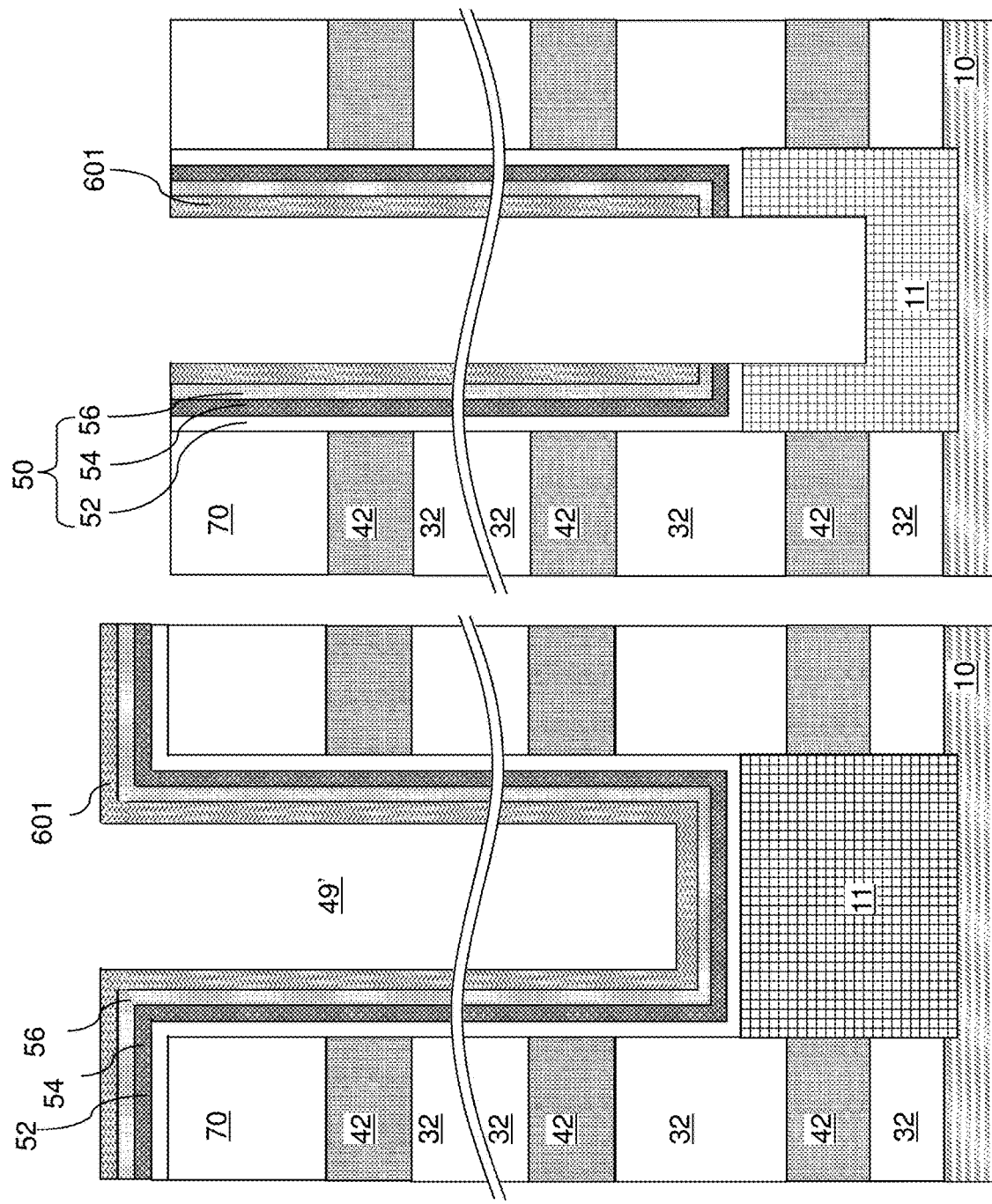

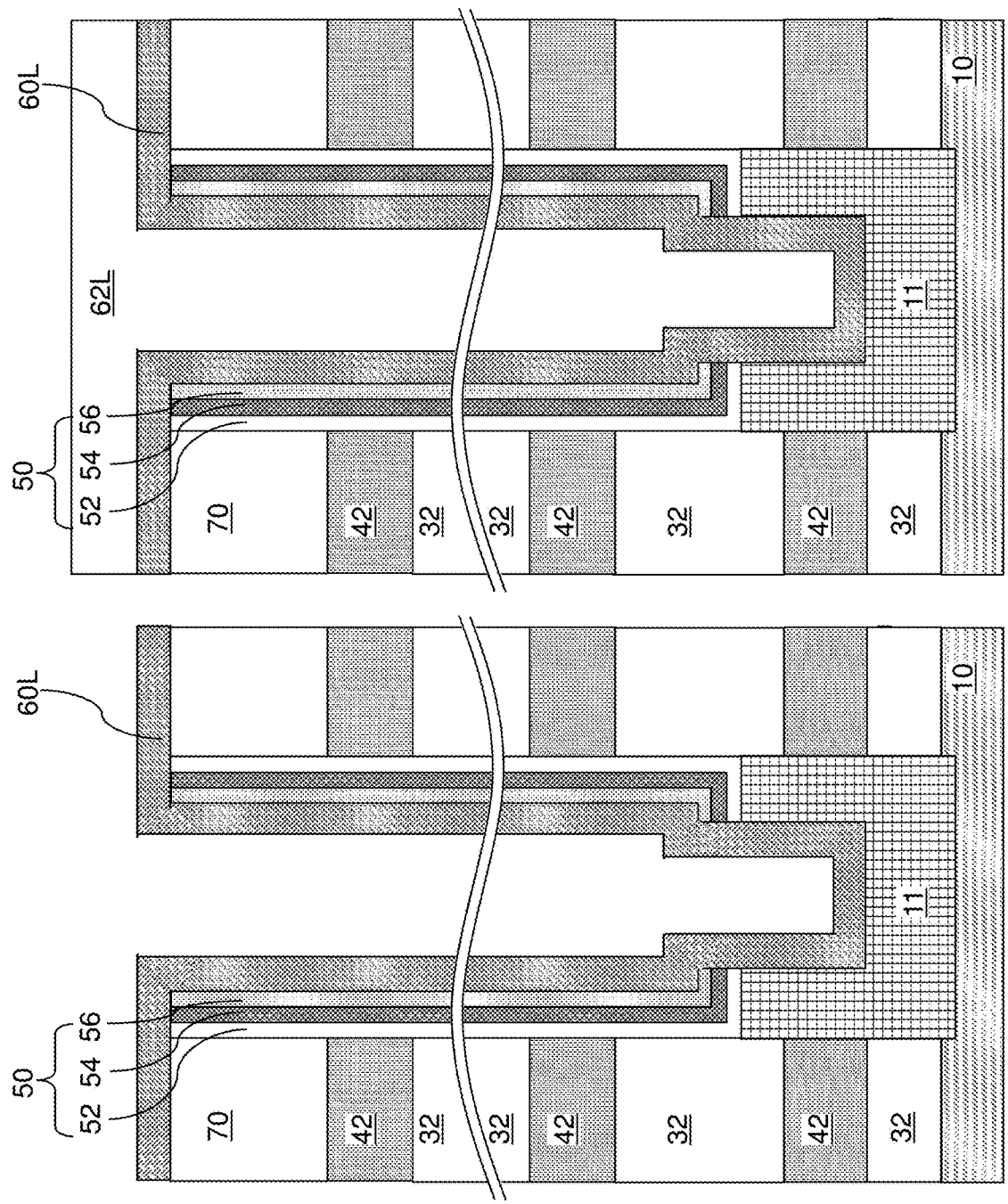

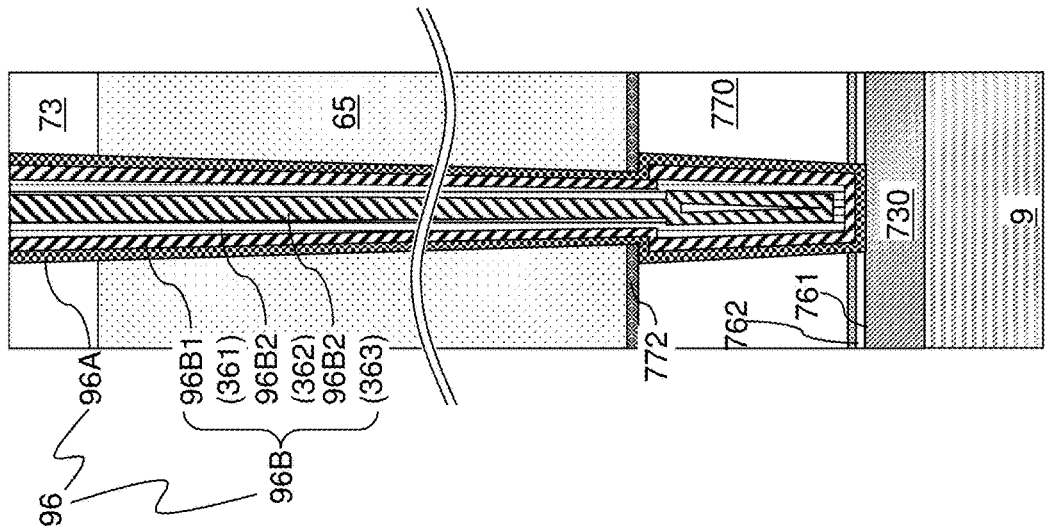
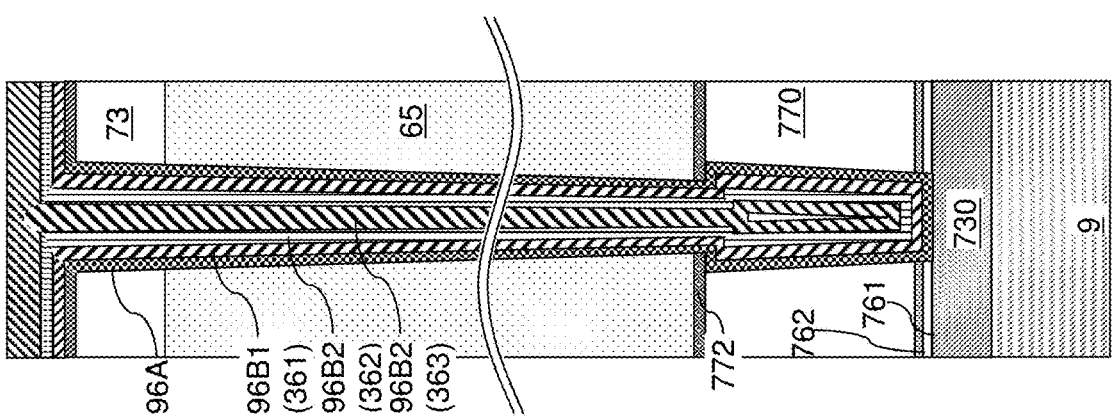
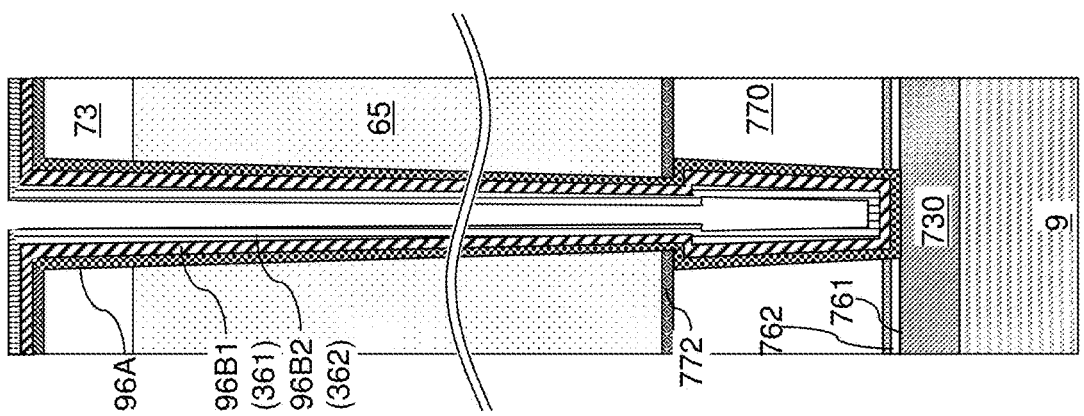

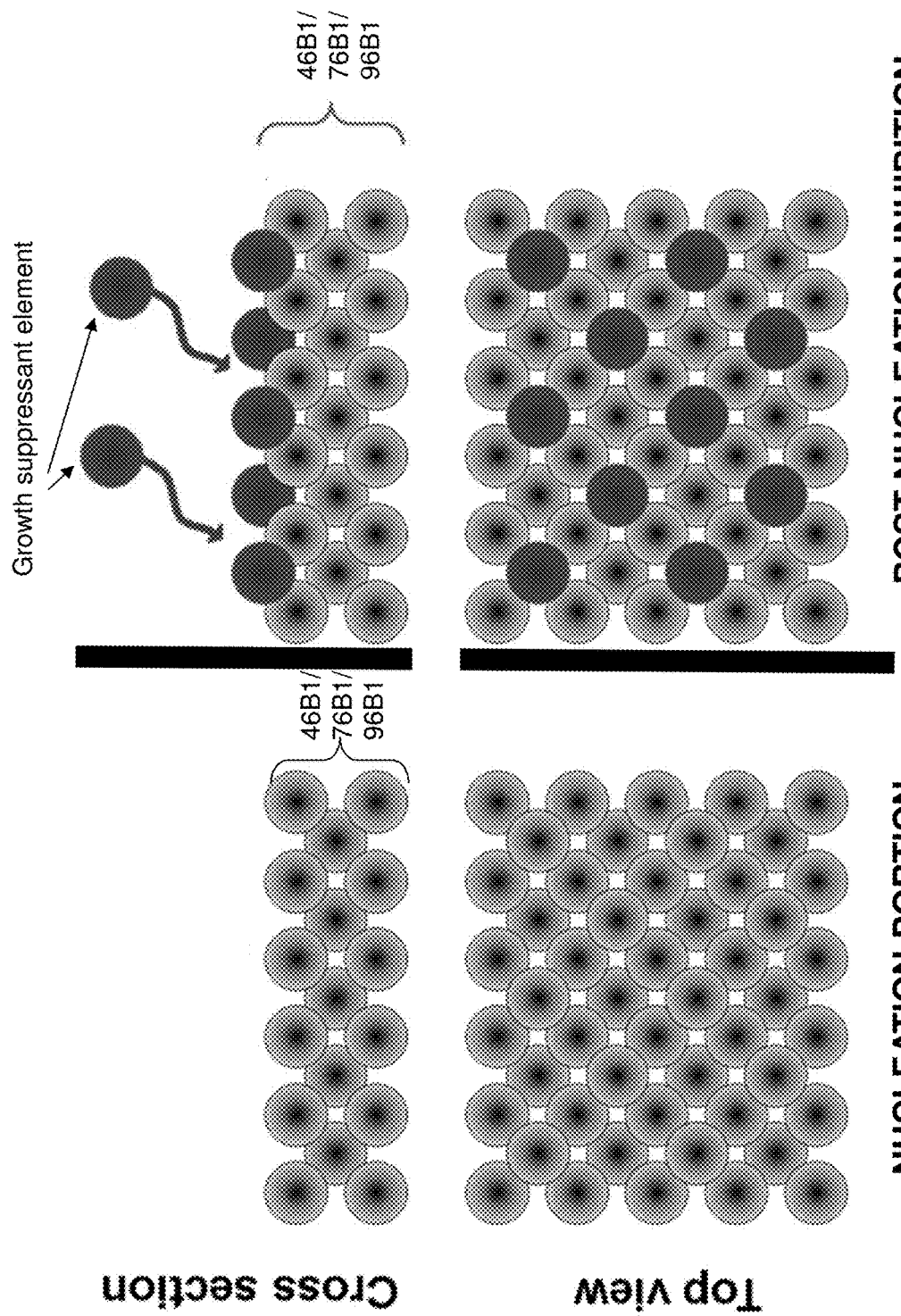

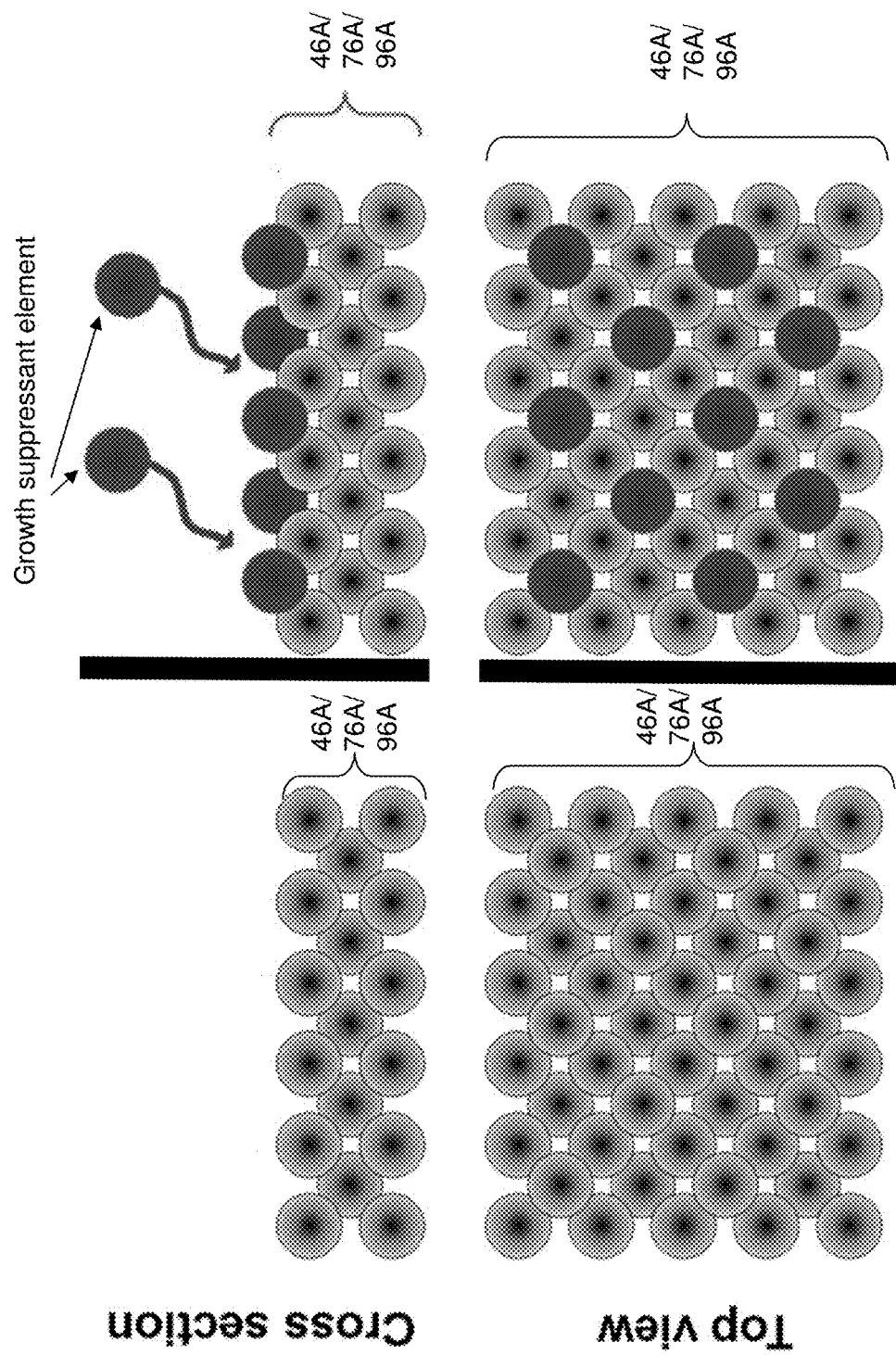

METHODS AND APPARATUSES FOR FORMING SEMICONDUCTOR DEVICES CONTAINING TUNGSTEN LAYERS USING A TUNGSTEN GROWTH SUPPRESSANT

FIELD

The present disclosure relates generally to the field of semiconductor device manufacturing, and particularly to methods of making semiconductor devices, such as three dimensional memory devices, containing tungsten layers deposited using a tungsten growth suppressant.

BACKGROUND

Three dimensional memory devices include various conductive layers, such as word lines, that include tungsten. Tungsten may be deposited using a fluorine-containing precursor gas, such as tungsten hexafluoride. However, the residual fluorine may cause voids in adjacent insulating layers of the memory devices during a degassing process that follows tungsten deposition. The voids degrade the reliability of the memory devices.

SUMMARY

According to an aspect of the present disclosure, a method of depositing a metal comprises providing a structure a process chamber, and providing a metal fluoride gas and a growth-suppressant gas into the process chamber to deposit the metal over the structure.

According to another aspect of the present disclosure, a method of depositing a metal comprises providing a structure a process chamber, and providing a metal fluoride gas and two growth-suppressant gases into the process chamber to deposit the metal over the structure.

According to yet another aspect of the present disclosure, a tungsten deposition apparatus, comprises at least one tungsten deposition chamber configured to receive at least one substrate therein and to deposit a tungsten layer on the at least one substrate by flowing a tungsten hexafluoride gas, a surface treatment chamber that is connected to the at least one tungsten deposition chamber, wherein the surface treatment chamber is configured to receive the at least one substrate therein and to expose the substrate to a tungsten growth-suppressant gas, and at least one load lock configured to transfer the at least one substrate between the surface treatment chamber and the at least one tungsten deposition chamber.

According to still another aspect of the present disclosure, a method of depositing an electrically conductive layer comprises providing a structure including a cavity therein, disposing the structure in a process chamber, depositing a first portion of the electrically conductive layer over at least one surface of the cavity, exposing the first portion of the electrically conductive layer to a tungsten growth-suppressant gas, and depositing a second tungsten portion of the electrically conductive layer on the first portion of the electrically conductive layer by decomposition of tungsten hexafluoride.

According to still another aspect of the present disclosure, a semiconductor structure comprises an active semiconductor device, and a tungsten layer located in a cavity in the semiconductor structure. The tungsten layer has a different concentration of at least one of chlorine or nitrogen atoms in a first portion located closer to the cavity sidewalls than in a second portion located farther from the cavity sidewalls, and the tungsten layer has a different concentration of fluorine atoms in the first portion located closer to the cavity sidewalls than in the second portion located farther from the cavity sidewalls. An amount of the fluorine atoms increases in an opposite direction through a thickness of the tungsten layer than an amount of the at least one of chlorine or nitrogen atoms.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 18A-18F are sequential vertical cross-sectional views of a device contact via cavity during formation of a contact via structure according to an embodiment of the present disclosure.

FIGS. 22B and 22C illustrate respective top and vertical-cross sectional views of a surface of a nucleation portion of a metal layer during the third exemplary sequence of processing steps according to an embodiment of the present disclosure.

FIGS. 23A and 23B illustrate respective top and vertical cross-sectional views of a surface of a barrier liner during a fourth exemplary sequence of processing steps according to an embodiment of the present disclosure.

DETAILED DESCRIPTION

Figure 1:
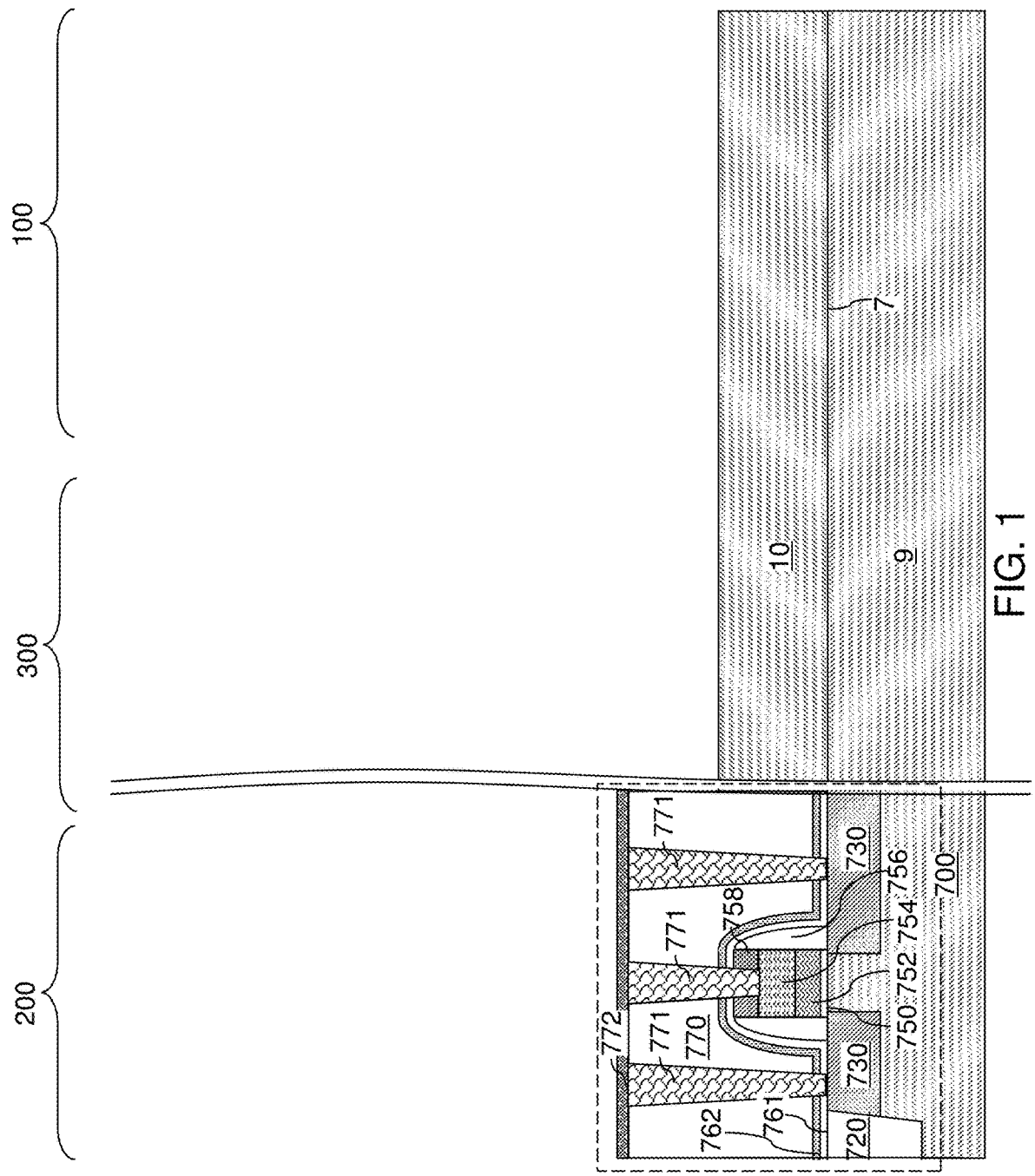
FIG. 1 is a schematic vertical cross-sectional view of an exemplary structure after formation of at least one peripheral device, sacrificial via fill structures embedded in a dielectric material layer, and a semiconductor material layer according to an embodiment of the present disclosure.

As discussed above, the embodiments of the present disclosure are directed to tungsten layers deposited using a tungsten growth suppressant, the various aspects of which are described below. The embodiments of the disclosure can be employed to form various structures including a multi-level memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another.

As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer.

A dielectric material such as silicon oxide can be deposited over the at least one semiconductor device, and can be subsequently planarized to form a dielectric material layer, which is herein referred to as a planarization dielectric layer 770. Contact via cavities can be formed through the planarization dielectric layer 770, and can be filled within a sacrificial fill material such as amorphous silicon, germanium, carbon, or organosilicate glass to form sacrificial via fill structures 771. An etch stop dielectric layer 772 such as a silicon nitride layer or a dielectric metal oxide layer can be optionally formed over the planarization dielectric layer 770.

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 (e.g., a transistor for a peripheral/driver circuitry) may be located under the memory array region 100 in a CMOS under array configuration. In another alternative embodiment, the peripheral device region 200 may be located on a separate substrate which is subsequently bonded to the memory array region 100.

Figure 2:
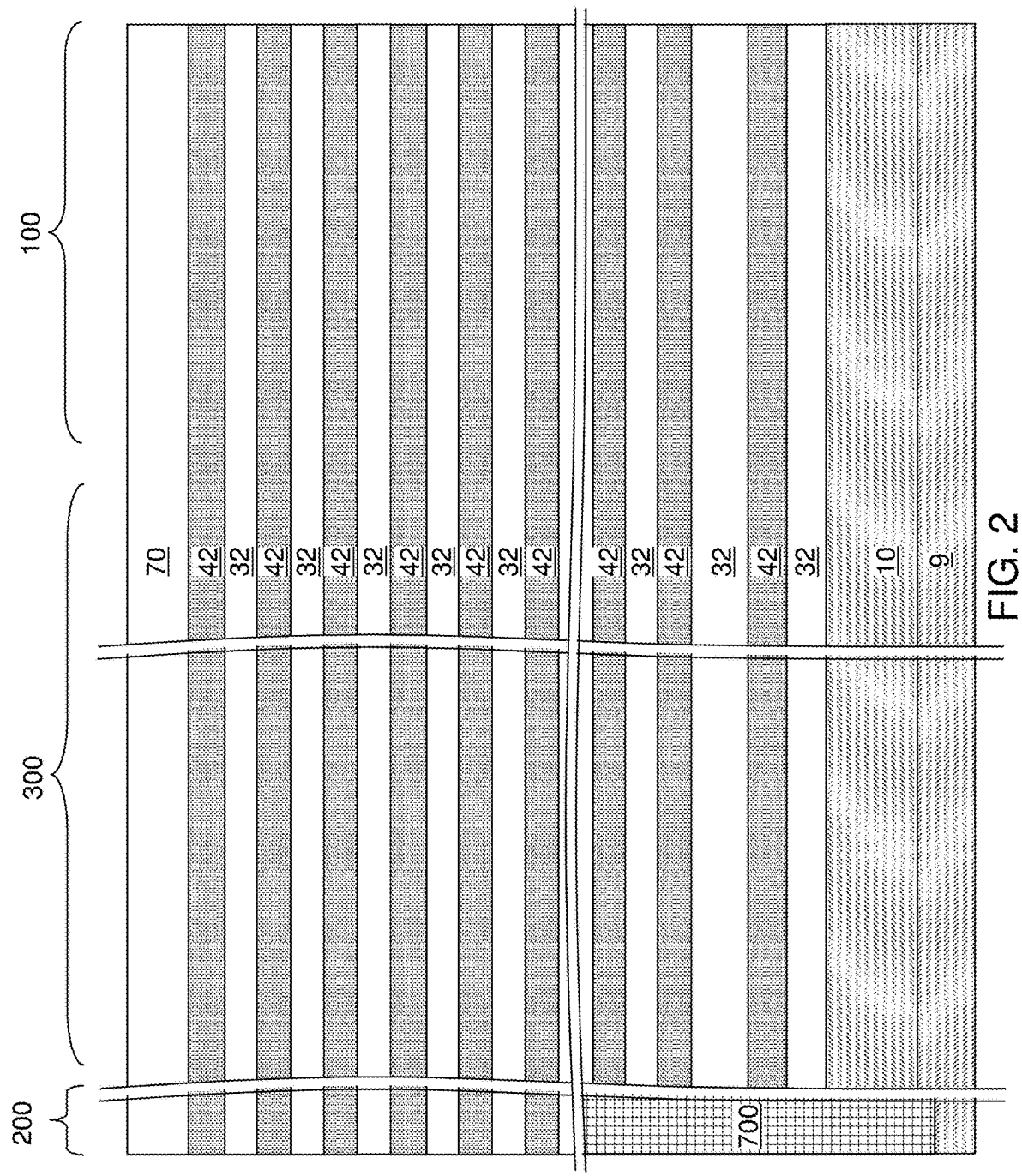
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. The sacrificial material layers 42 are replaced with electrically conductive layers that function as select gate electrodes and word lines/control gate electrodes. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
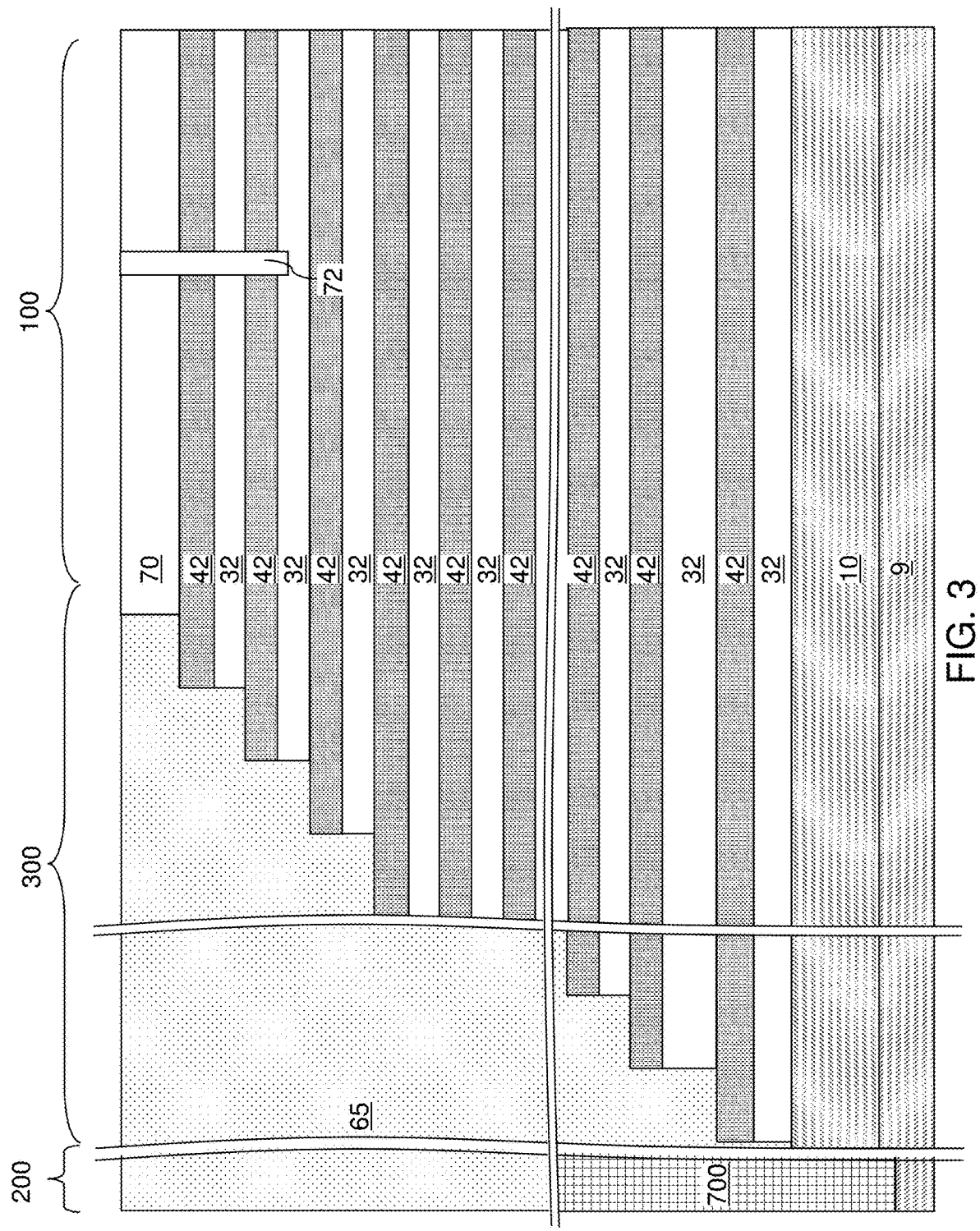
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
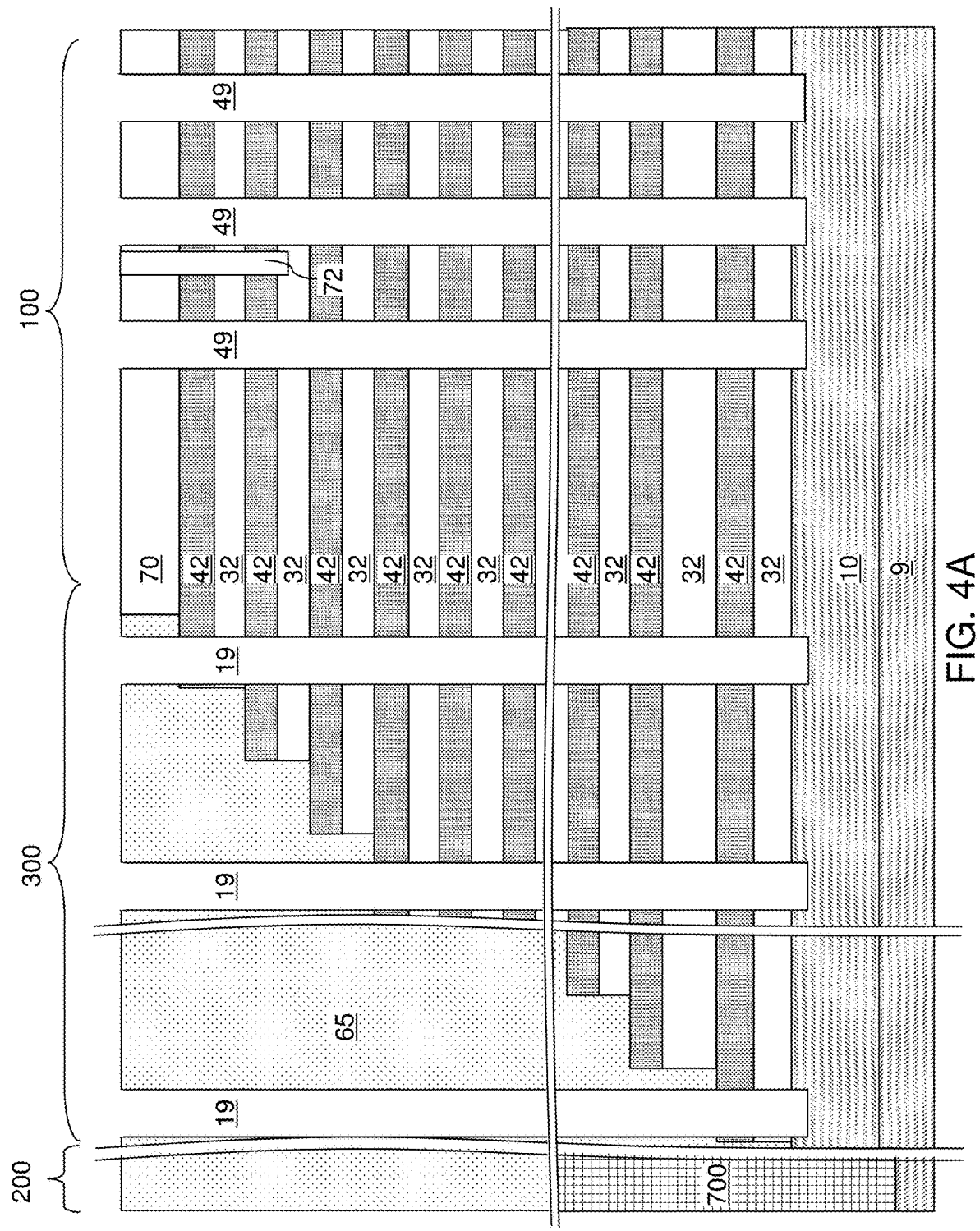
FIG. 4A is a schematic vertical cross-sectional view of the exemplary structure after formation of memory openings and support openings according to an embodiment of the present disclosure.
Figure 4B:
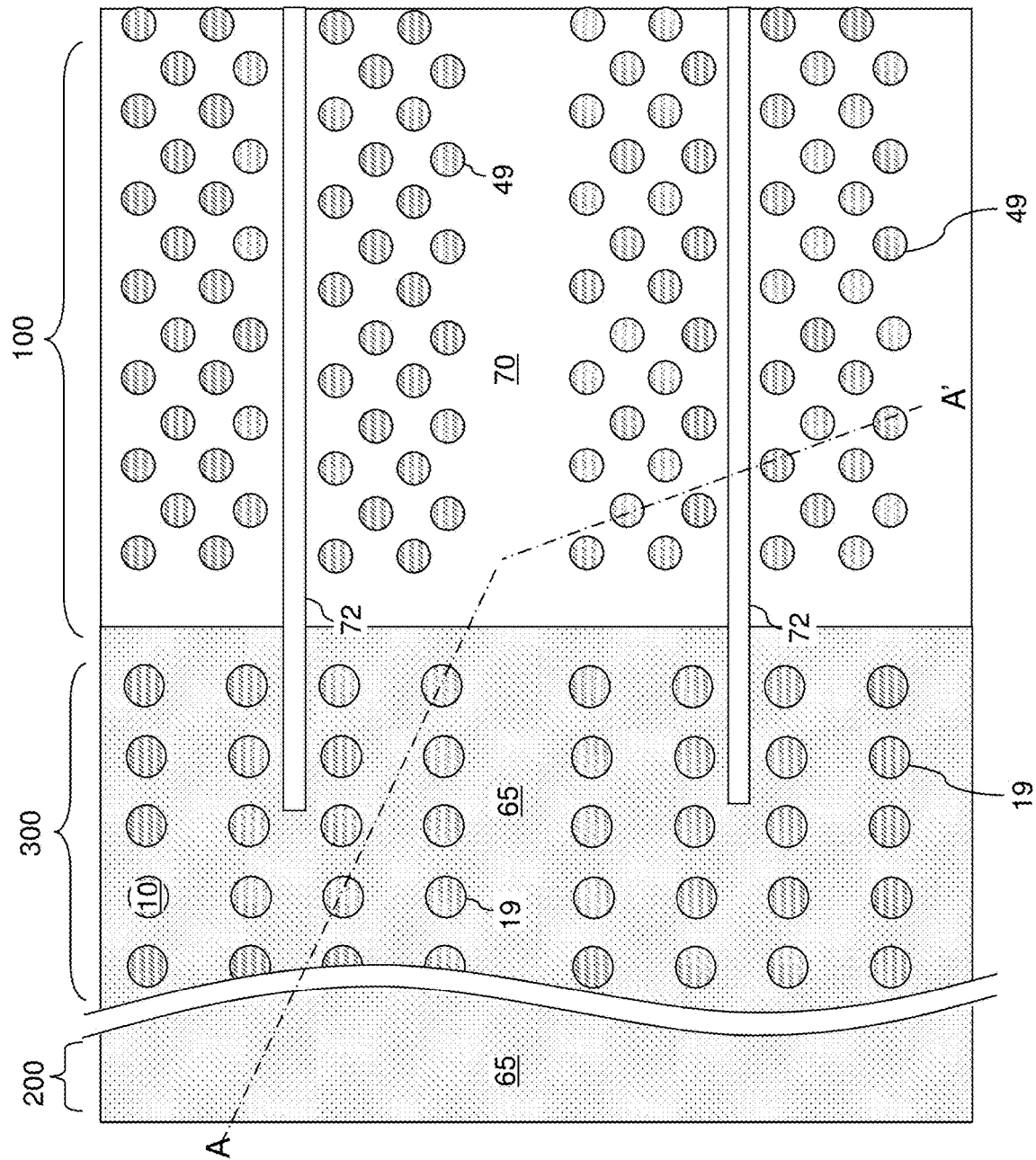
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing. The memory openings 49 and the support openings 19 can extend from the top surface of the alternating stack (32, 42) to at least the horizontal plane including the topmost surface of the semiconductor material layer 10.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

Referring to FIG. 5D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region. A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
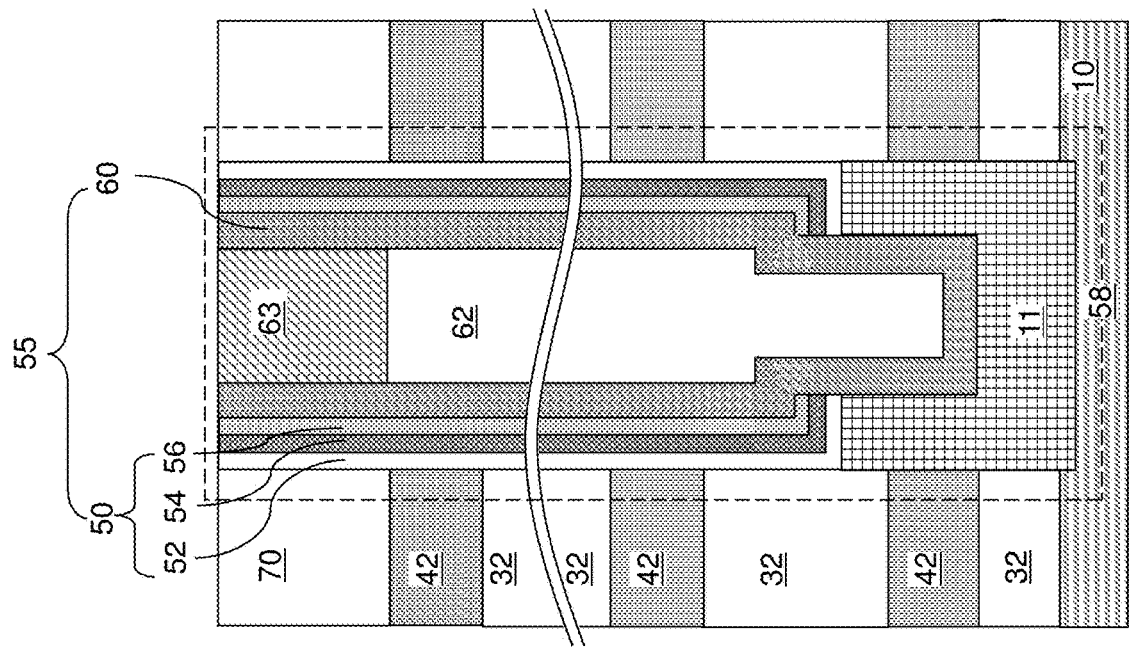
Figure 5G:
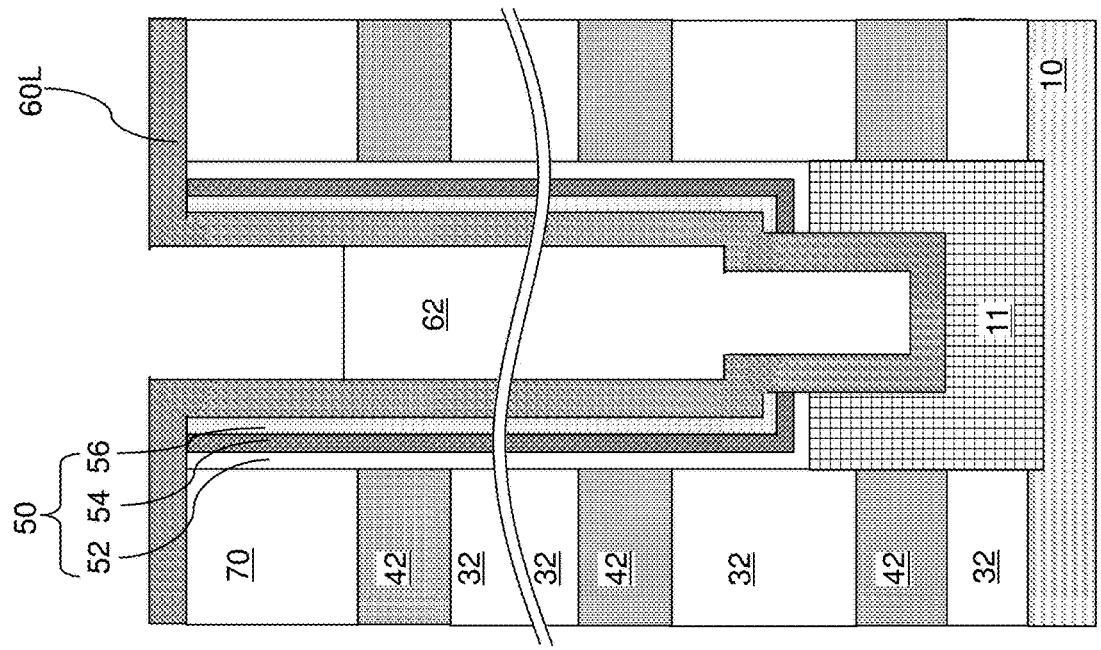

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements as embodied as portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 may laterally surround the dielectric material liner 56. A vertical NAND string can be formed through each memory opening upon subsequent replacement of the sacrificial material layers 42 with electrically conductive layers.

Figure 6:
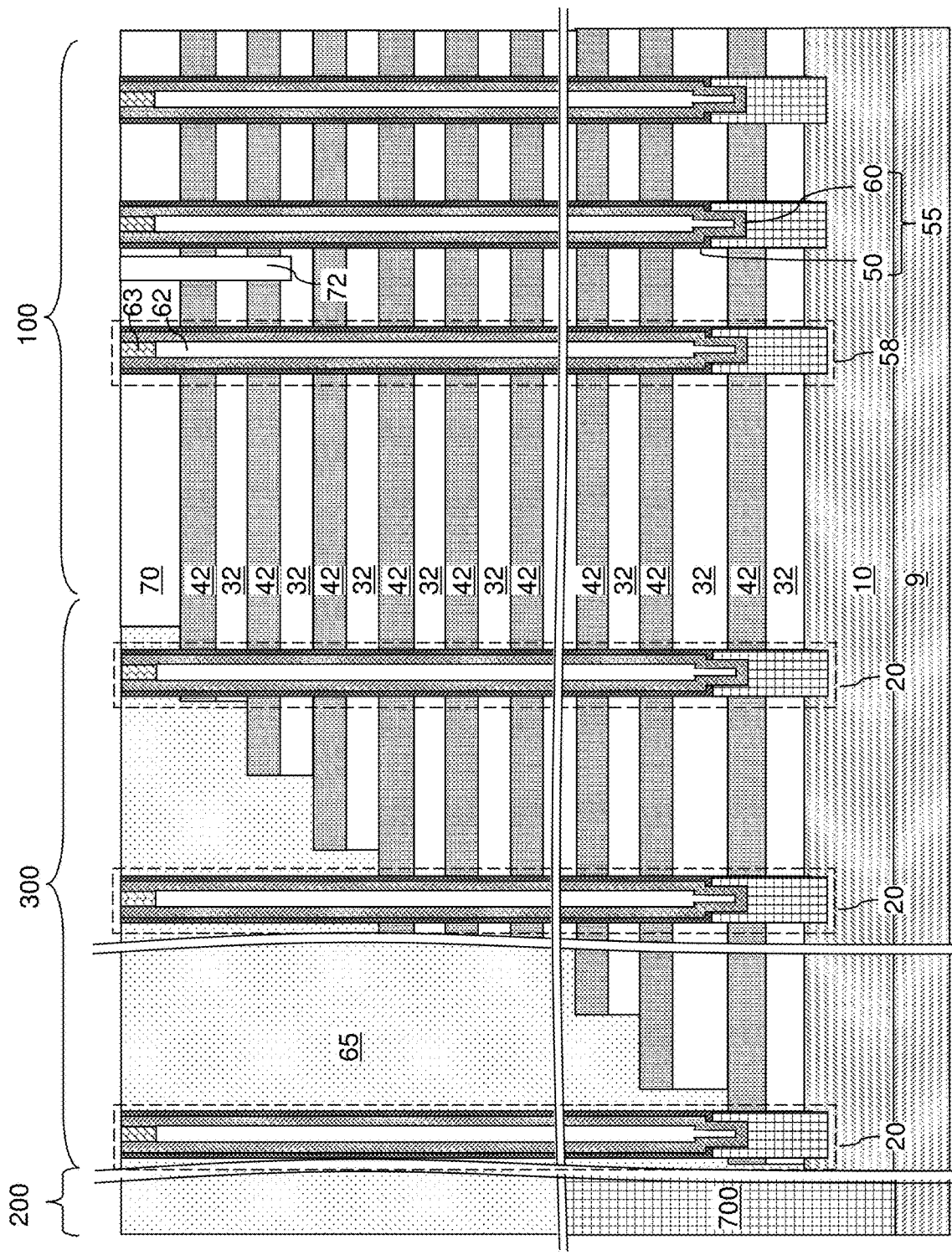
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (comprising portions of the memory material layer 54) laterally surrounding the dielectric material liner 56, and an optional blocking dielectric layer 52. The methods of the embodiments of the present disclosure can be applied to alternative memory stack structures including different layer stacks or structures for the memory film 50 and/or for the vertical semiconductor channel 60.

Figure 7A:
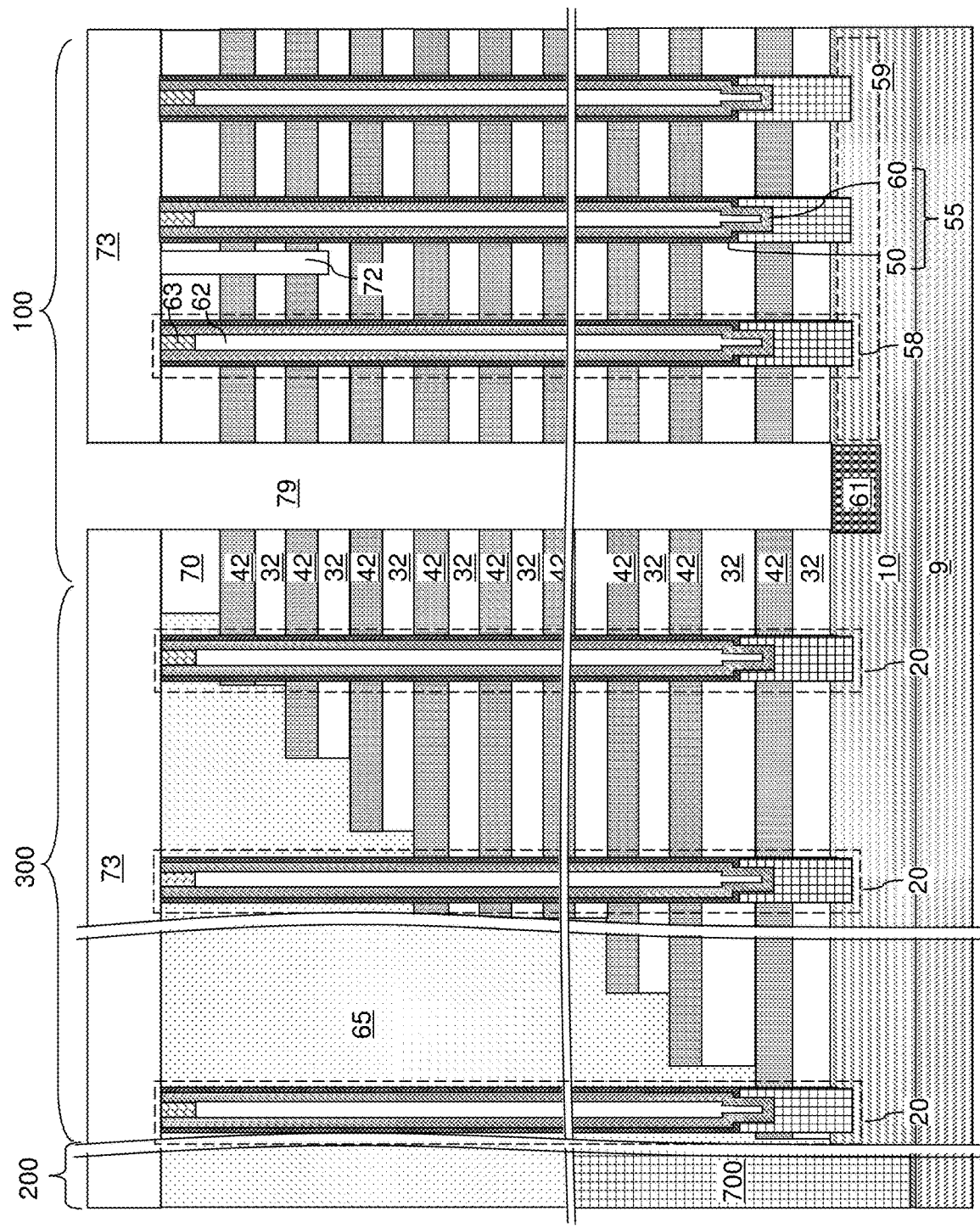
FIG. 7A is a schematic vertical cross-sectional view of the exemplary structure after formation of backside trenches according to an embodiment of the present disclosure.
Figure 7B:
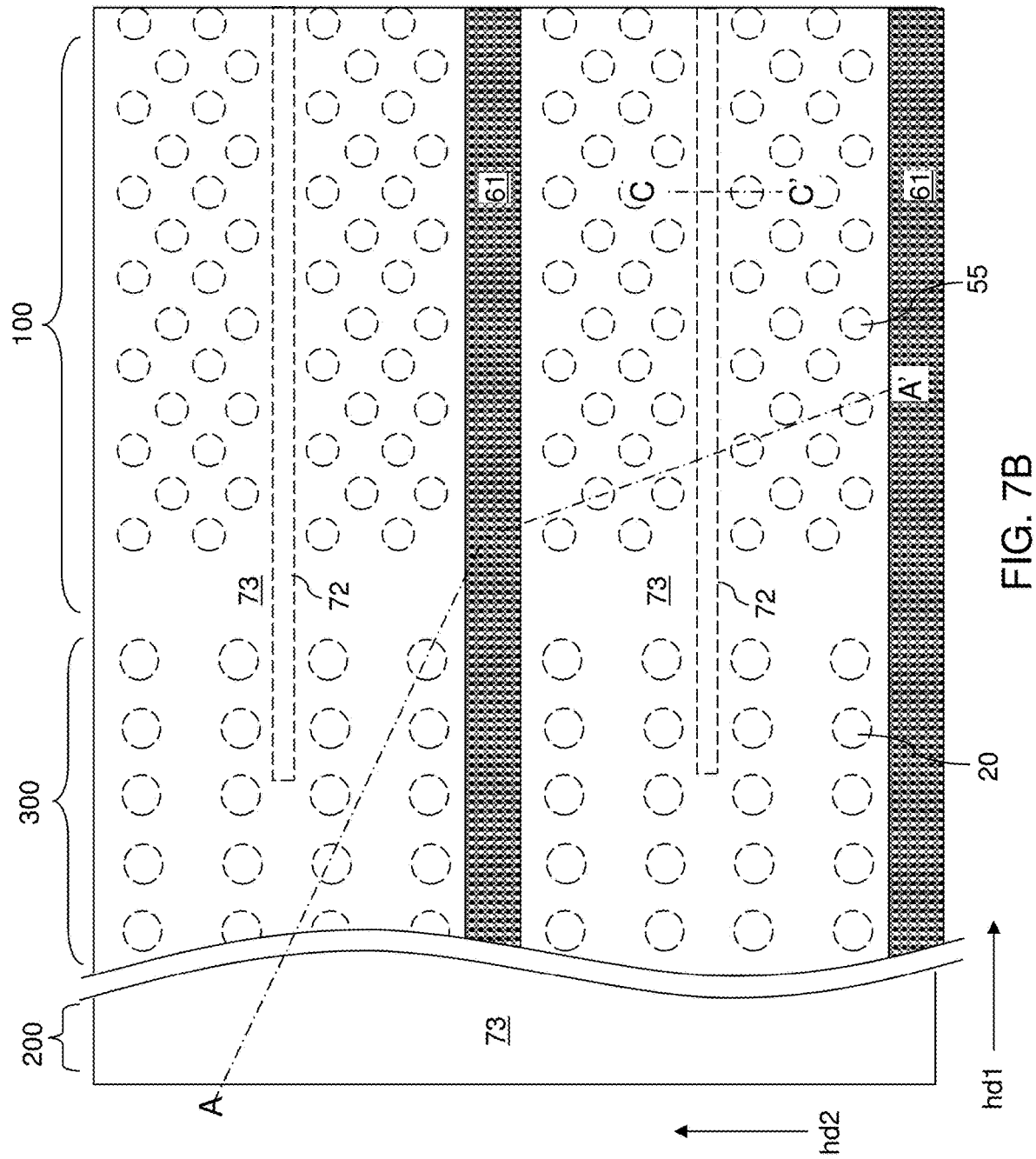
FIG. 7B is a partial see-through top-down view of the exemplary structure of FIG. 7A. The vertical plane A-A' is the plane of the schematic vertical cross-sectional view of FIG. 7A.
Figure 7C:
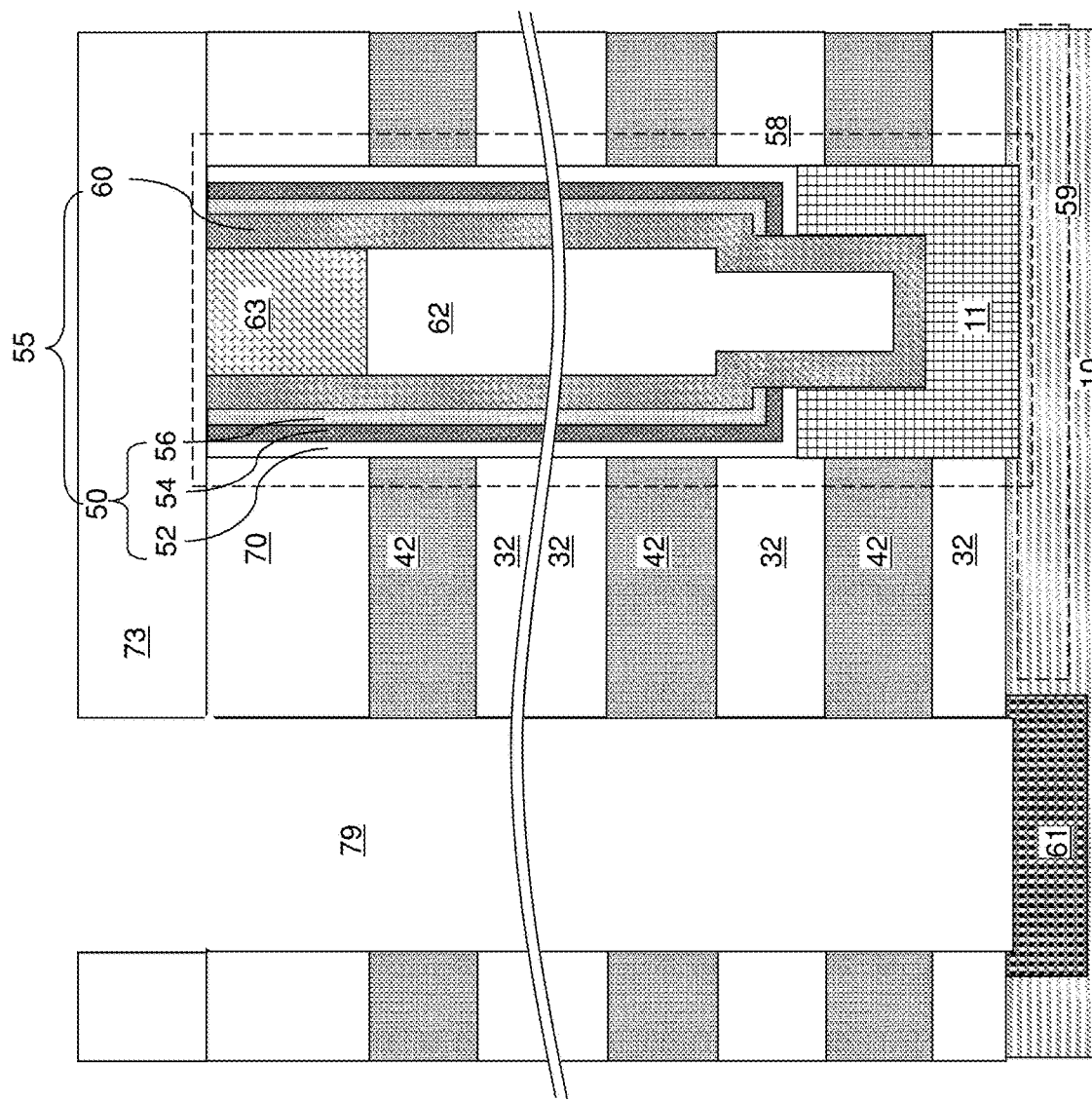
FIG. 7C is a schematic vertical cross-sectional view of a region of the exemplary structure along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 8:
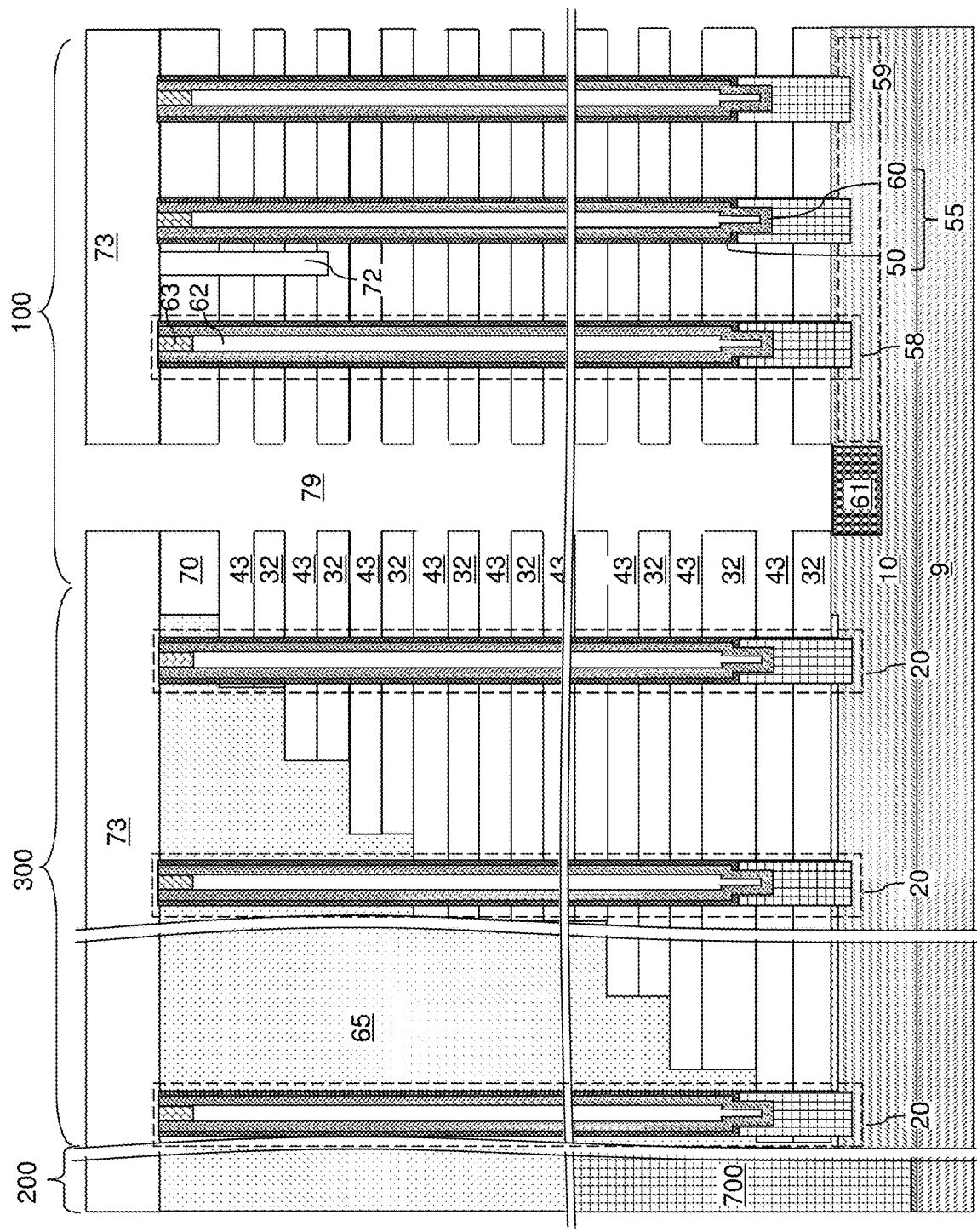
FIG. 8 is a schematic vertical cross-sectional view of the exemplary structure after formation of backside recesses according to an embodiment of the present disclosure.
Figure 9A:
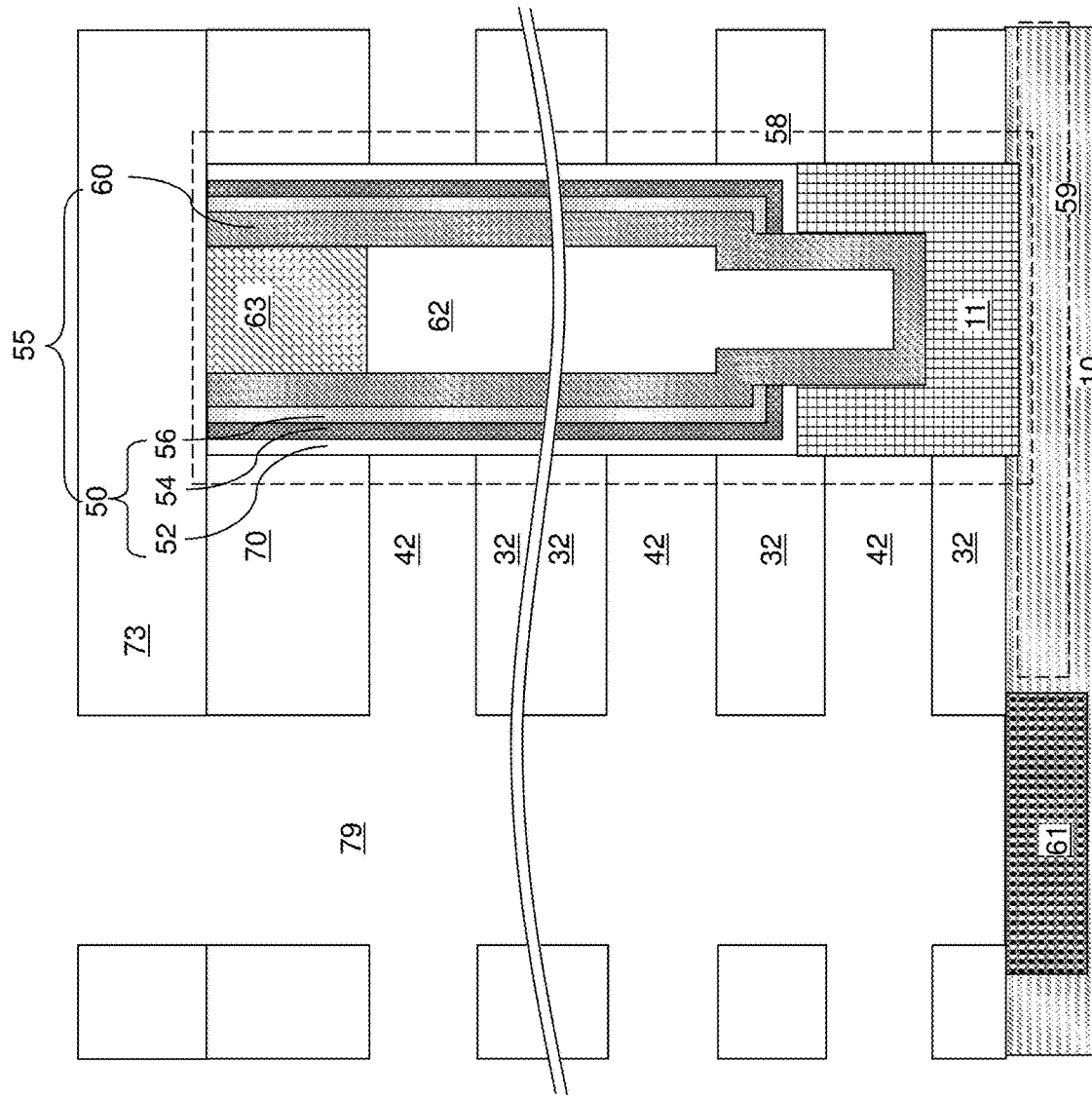
FIGS. 9A-9D are sequential vertical cross-sectional views of a region of the exemplary structure during formation of electrically conductive layers according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

Each backside recess 43 can be a laterally extending cavity having a lateral dimension that is greater than the vertical extent of the cavity. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616.

Figure 9B:
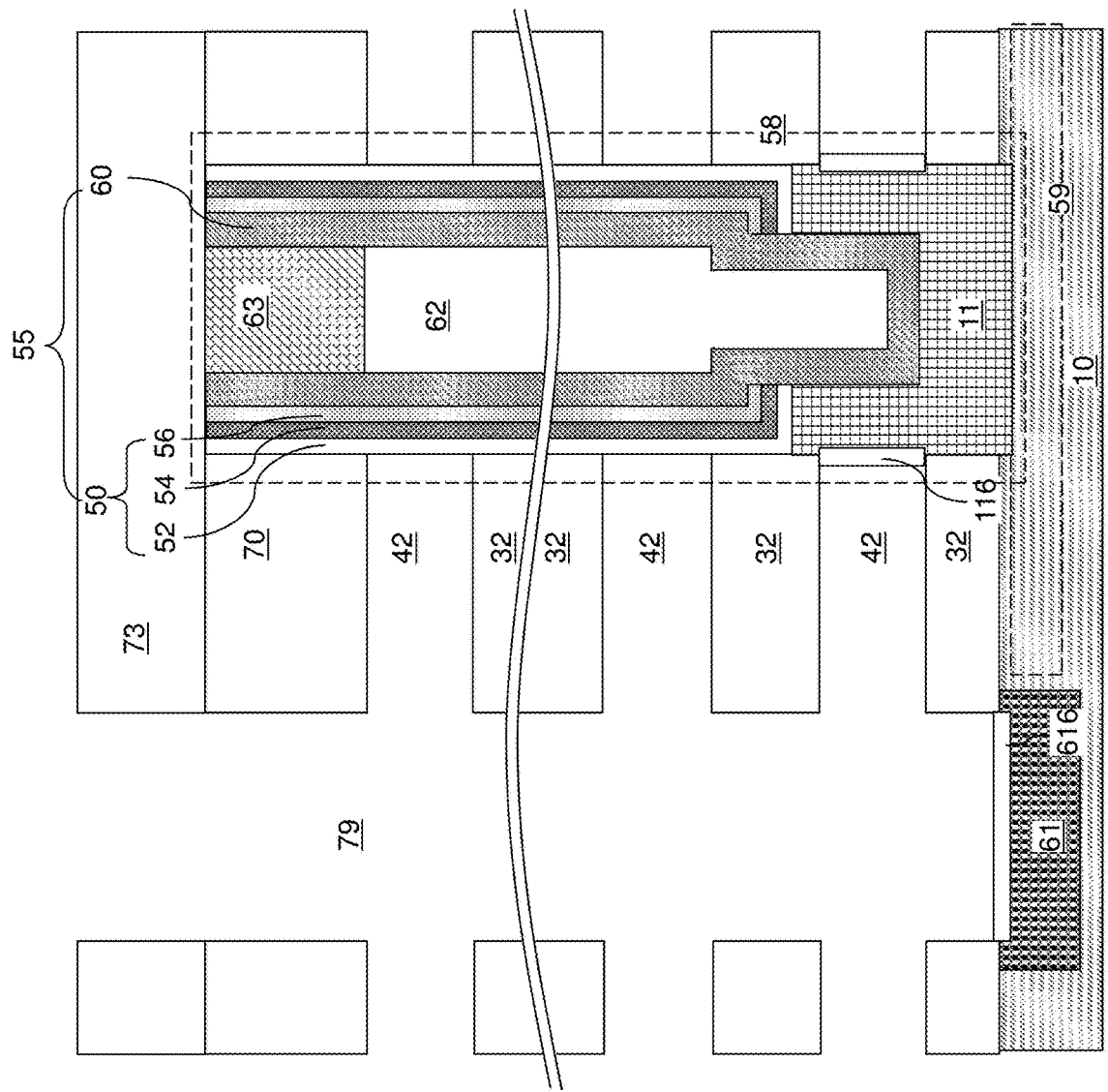

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

Figure 9C:
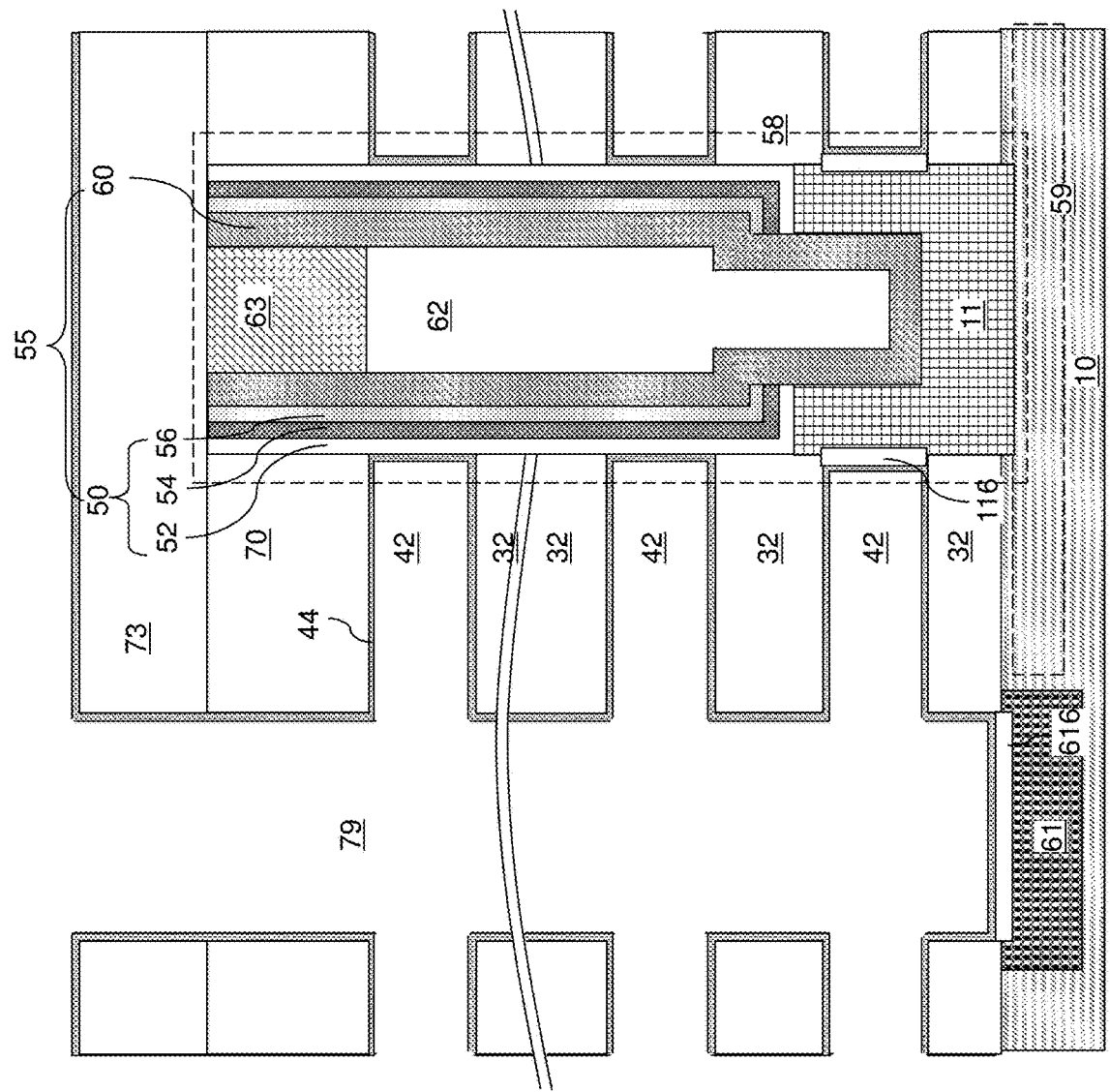

Referring to FIG. 9C, a metallic barrier liner 46A can be deposited in the backside recesses 43. The metallic barrier liner 46A includes an electrically conductive metallic material that can function as a diffusion barrier layer and/or adhesion promotion layer for a metallic fill material to be subsequently deposited. The metallic barrier liner 46A can include a pure metal, such as Mo or Ru, a conductive metallic nitride, oxynitride or carbonitride material, such as TiN, TaN, WN, MoN, TiON, TiSiN, WCN, MoCN or a stack thereof, or can include a conductive metallic carbide material, such as TiC, TaC, WC, or a stack thereof.

Figure 9D:
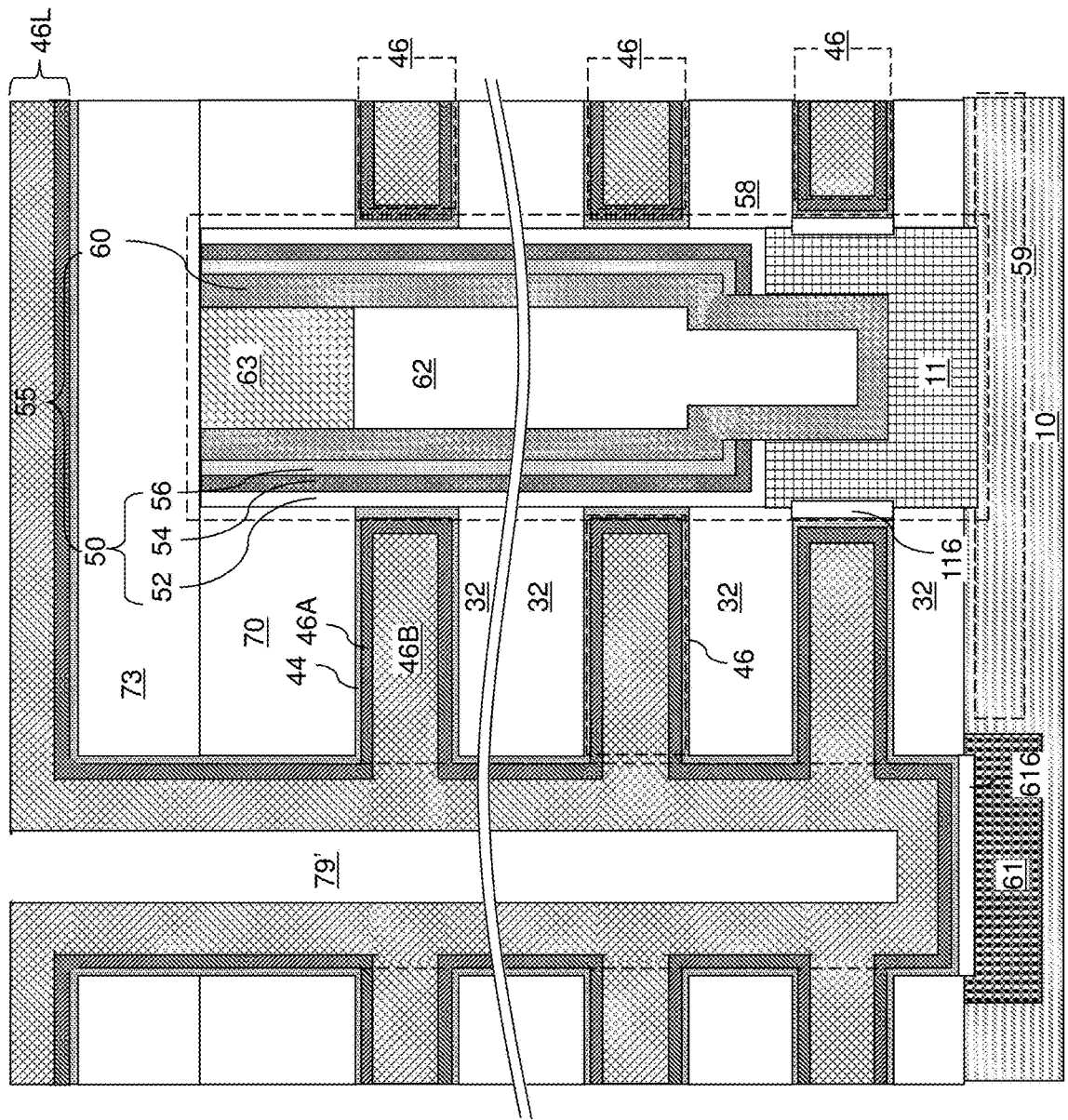

Referring to FIGS. 9D and 10, a metal fill material is deposited in the plurality of backside recesses 43, on the sidewalls of the at least one the backside trench 79, and over the top surface of the contact-level dielectric layer 73 to form a metallic fill material layer 46B. In one embodiment, the metallic fill material layer 46B can consist essentially of at least one elemental metal, such as tungsten. According to an aspect of the present disclosure, the backside recesses 43 may comprise high aspect ratio voids in which the ratio of the maximum lateral dimension of each backside recess 43 to the height of each backside recess 43 is greater than 3, and/or greater than 5, and/or greater than 10. According to an aspect of the present disclosure, the metallic fill material layer (e.g., tungsten layer) 46B can be deposited employing a metal fluoride gas, such as tungsten hexafluoride gas employing a conformal metal deposition process that is described in more detail below.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier liner 46A and a portion of the metallic fill material layer 46B that are located between a vertically neighboring pair of dielectric material layers such as a pair of insulating layers 32. The continuous metallic material layer 46L includes a continuous portion of the metallic barrier liner 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 10A:
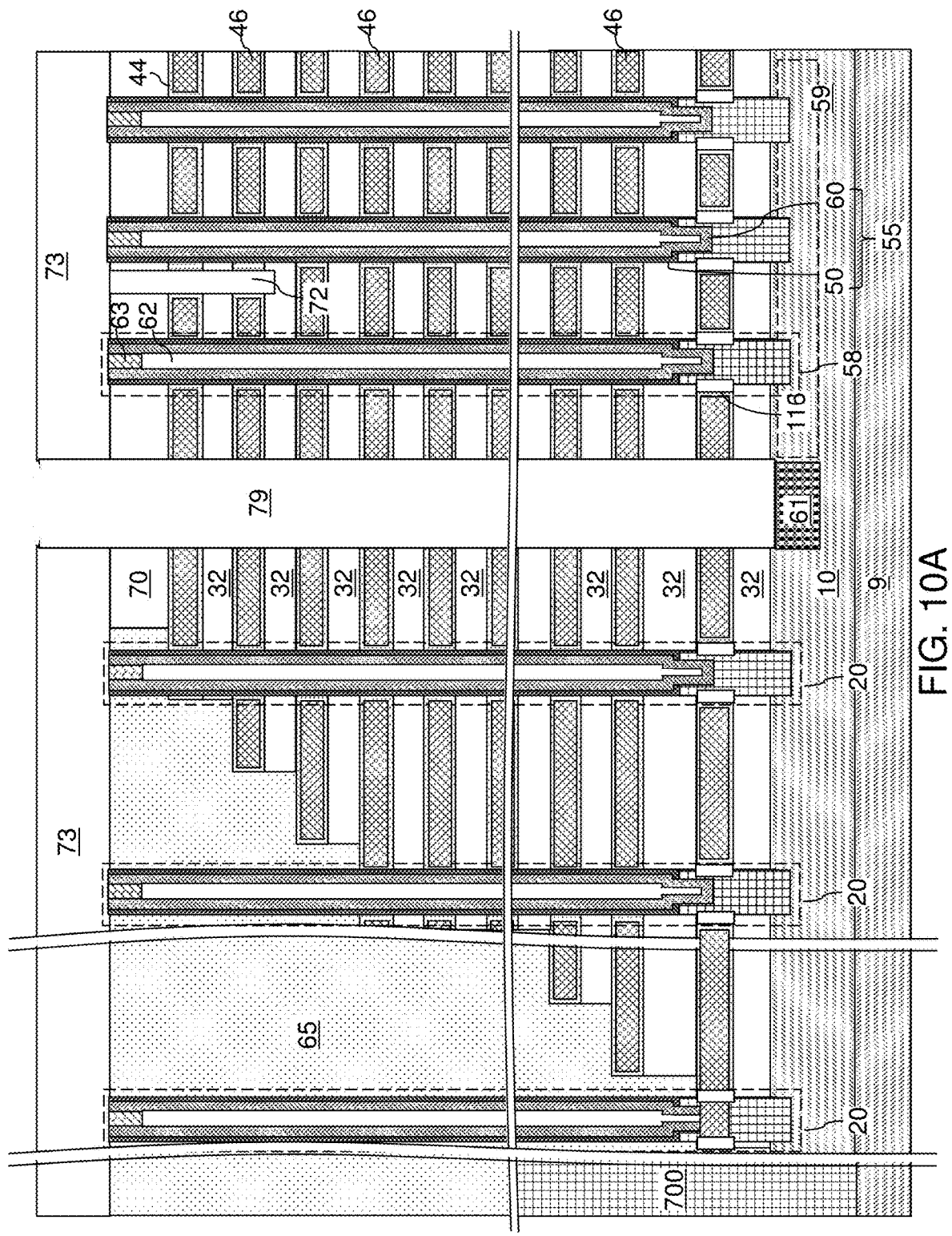
FIG. 10A is a schematic vertical cross-sectional view of the exemplary structure after removal of a deposited conductive material from within the backside trench according to an embodiment of the present disclosure.
Figure 10B:
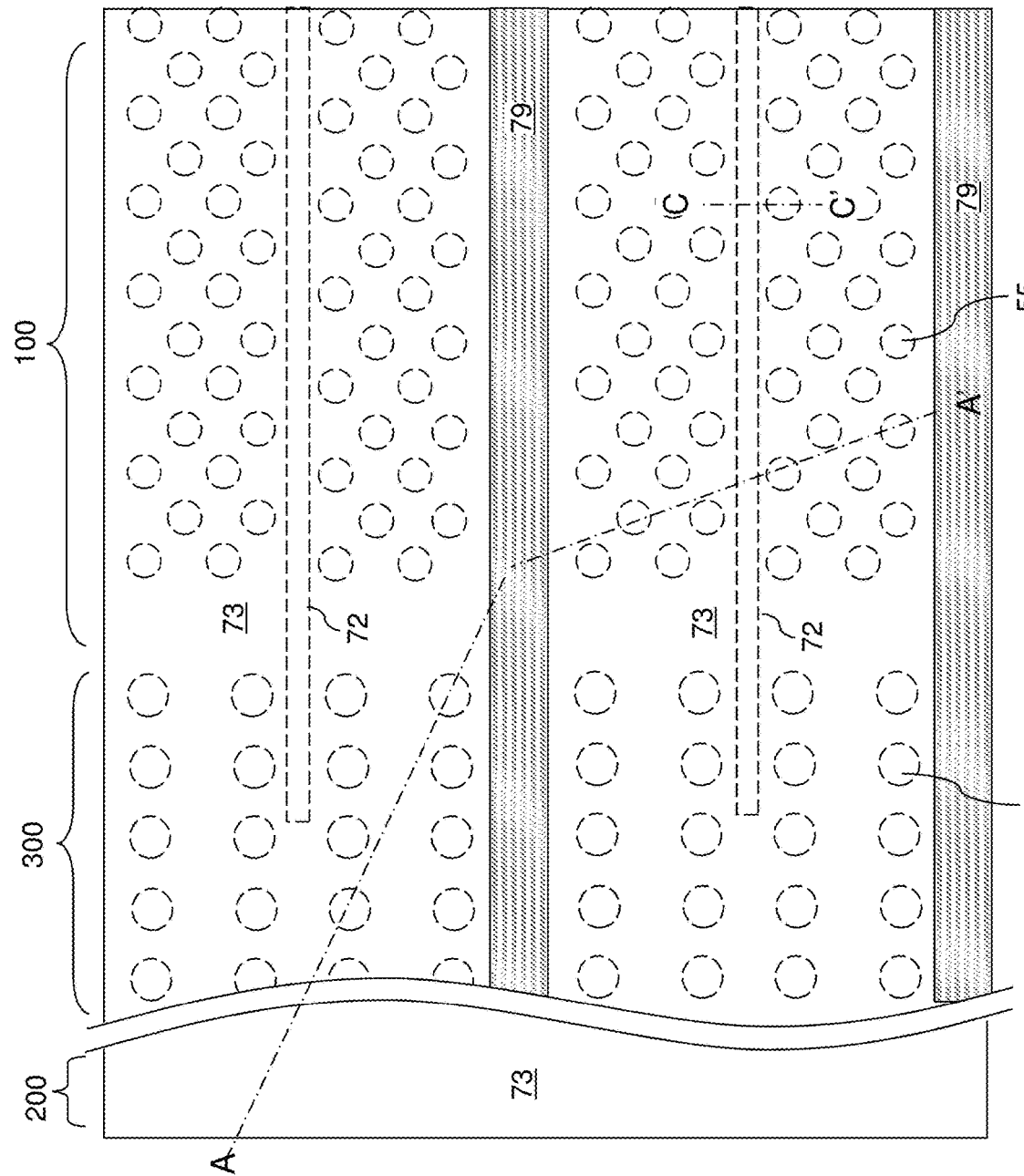
FIG. 10B is a partial see-through top-down view of the exemplary structure of FIG. 10A. The vertical plane A-A' is the plane of the schematic vertical cross-sectional view of FIG. 10A.
Figure 10C:
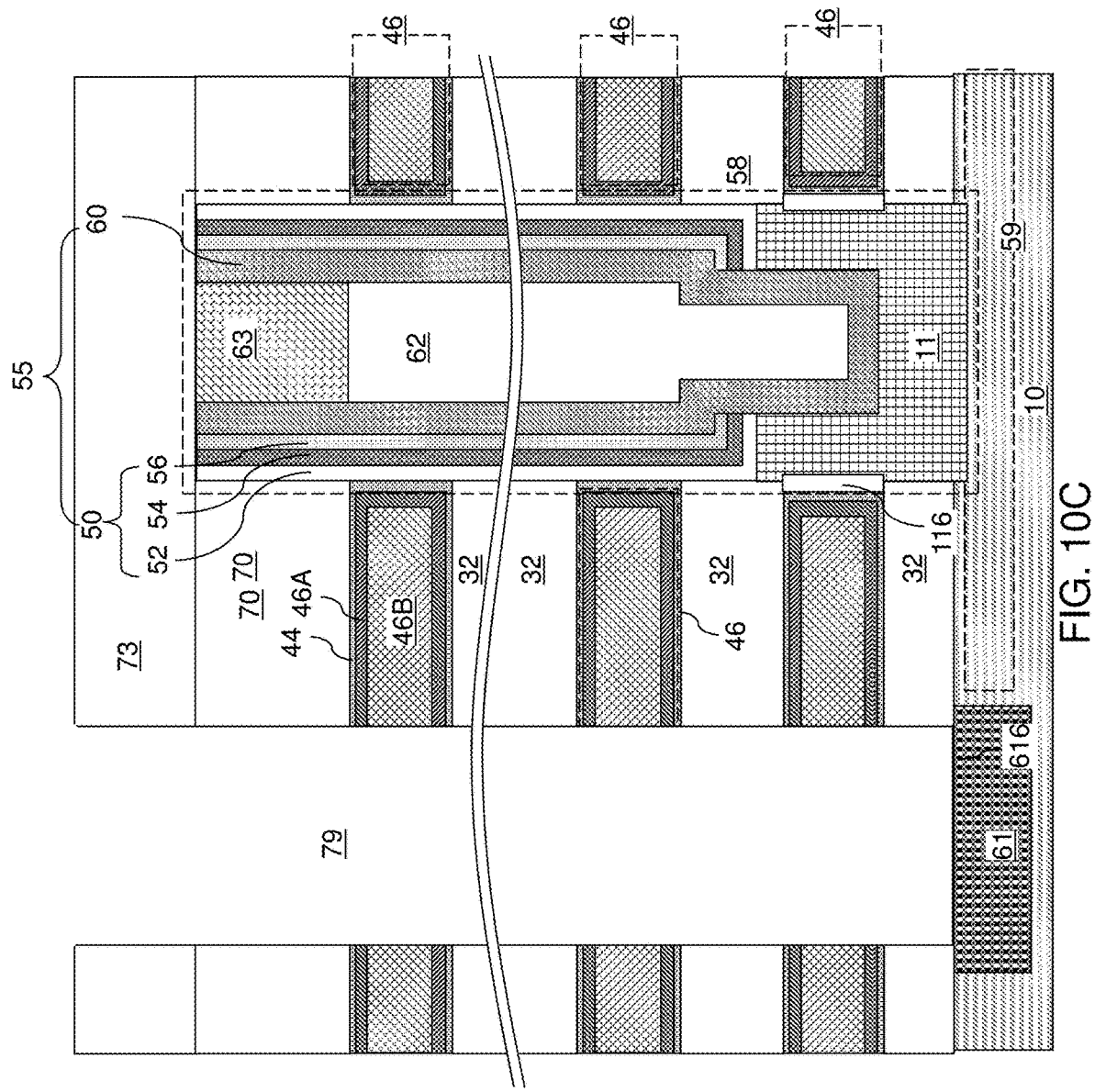
FIG. 10C is a schematic vertical cross-sectional view of a region of the exemplary structure along the vertical plane C-C' of FIG. 10B.

Referring to FIGS. 10A-10C, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

At least one topmost and at least one bottommost electrically conductive layer 46 can function as a select gate electrode (e.g., drain and source select gate electrode, respectively). A plurality of (or all of) the remaining electrically conductive layers 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 11:
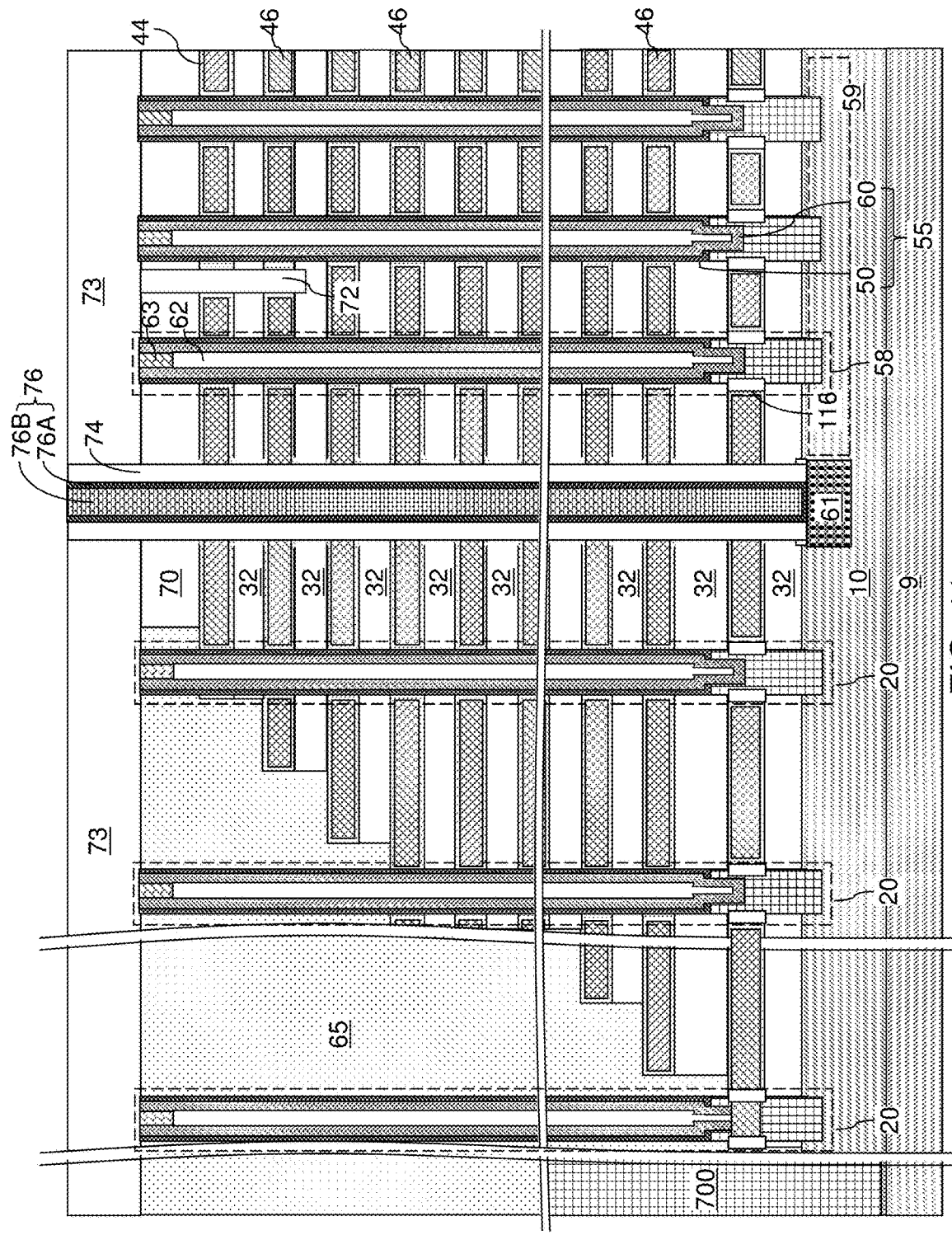
FIG. 11 is a schematic vertical cross-sectional view of the exemplary structure after formation of an insulating spacer and a backside contact structure according to an embodiment of the present disclosure.

Referring to FIG. 11, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof.

In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a metallic barrier liner 76A and a metallic fill material portion 76B. The metallic barrier liner 76A can include a pure metal, such as Mo or Ru, a conductive metallic nitride, oxynitride or carbonitride material, such as TiN, TaN, WN, MoN, TiON, TiSiN, WCN, MoCN or a stack thereof, or can include a conductive metallic carbide material, such as TiC, TaC, WC, or a stack thereof. The thickness of the metallic barrier liner 76A can be in a range from 3 nm to 30 nm, although lesser and greater thicknesses can also be employed.

According to an aspect of the present disclosure, the backside trenches 79 may comprise a high aspect ratio void in which the ratio of the height of each backside trench 79 to the width of each backside trench 79 is greater than 3, and/or greater than 5, and/or greater than 10. According to an aspect of the present disclosure, a metallic fill material portion (such as a tungsten portion) 76B can be deposited employing a metal fluoride gas, such as tungsten hexafluoride gas, employing a conformal metal deposition process of the present disclosure to be described in subsequent sections.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 12A:
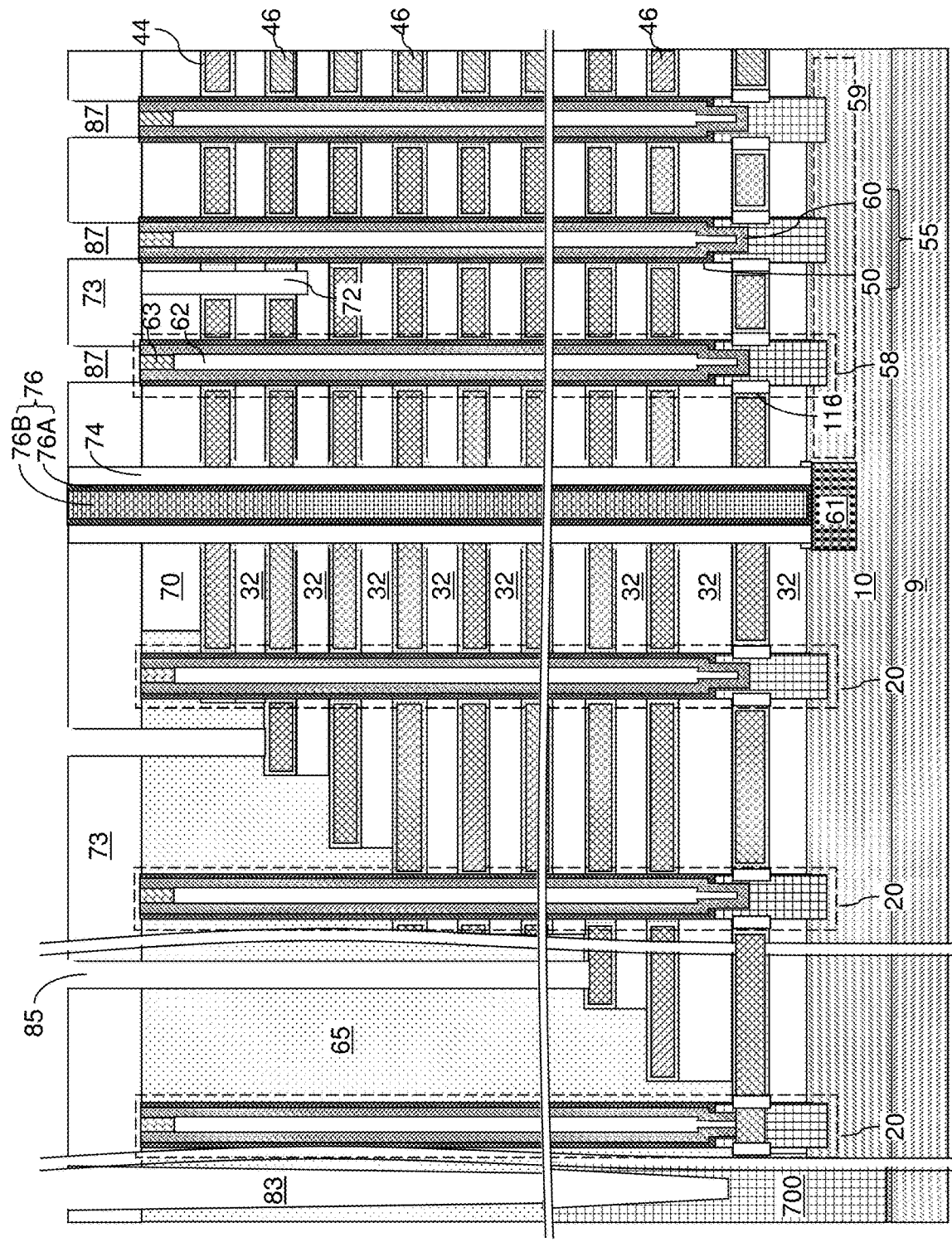
FIG. 12A is a schematic vertical cross-sectional view of the exemplary structure after formation of additional contact via cavities according to an embodiment of the present disclosure.
Figure 12B:
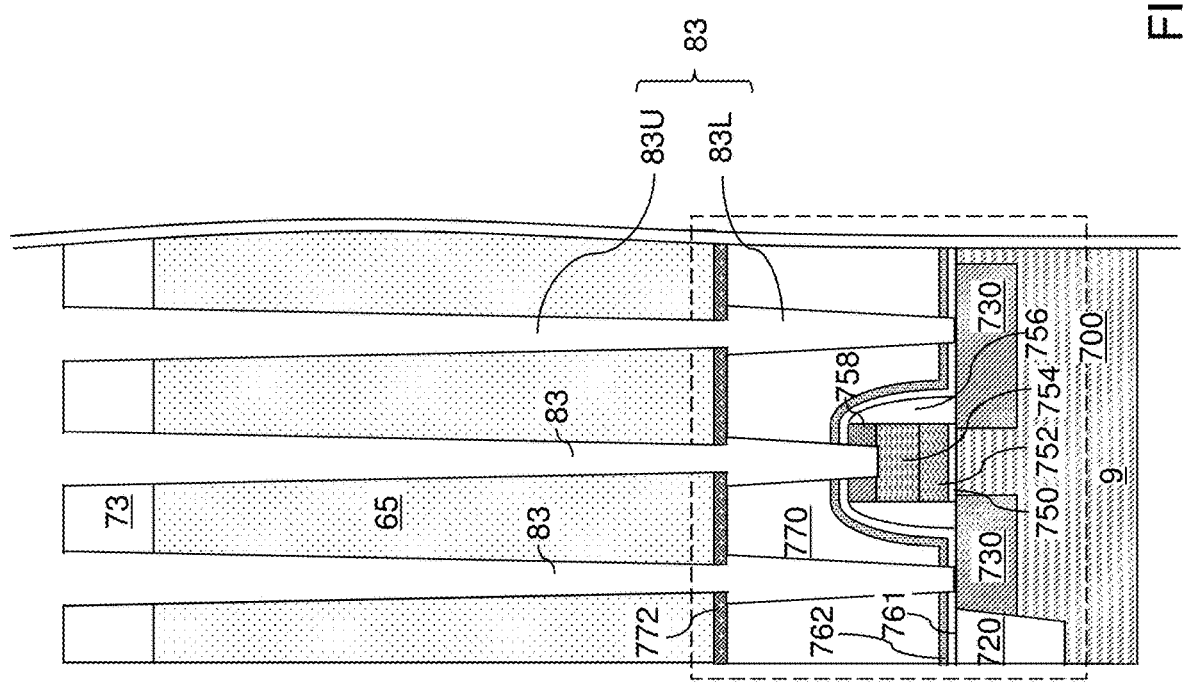
FIG. 12B is a schematic vertical cross-sectional view of a portion of a peripheral region of the exemplary structure of FIG. 12A.
Figure 13A:
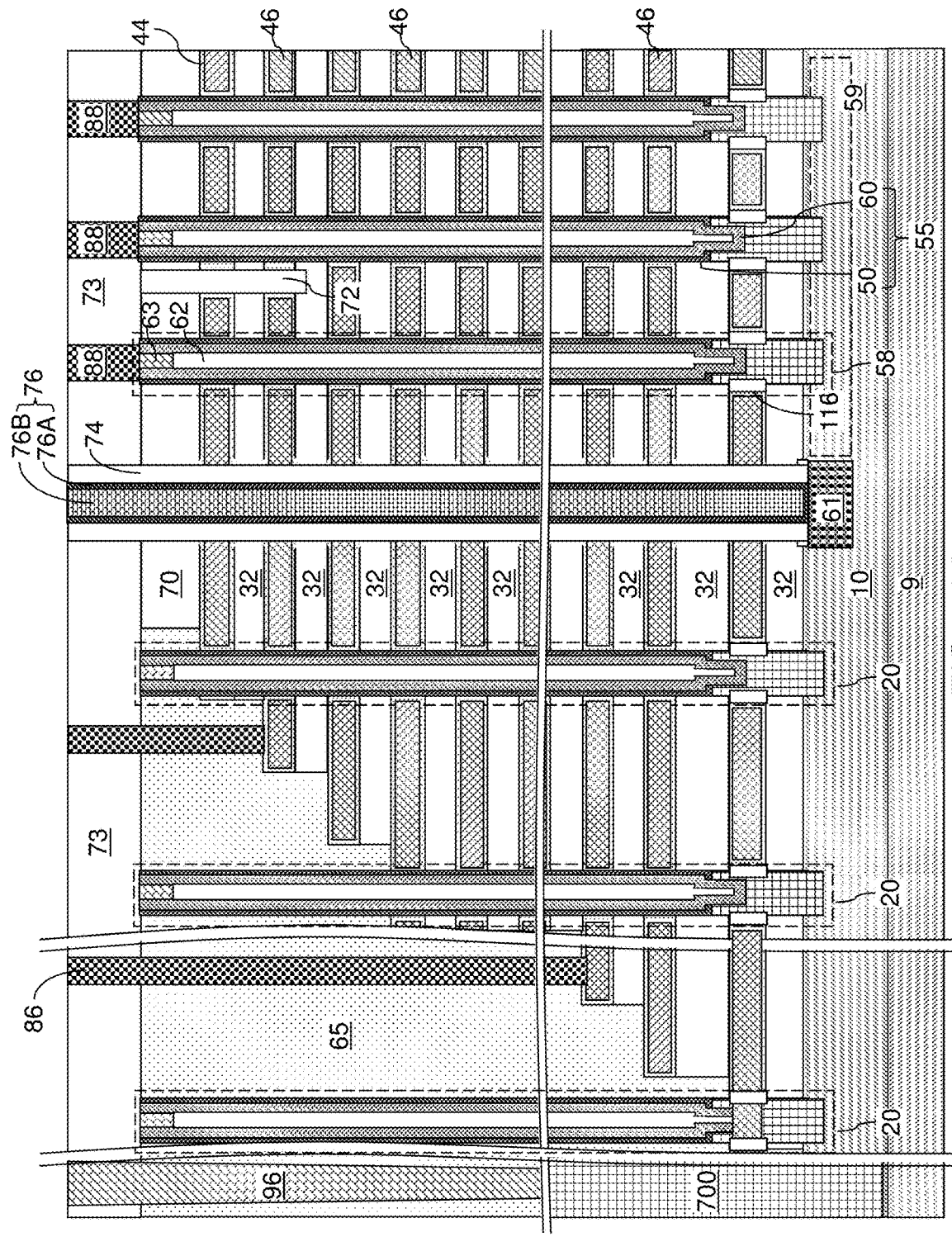
FIG. 13A is a schematic vertical cross-sectional view of the exemplary structure after formation of additional contact via structures according to an embodiment of the present disclosure.
Figure 13B:
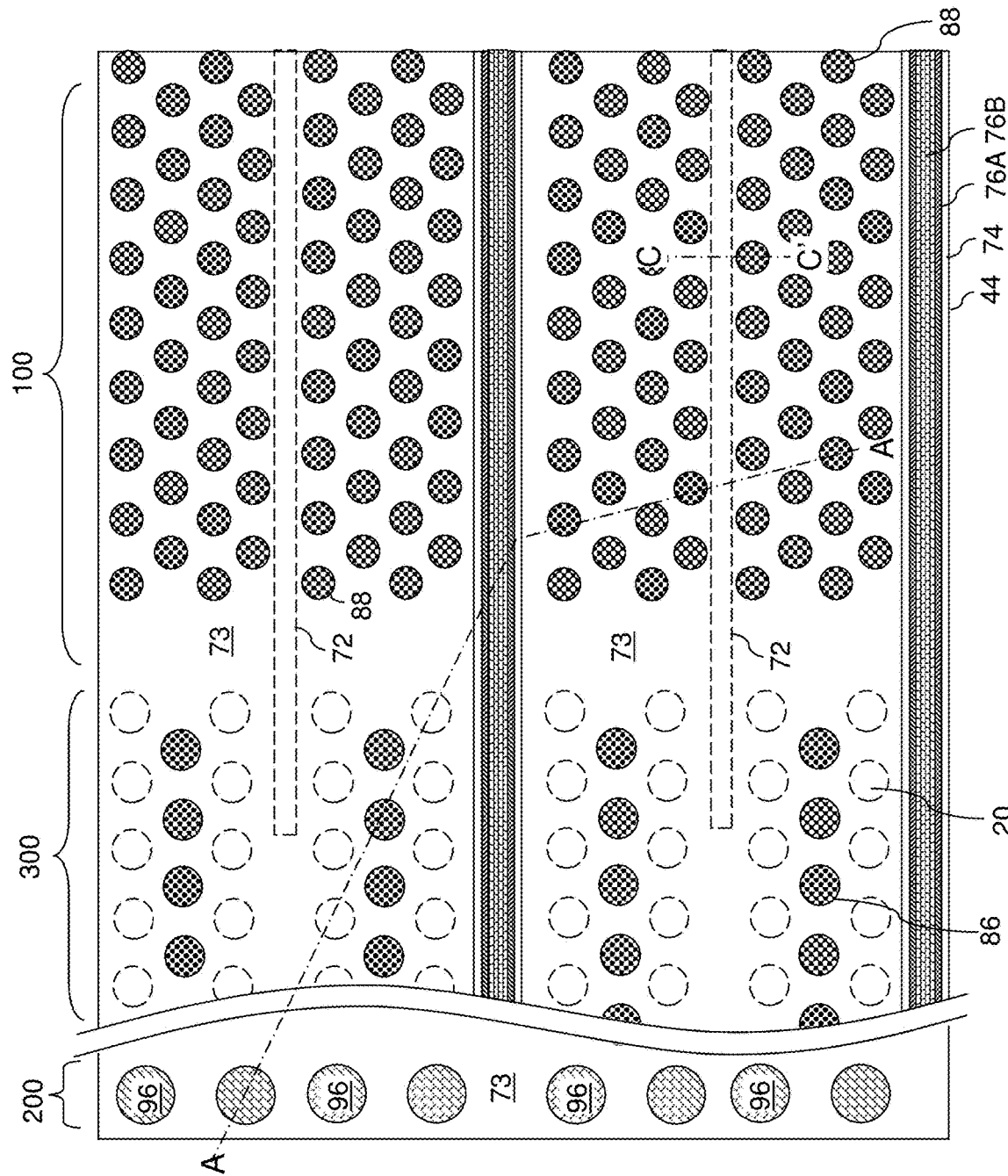
FIG. 13B is a top-down view of the exemplary structure of FIG. 13A. The vertical plane A-A' is the plane of the schematic vertical cross-sectional view of FIG. 13A.
Figure 13C:
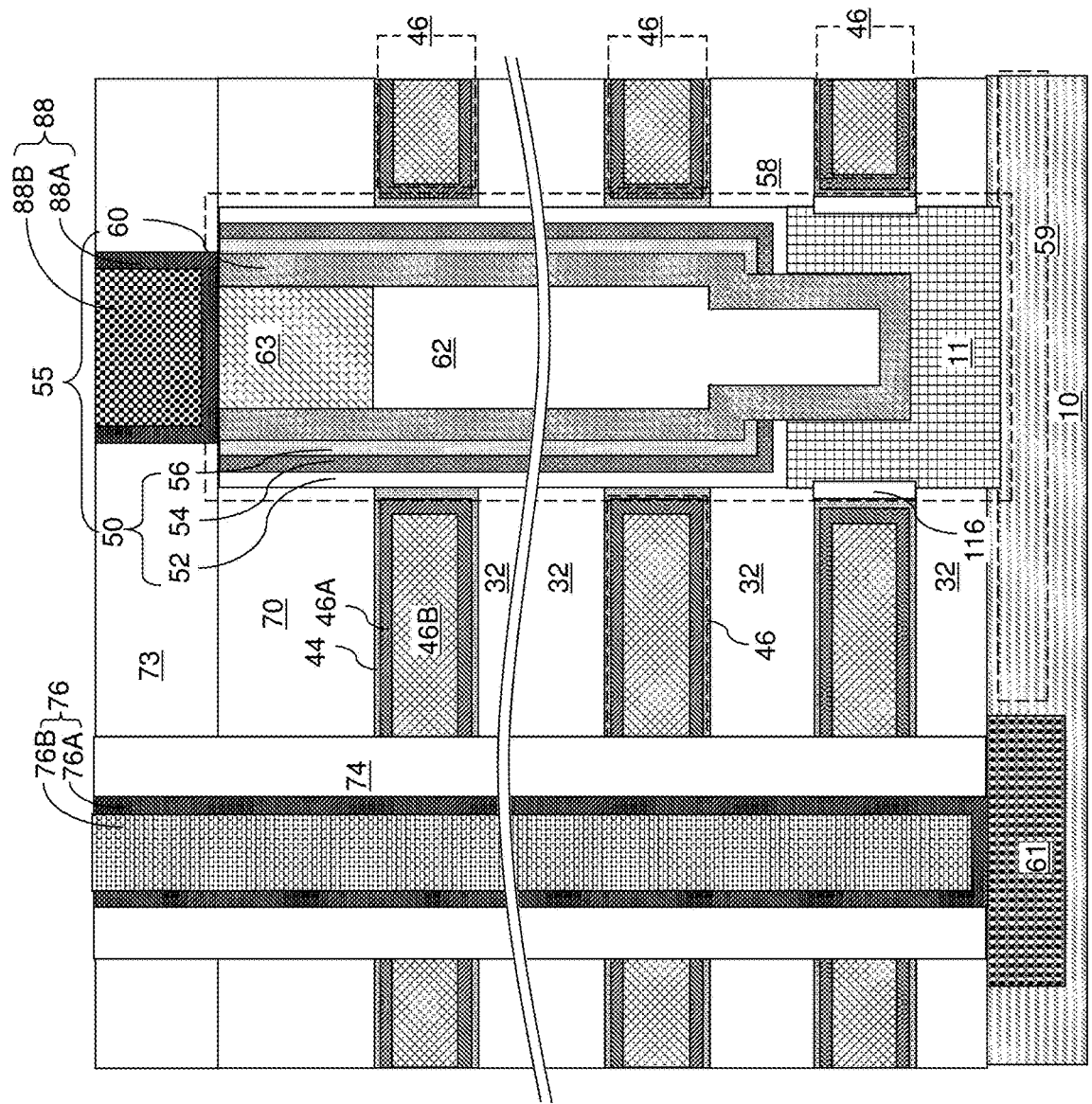
FIG. 13C is a schematic vertical cross-sectional view of a region of the exemplary structure along the vertical plane C-C' of FIG. 13B.
Figure 13D:
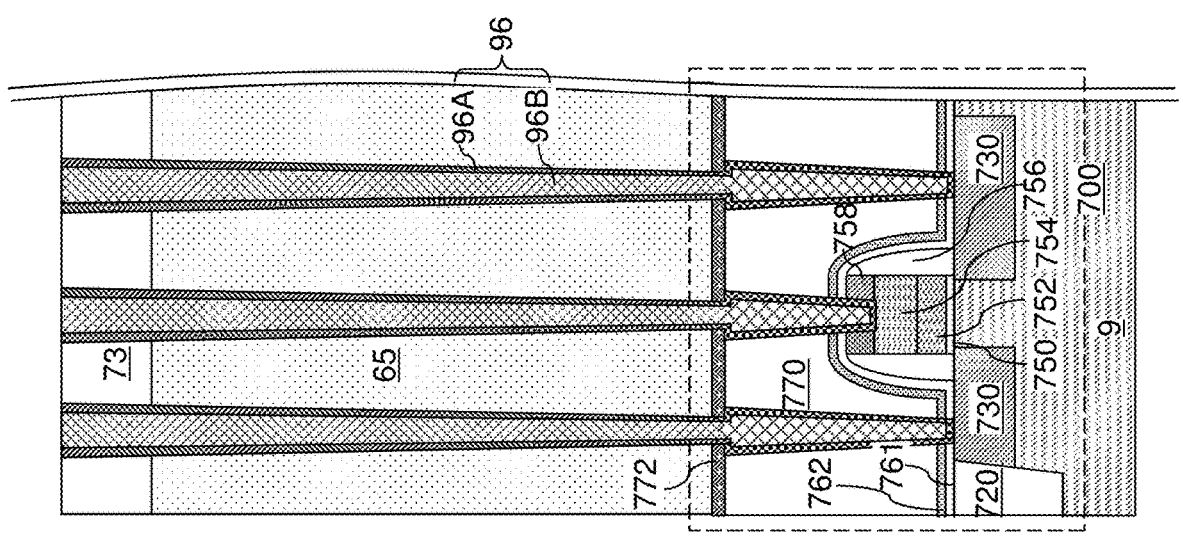
FIG. 13D is a schematic vertical cross-sectional view of a portion of a peripheral region of the exemplary structure of FIG. 13A.

Referring to FIGS. 12A and 12B, a photoresist layer (not shown) can be applied over the contact-level dielectric layer 73, and can be lithographically patterned to form openings therethrough. The pattern of the openings in the photoresist layer includes patterns of contact via structures to be subsequently formed through the contact-level dielectric layer 73 and the retro-stepped dielectric material portion 65. An anisotropic etch process can be performed to transfer the pattern of the openings in the photoresist layer through the contact-level dielectric layer 73, through the retro-stepped dielectric material portion 65, through backside blocking dielectric layers 44, if present, contacting stepped bottom surfaces of the retro-stepped dielectric material portion 65, and through the etch stop dielectric layer 772. The drain regions 63, the electrically conductive layers 46, and the sacrificial via fill structures 771 may function as etch stop structures. A drain contact via cavity 87 can be formed over each drain region 63 of the memory opening fill structures 58 such that a top surface of a drain region 63 is physically exposed underneath each drain contact via cavity 87. A word line contact via cavity 85 can be formed over the electrically conductive layers 46 such that a top surface of an electrically conductive layer 46 is physically exposed underneath each word line contact via cavity 85. An upper device contact via cavity 83U can be formed over each sacrificial via fill structure 771 in the peripheral region such that a top surface of a sacrificial via fill structure 771 is physically exposed underneath each upper device contact via cavity.

A selective isotropic etch process can be performed to remove the material of the sacrificial via fill structures 771 selective to the materials of the retro-stepped dielectric material portion 65, the planarization dielectric layer 770, the drain regions 63, and the electrically conductive layers 46. For example, if the sacrificial via fill structures 771 comprise amorphous silicon or a silicon-germanium alloy, a wet etch process employing tetramethyl ammonium hydroxide (TMAH) or hot trimethyl-2 hydroxyethyl ammonium hydroxide ("hot TMY") may be performed to remove the sacrificial via fill structures 771 through the upper device contact via cavity 83U. If the sacrificial via fill structures 771 comprise a carbon based material, then ashing may be used to remove the sacrificial via structures 771. A lower device contact via cavity 83L can be formed in each volume from which a sacrificial via fill structure 771 is removed. Each contiguous combination of an upper device contact via cavity 83U and a lower device contact via cavity 83L constitutes a device contact via cavity 83, which may be a two-tier contact via cavity having a stepped vertical cross-sectional profile. In one embodiment, the device contact via cavity 83 may comprise an upper tapered profile around an upper device contact via cavity 83U, a lower tapered profile around a lower device contact via cavity 83L, and an annular connecting surface that connects a top periphery of the lower device contact via cavity and a bottom periphery of the upper device contact via cavity.

Referring to FIGS. 13A-13D, at least one conductive material can be deposited in the drain contact via cavities 87, the word line contact via cavities 85, and the device contact via cavities 83. For example, the at least one conductive material can include a metallic barrier liner material and a conductive fill material. The metallic barrier liner material can include a conductive metallic liner such as TiN, TaN, WN, TiC, TaC, WC, an alloy thereof, or a stack thereof. The metallic barrier liner material can be conformally deposited, and the thickness of the metallic barrier liner material can be in a range from 3 nm to 30 nm, although lesser and greater thicknesses can also be employed. According to an aspect of the present disclosure, the device contact via cavities 83, the word line contact via cavities 85, and optionally the drain contact via cavities 87 may comprise high aspect ratio voids in which the ratio of the height to the width is greater than 3, and/or greater than 5, and/or greater than 10. According to an aspect of the present disclosure, the conductive fill material, such as tungsten, can be deposited employing a metal fluoride gas, such as tungsten hexafluoride, employing a conformal metal deposition process as will be described in more detail below.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining portion of the at least one conductive material filling a device contact via cavity 83 constitutes a device contact via structure 96. Each remaining portion of the at least one conductive material filling a drain contact via cavity constitutes a drain contact via structure 88. Each remaining portion of the at least one conductive material filling a word line contact via cavity constitutes a word line contact via structure 86.

Each device contact via structure 96 may comprise a metallic barrier liner 96A and a metallic fill material portion 96B. Each drain contact via structure 88 may comprise a metallic barrier liner 88A and a metallic fill material portion 88B. Each word line contact via structure 86 may comprise a metallic barrier liner and a metallic fill material portion. In one embodiment, the metallic barrier liners (96A, 88A) of the various contact via structures (88, 86, 96) may have a same material composition and a same thickness, and may be deposited in a same metallic liner deposition process. In one embodiment, the metallic fill material portions (88B, 96B) of the various contact via structures may have a same material composition, and may be deposited in as same deposition process, such as a conformal metal deposition process of the present disclosure that employs a metal fluoride gas to be described in subsequent sections.

According to an aspect of the present disclosure, a structure including a cavity therein is provided. The cavity may be a horizontally-extending cavity such as a backside recess 43 as described above, or a vertically-extending cavity such as a backside cavity that remains after formation of an insulating spacer 74 within a backside trench 79 as described above, a device contact via cavity 83 as described above, a word line contact via cavity 85 as described above, or a drain contact via cavity 87 as described above. Generally, any via cavity that may be formed during a semiconductor manufacturing process may be employed to implement the tungsten deposition process of the embodiments of the present disclosure. In some embodiments, the via cavity may have a high aspect ratio in which a lengthwise or depthwise dimension along a direction that is perpendicular to an opening of the via cavity that is connected to the ambient is greater than a widthwise dimension of the opening by a factor of at least 3, such as at least 5, and/or at least 10, such as a factor of 3 to 100. While the tungsten deposition of the embodiments of the present disclosure may be provided in any size or aspect ratio cavity, the benefit of the embodiments of the present disclosure may be increased when tungsten is deposited in cavity having a high aspect ratio, such as an aspect ratio greater than 3, and/or greater than 5, and/or greater than 10, such as a factor of 3 to 100.

The structure including the cavity can be disposed in a process chamber, which may be a vacuum chamber configured for a chemical deposition process or an atomic layer deposition. A tungsten growth-suppressant gas may be provided into the deposition chamber during tungsten growth from a tungsten fluoride source gas, such as a tungsten hexafluoride source gas to inhibit (i.e., to reduce or suppress) the tungsten growth rate at least in the inner portion of the tungsten layer. The growth-suppressant gas may be provided into the deposition chamber together with tungsten hexafluoride and/or in an alternating fashion with tungsten hexafluoride, as will be described in more detail below. The tungsten growth-suppressant gas reduces the tungsten growth rate at least in the inner portion of the tungsten layer, and permits residual fluorine atoms from tungsten hexafluoride to be outgassed from the cavity before the cavity is completely filled by the tungsten layer. It is believed that this may reduce fluorine induced voids in the layers surrounding the cavity when fluorine trapped in cavity by the tungsten layer diffuses into the adjacent layers. Thus, the growth-suppressant gas reduces a tungsten deposition rate of a concurrent or subsequent tungsten deposition process, and is preferably free or substantially of fluorine atoms. Generally, the growth-suppressant gas may also referred to as an inhibitor gas.

Without wishing to be bounded by a particular theory, a possible mechanism of suppression of a deposition rate of tungsten through adsorption of growth-suppressant atoms from the growth-suppressant gas according to an embodiment of the present disclosure is shown in FIGS. 14A-14E. The growth suppressant atoms may comprise nitrogen and/or halogen atoms other than fluorine, such as chlorine.

Figures 14A, 14B, 14C:
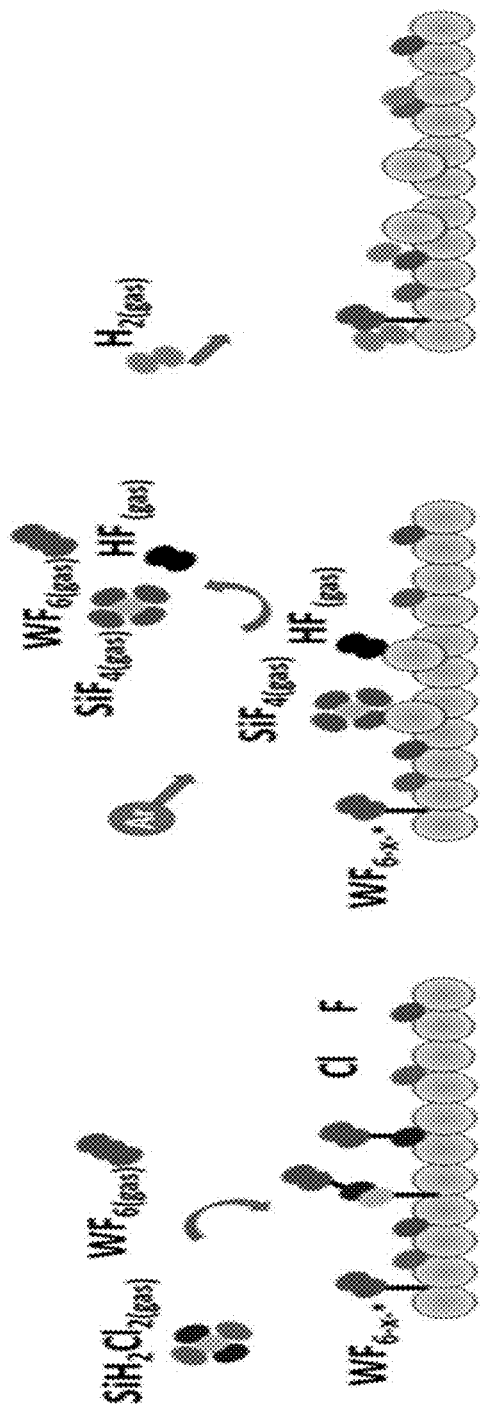
FIGS. 14A-14E are sequential schematic diagrams illustrating the mechanism of suppression of a deposition rate of a metal through adsorption of growth-suppressant atoms according to an embodiment of the present disclosure.

Referring to FIG. 14A, a metal fluoride gas and a metal growth-suppressant gas can be flowed simultaneously during a first metal deposition step into a process chamber including a metallic surface, which may be a surface of a cavity on a substrate. In the illustrated example, the metallic surface can be a tungsten surface, the metal fluoride gas can be tungsten hexafluoride, and the growth-suppressant gas can be dichlorosilane (DCS, $SiH_2Cl_2$). Generally, the metal fluoride gas may be any metal fluoride gas that consists of an elemental metal and fluorine atoms. Exemplary metal fluoride gases include, but are not limited to, $WF_6$, $MoF_6$, $RuF_6$, $RhF_6$, $ReF_6$, $OsF_6$, $IrF_6$, and $PtF_6$. Atoms and radicals from the metal fluoride gas and the growth suppressant gas can be adsorbed to the metallic surface. For example, chlorine atoms from the growth-suppressant gas, fluorine atoms from the metal fluoride gas, and a metal fluoride compound such as $WF_{6-x}$ can be adsorbed to the metallic surface. Generally, the metal fluoride compound can be adsorbed to sites in which metal atoms, SiH radicals, or hydrogen atoms are present on the metallic surface. The metal fluoride compound and fluorine atoms do not adsorb to sites in which chlorine atoms are adsorbed. Since the total number of sites for adsorption of atoms per unit area is finite, the higher the fraction of sites that adsorb chlorine atoms, the lower the fraction of sites that adsorb fluorine or metal fluoride compound. It should be noted that adsorption of chlorine atoms and fluorine atoms is reversible, and there is a dynamic equilibrium between the fraction of sites adsorbing chlorine atoms and the fraction of sites adsorbing fluorine atoms.

In some embodiments, nitrogen atoms may be used as the growth suppressant atoms instead of or in addition to the chlorine atoms to provide a similar effect. Generally, a molecule of the growth-suppressant gas comprises at least one chlorine atom and/or at least one nitrogen atom therein. In one embodiment, the growth-suppressant gas comprises at least one chlorine atom. In one embodiment, the growth-suppressant gas comprises a silicon-containing chloride gas selected from $SiH_3Cl$, $SiH_2Cl_2$, $SiHCl_3$, or $SiCl_4$. In one embodiment, the growth-suppressant gas comprises a boron-containing chloride gas selected from $BH_2Cl$, $BHCl_2$, or $BCl_3$. In one embodiment, the growth-suppressant gas comprises at least one nitrogen atom, such as $N_2$ or $NH_3$. In general, the growth rate of the metal (e.g., tungsten) and/or adsorption of fluorine on the metallic surface is reduced due to the presence of the adsorbed growth suppressant atoms, such as chlorine and/or nitrogen atoms (which would not be present if the growth-suppressant gas were not flown into the process chamber during the metal deposition step).

Referring to FIG. 14B, chemical reactions that occur on the metallic surface upon adsorption of a metal fluoride compound is illustrated. Generally, adsorption of a metal fluoride compounds on the metallic surface leads to loss of fluorine atoms, for example, by combination with silicon hydride radicals (such as SiH), hydrogen atoms or with silicon atoms and subsequent formation of volatile fluorine containing compounds (such as $SiF_4$, $SiH_2F_2$, HF, etc.). As a consequence, molecules of the metal fluoride compounds tend to lose fluorine atoms until most fluorine atoms are dissociated from the metal atoms of the metal fluoride compound, and the metal atoms are incorporated into the metallic material layer. For example, $WF_x$ reacts with $SiH_y$ and hydrogen atoms, and volatile gas byproducts such as $SiF_z$ (e.g., $SiF_4$), HF, and unreacted $WF_6$ molecules are removed into the flow stream in a chemical vapor deposition process, or are removed during a purge step in an atomic layer deposition process. The purge step may comprise a noble gas (e.g., argon) purge step in which the noble gas is introduced into the process chamber to purge the volatile fluorine-containing gas byproducts out of the process chamber.

Referring to FIG. 14C, an optional reduction step (e.g., hydrogen soak step) may be subsequently performed in which a hydrogen containing gas, such as pure hydrogen gas, is flowed into the process chamber. The hydrogen gas reacts with $WF_x$ compounds, fluorine atoms, and chlorine atoms adsorbed on the metallic surface, and removes the $WF_x$ compounds, the fluorine atoms, and the chlorine atoms from the metallic surface. Generally, the $H_2$—Cl reaction rate is lower than the $H_2$—F reaction, and a predominant fraction of the fluorine atoms may be removed from the metallic surface by the hydrogen gas while a significant fraction of the chlorine atoms may remain on the metallic surface after the reduction process. The fraction of the chlorine atoms that remain on the metallic surface depends on the process conditions of the reduction step. According to an aspect of the present disclosure, the process conditions of the reduction step may be selected such that a predominant fraction (such a greater than 50%), or at least 30% and/or at least 15% of chlorine atoms adsorbed during the flow of the growth-suppressant gas remain on the metallic surface at the end of the reduction step as illustrated in FIG. 14D.

Figures 14D, 14E:
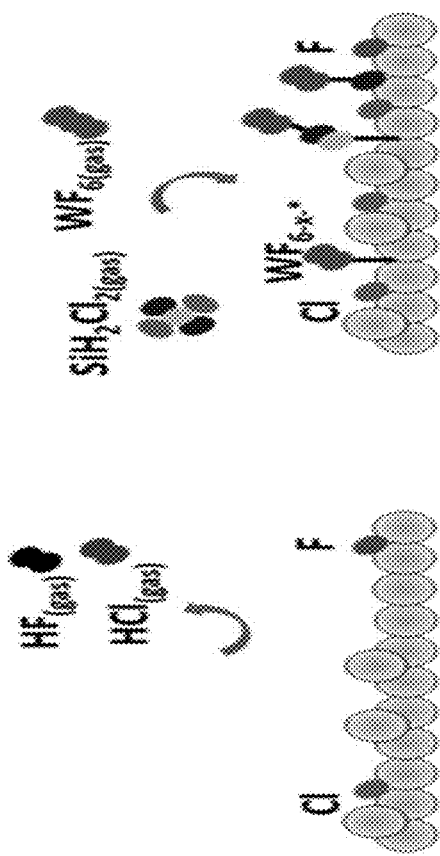

Referring to FIG. 14E, a second metal deposition step is performed, in which the metal fluoride (e.g., tungsten hexafluoride) gas and the growth-suppressant gas (e.g., DCS) can be flowed simultaneously into the process chamber. The growth rate of the metal on the metallic surface is reduced due to the presence of pre-existing adsorbed chlorine atoms in addition to newly adsorbed chlorine atoms that are adsorbed to the growth surface during the second metal deposition step. Thus, the growth rate of the metal during the second metal deposition step can be lower than the growth rate of the metal during the first metal deposition step even if the flow rate of each gas is the same during the first and second metal deposition steps.

Thus, by using the growth-suppressant gas, a more uniform metal (e.g., tungsten) filling may be obtained in large surface area cavities, such as backside recesses 43, backside trenches 79 and/or device contact cavities 83. The growth-suppressant gas helps to control decomposition of the metal fluoride to provide a more conformal coverage of the cavities with the metal (e.g., tungsten).

As discussed above, the processes of embodiments of the present disclosure may be practiced to deposit a metal in a backside recess 43 described above, in a backside cavity that remains after formation of an insulating spacer 74 within a backside trench 79 described above, in a device contact via cavity 83 described above, in a word line contact via cavity 85 described above, in a drain contact via cavity 87 described above, or in any via cavity that may be formed during a semiconductor manufacturing process.

FIGS. 15A-15G are sequential vertical cross-sectional views of a backside recess 43 during formation of an electrically conductive layer 46 according to an embodiment of the present disclosure. FIGS. 16A-16G are sequential vertical cross-sectional views of a backside trench 79 during formation of a backside contact via structure 76 according to an embodiment of the present disclosure. FIG. 17 is a vertical cross-sectional view of a portion of a peripheral region of the exemplary structure after formation of device contact via cavities 83 at the processing steps of FIGS. 12A and 12B. FIGS. 18A-18F are sequential vertical cross-sectional views of a device contact via cavity 83 during formation of a contact via structure 96 according to an embodiment of the present disclosure.

An embodiment of the present disclosure for depositing a metal employing a metal fluoride gas (e.g., tungsten hexafluoride) and a growth-suppressant gas (e.g., a nitrogen and/or non-fluorine halogen containing gas) is now described with reference to FIGS. 15A-15G, 16A-16F, and 18A-18F.

Figure 15A:
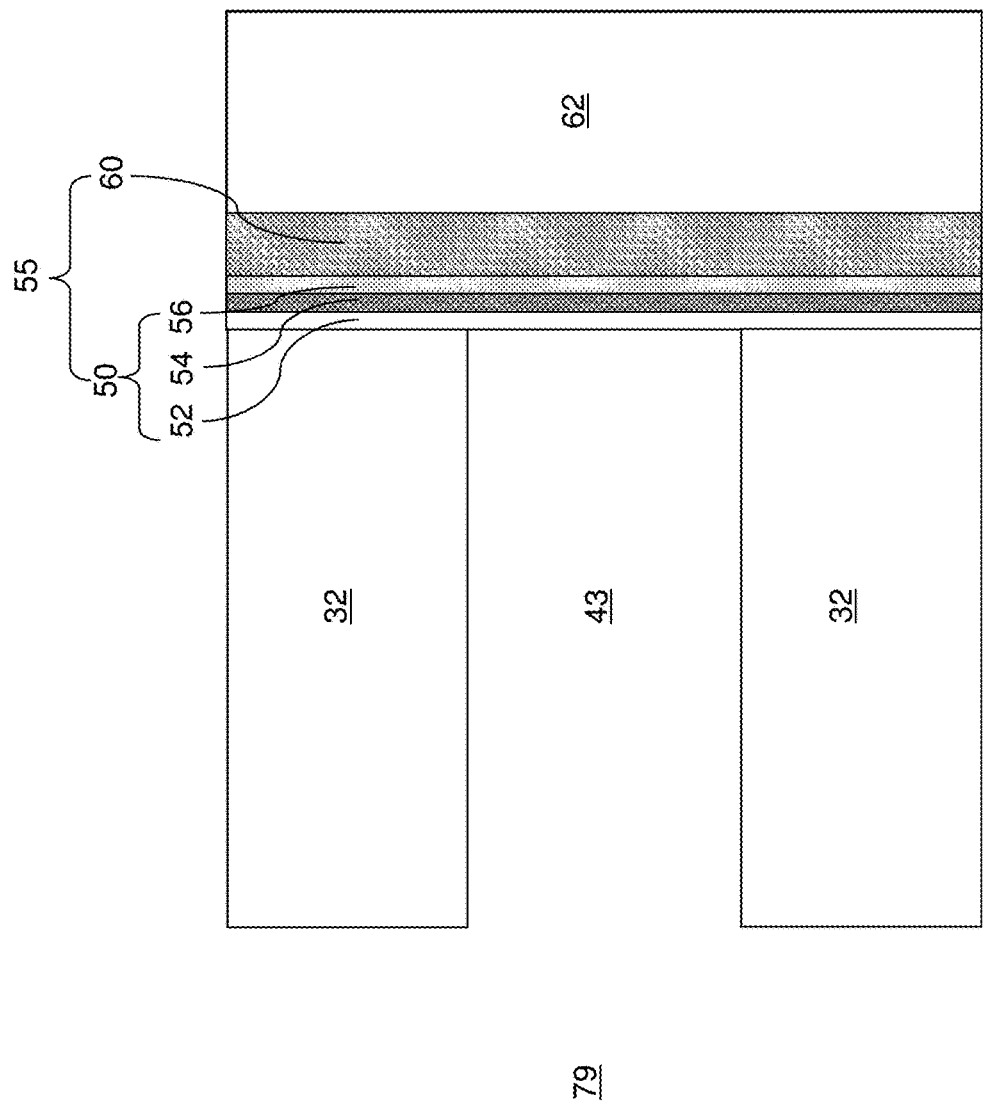
FIGS. 15A-15G are sequential vertical cross-sectional views of a backside recess during formation of an electrically conductive layer according to an embodiment of the present disclosure.
Figure 16A:
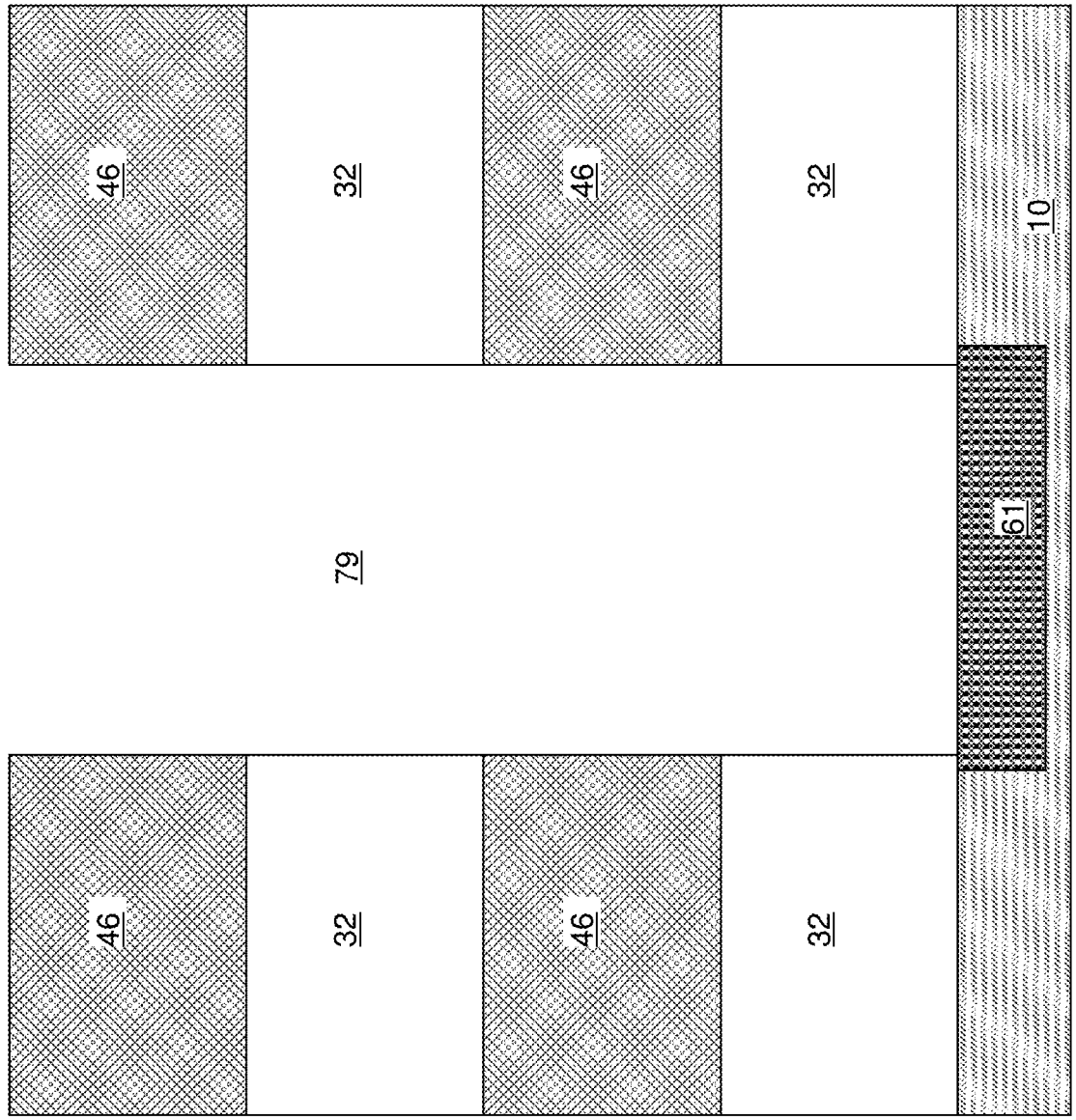
FIGS. 16A-16F are sequential vertical cross-sectional views of a backside trench during formation of a backside contact via structure according to an embodiment of the present disclosure.
Figure 17:
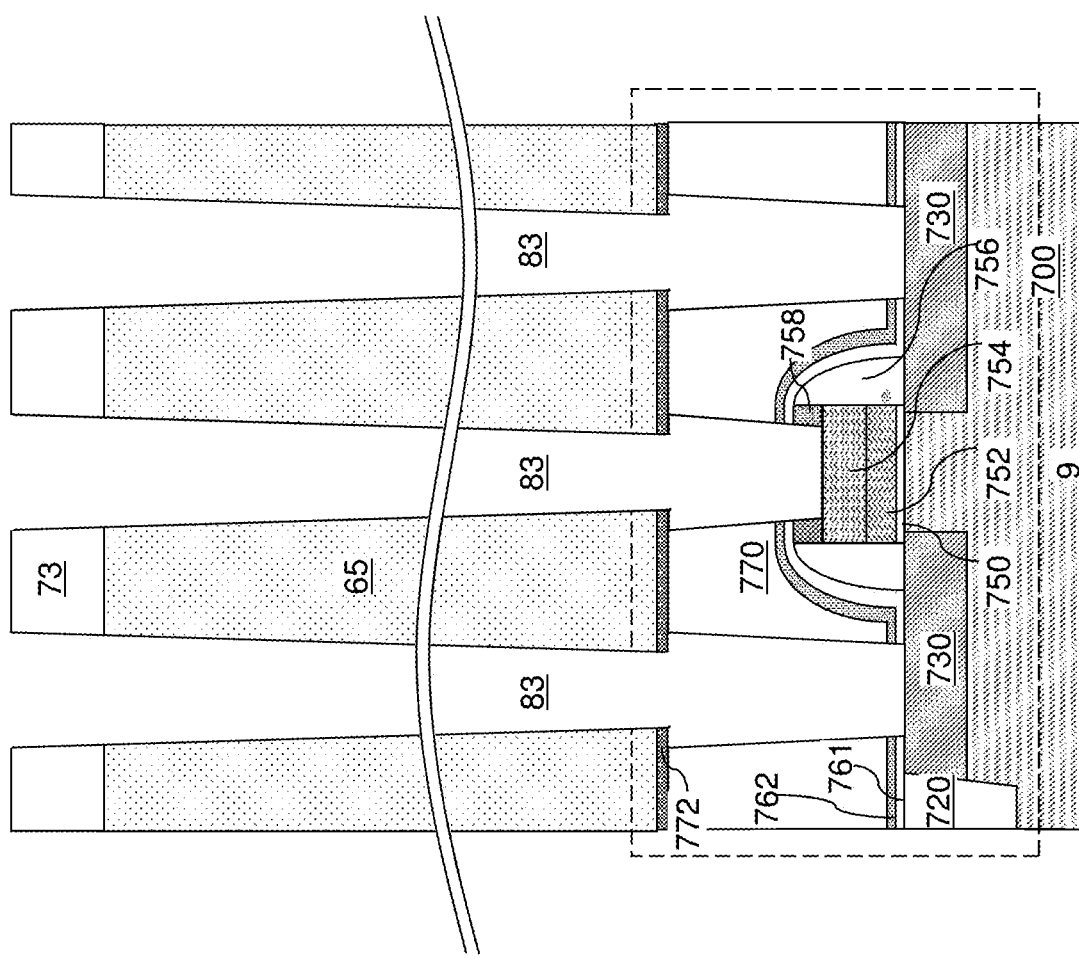
FIG. 17 is a vertical cross-sectional view of a portion of a peripheral region of the exemplary structure after formation of device contact via cavities according to an embodiment of the present disclosure.
Figure 18C:
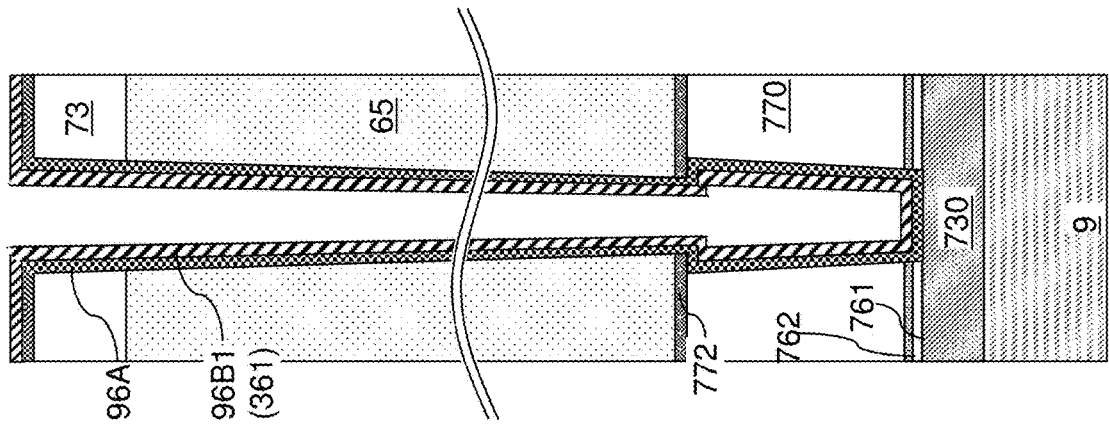
Figure 18B:
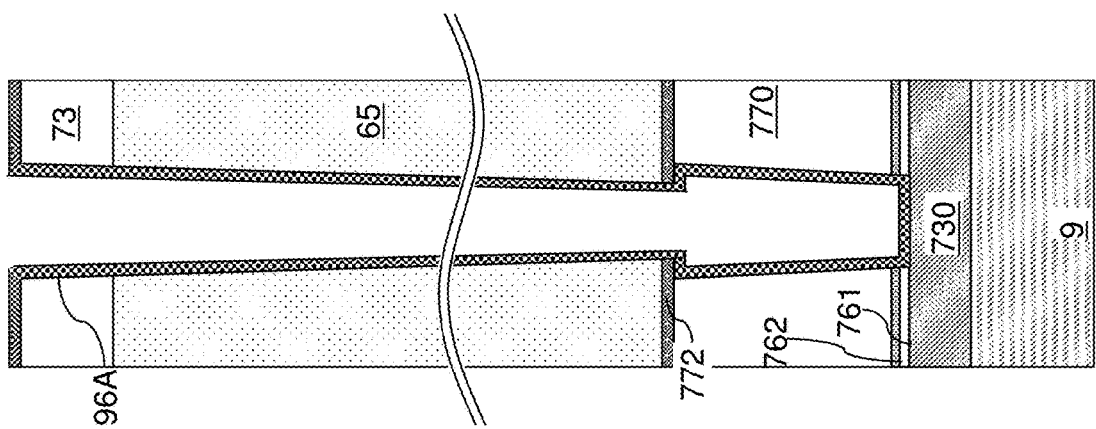
Figure 18A:
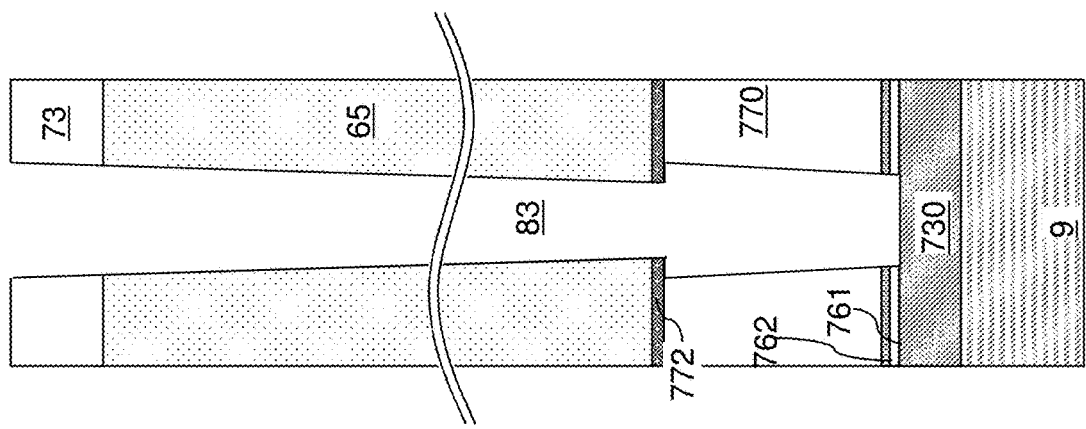

Referring to FIGS. 15A, 16A, and 18A, a structure including a cavity therein is provided, and is placed within a process chamber. In one embodiment, the structure may comprise the exemplary structure illustrated in FIGS. 8 and 9A, a part of which is illustrated in FIG. 15A. In one embodiment, the structure may comprise the exemplary structure illustrated in FIGS. 10A-10C, a part of which is illustrated in FIG. 16A. In one embodiment, the structure may comprise the exemplary structure illustrated in FIGS. 12A and 12B, a part of which is illustrated in FIG. 18A.

Figure 15B:
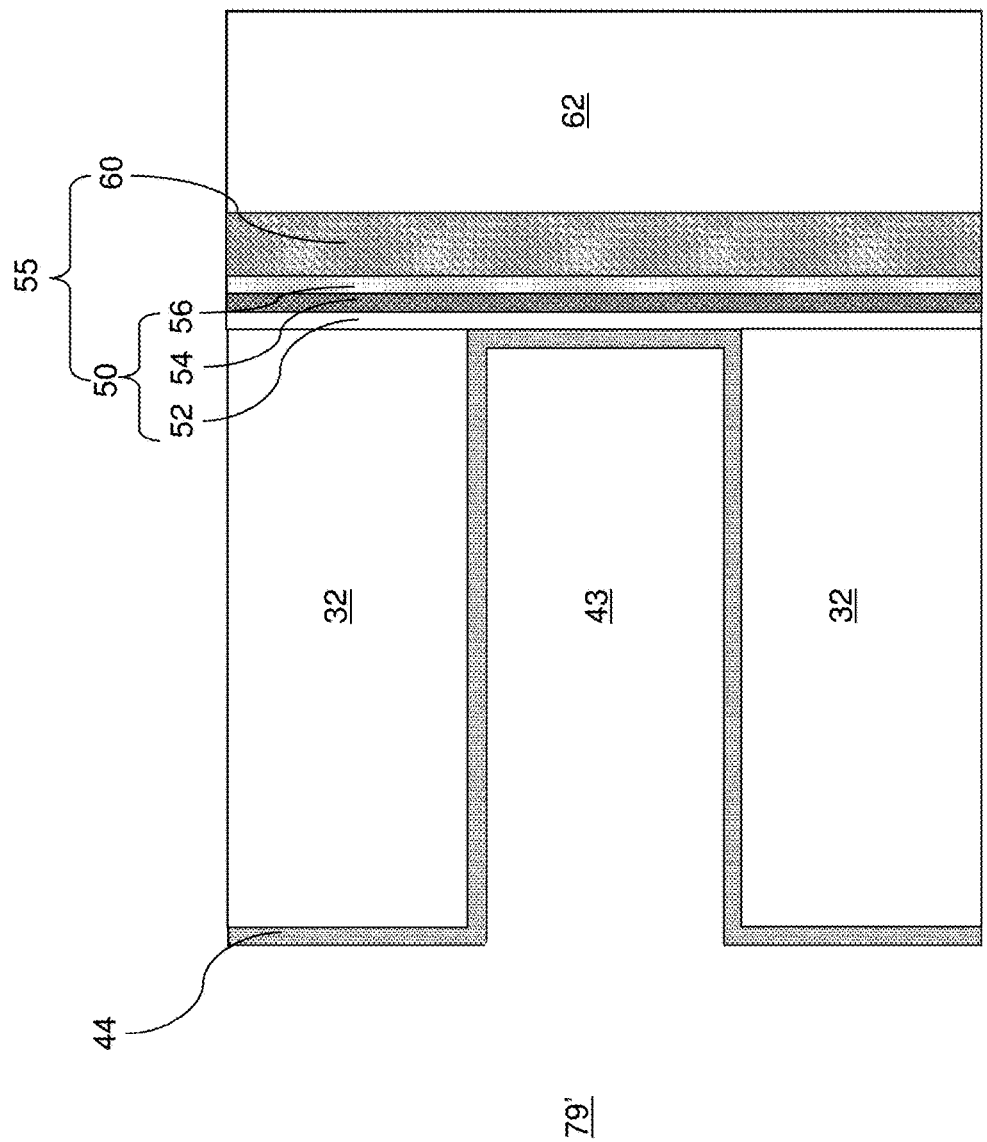
Figure 16B:
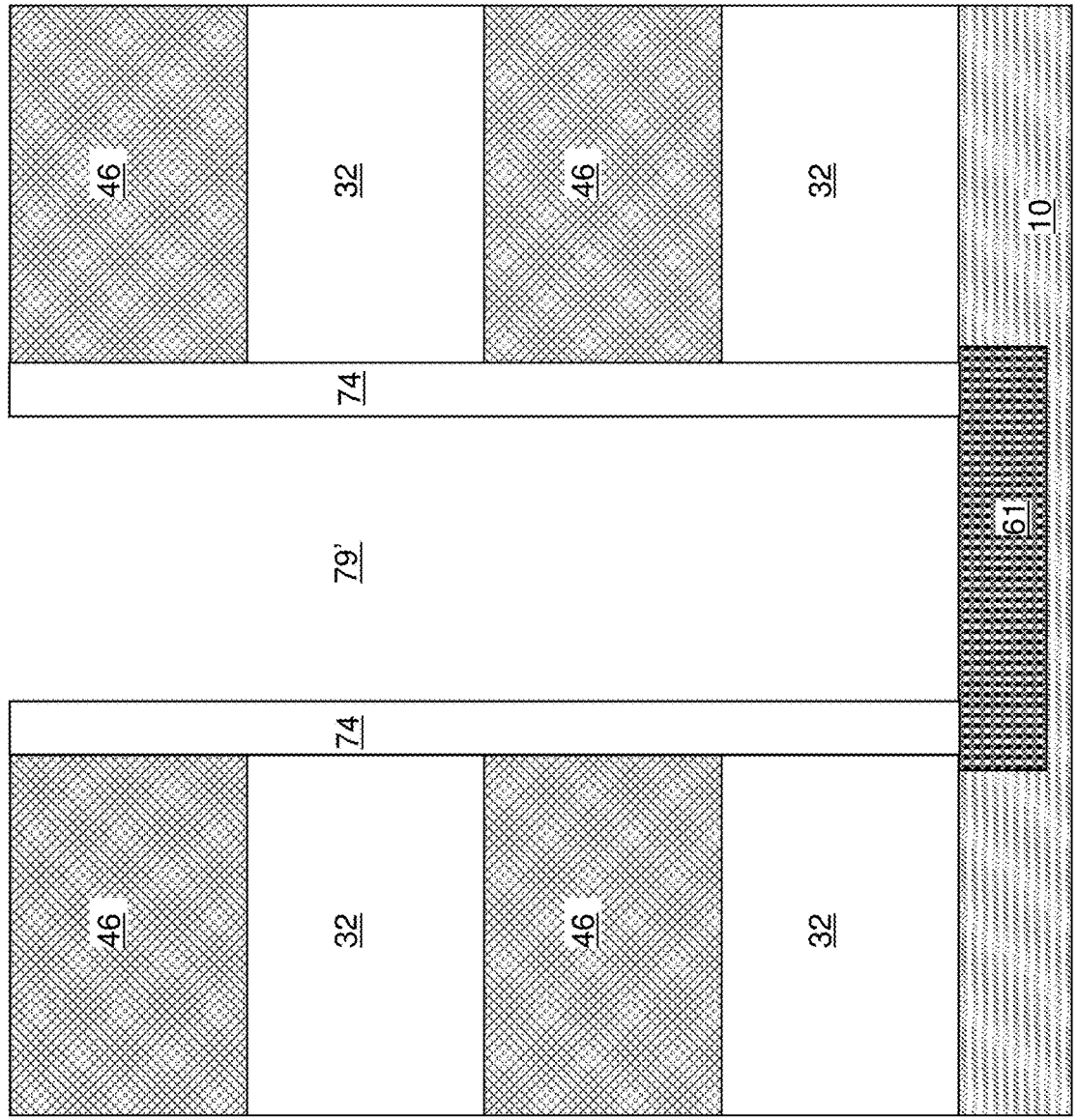

Referring to FIGS. 15B and 16B, a dielectric material may be optionally deposited on a surface of the cavity. For example, the above described backside blocking dielectric layer 44 may be optionally conformally deposited on the physically exposed surfaces of the insulating layers 32 and the memory stack structures 55 as illustrated in FIG. 15B.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43. A backside cavity 79' is present within the portion of each backside trench 79 that is not filled with the backside blocking dielectric layer 44.

In another example, an insulating spacer 74 can be formed in a peripheral region of each backside trench 79 by conformal deposition of an insulating material (such as undoped silicate glass or a doped silicate glass) and by an anisotropic etch process that removes horizontally-extending portions of the insulating material. A remaining vertically-extending tubular portion of the insulating material in each backside trench 79 constitutes an insulating spacer 74.

Generally, formation of an insulating liner, an insulating layer, or an insulating spacer on surfaces of the cavity is optional. In other words, such an insulating liner, an insulating layer, or an insulating spacer may, or may not, be formed on the surface of the cavity.

Figure 15C:
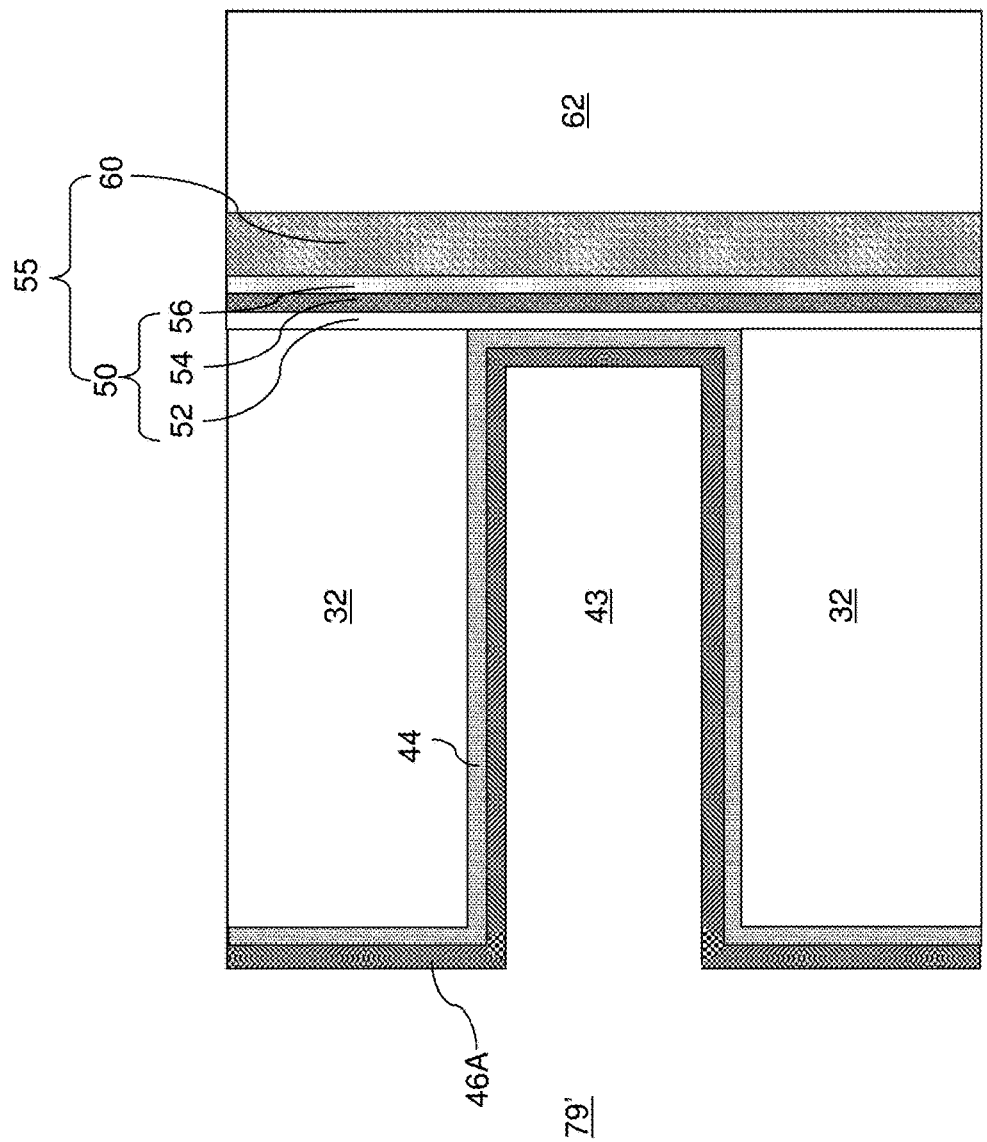
Figure 16C:
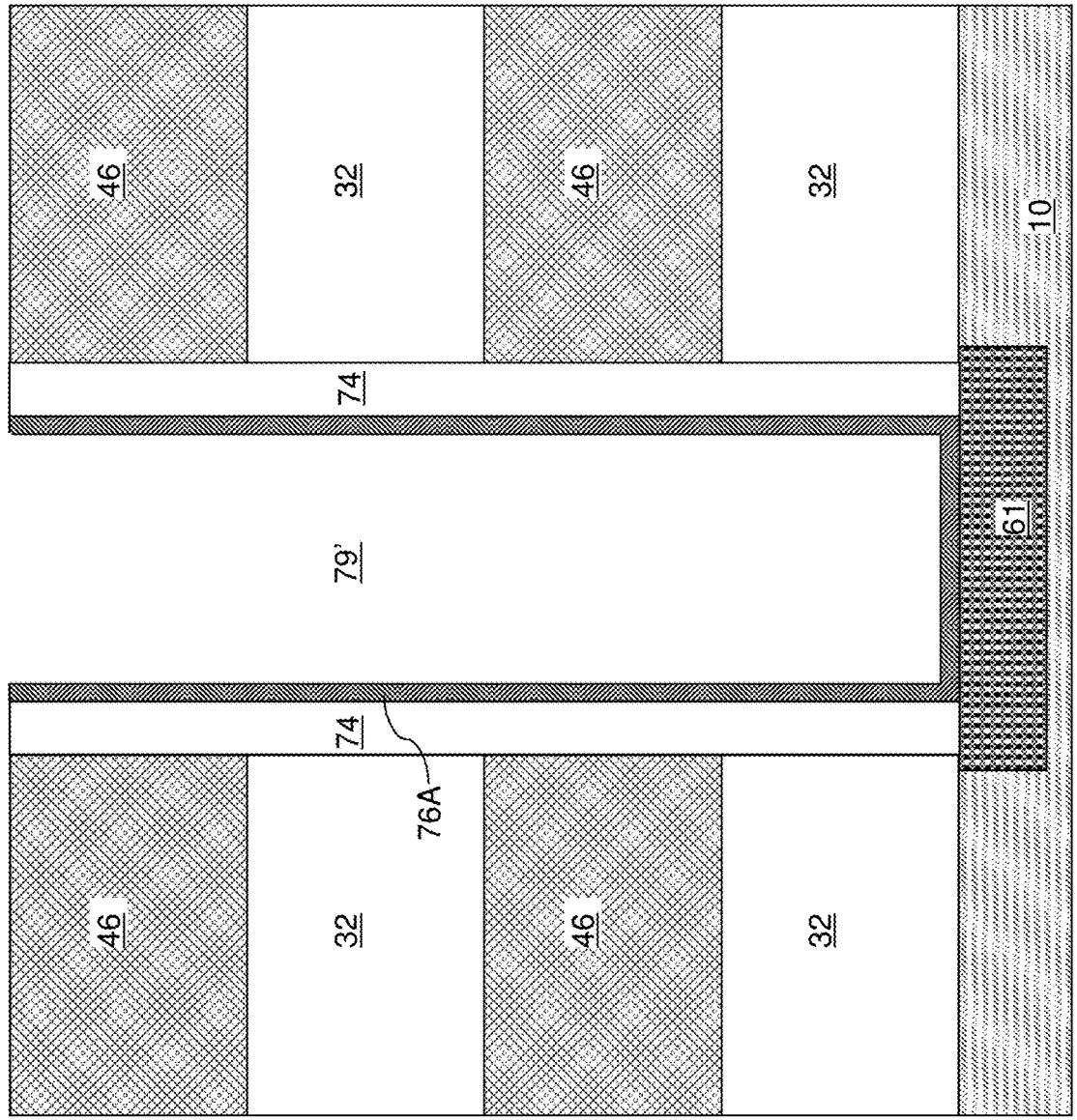

Referring to FIGS. 15C, 16C, and 18B, an optional metallic barrier liner (46A, 76A, 96A) can be conformally deposited on the physically exposed surfaces of a respective cavity, which may be physically exposed surfaces of a backside blocking dielectric layer 44, physically exposed surfaces of an insulating spacer 74, or physically exposed surfaces of the device contact via structure 83, which may comprise physically exposed surfaces of the retro-stepped dielectric material portion 65 of the planarization dielectric layer 770.

The metallic barrier layer (46A, 76A, 96A) can be deposited on the physically exposed surfaces of a respective cavity. The metallic barrier layer (46A, 76A, 96A) may include an electrically conductive metallic material that can function as a diffusion barrier layer and/or adhesion promotion layer for a metal (e.g., tungsten) to be subsequently deposited. The metallic barrier layer (46A, 76A, 96A) can include a conductive metallic nitride material such as TiN, TaN, WN, or a stack thereof, or can include a conductive metallic carbide material such as TiC, TaC, WC, or a stack thereof. In one embodiment, the metallic barrier layer (46A, 76A, 96A) can be deposited by a conformal deposition process such as chemical vapor deposition (CVD) or atomic layer deposition (ALD). The thickness of the metallic barrier layer (46A, 76A, 96A) can be in a range from 2 nm to 50 nm, such as from 5 nm to 20 nm, although lesser and greater thicknesses can also be employed. In one embodiment, the metallic barrier layer (46A, 76A, 96A) can consist essentially of a conductive metal nitride such as TiN.

Referring to FIGS. 15D-15F, 16D-16F, and 18C-18E, at least one metal deposition process can be performed. According to an aspect of the present disclosure, the above described metal fluoride gas and the growth-suppressant gas are flowed into the process chamber, concurrently or alternately, in one or a plurality of the at least one metal deposition processes. Each gas molecule of the metal fluoride gas comprises an atom of an elemental metal and fluorine atoms. Generally, the species of the elemental metal may be any metal that can form a gas phase fluoride molecule. For example, the elemental metal may be selected from W, Mo, Ru, Rh, Re, Os, Ir, or Pt. In one embodiment, the elemental metal may be an element that forms a metal hexafluoride. In one embodiment, the elemental metal may be W.

In one embodiment, each molecule of the growth-suppressant gas may comprise a growth-suppressing element selected from N and/or Cl. In this case, atoms of the growth-suppressing element suppress adhesion of fluorine atoms to the growth surface and to reduce growth rate of the elemental metal on the growth surface as discussed above with reference to FIGS. 14A-14E. In one embodiment, a molecule of the growth-suppressant gas comprises at least one chlorine atom and/or at least one nitrogen atom therein. In one embodiment, the growth-suppressant gas comprises at least one chlorine atom. In one embodiment, the growth-suppressant gas comprises a silicon-containing chloride gas selected from SiH$_3$Cl, SiH$_2$Cl$_2$, SiHCl$_3$, or SiCl$_4$. In one embodiment, the growth-suppressant gas comprises a boron-containing chloride gas selected from BH$_2$Cl, BHCl$_2$, or BCl$_3$. In one embodiment, the growth-suppressant gas comprises at least one nitrogen atom, such as N$_2$ or NH$_3$.

Within each metal deposition process in which the metal fluoride gas and a growth-suppressant gas are flowed into the process chamber concurrently or alternately, the metal fluoride gas decomposes and deposits atoms of an elemental metal contained in the metal fluoride gas on at least one surface of the cavity to form a metal layer (e.g., tungsten layer). According to an aspect of the present disclosure, atoms of the growth-suppressing element (which may comprise chlorine or nitrogen atoms) are adsorbed on the growth surface to suppress adhesion of fluorine atoms from the metal fluoride gas and to suppress adhesion of metal fluoride compounds to atoms of the elemental metal on the growth surface, and to reduce growth rate of the elemental metal on the growth surface.

In one embodiment, the metal fluoride gas and the growth-suppressant gas may be simultaneously flowed into the process chamber for a duration of time during the deposition process. In some embodiments, initiation of flow the growth-suppressant gas into the process chamber occurs at a later time than initiation of flow of the metal fluoride gas into the process chamber. In some other embodiments, initiation of flow the growth-suppressant gas into the process chamber occurs at the same time as the initiation of flow of the metal fluoride gas into the process chamber. In one embodiment, the volume or flow rate of the growth-suppressant gas may comprise 10 percent or less of the respective volume or flow rate of the metal fluoride gas, such as 5 percent or less, for example 1 to 5 percent, such as 2 to 4 percent. In other words, a ration of the volume or flow rate of the growth-suppressant gas to the respective volume or flow rate of the metal fluoride gas may be 0.1 or less to 1, such as 0.01:1 to 0.05 to 1.

Generally, a residual amount of the growth-suppressing element may be incorporated into the deposited metal layer. In this case, the deposited metal layer comprises the elemental metal (e.g., tungsten) at an atomic concentration in a range from 97.0% to 99.99%, such as from 99.0% to 99.9%, and comprises atoms of the growth-suppressing element (such as Cl or N) at an atomic concentration in a range from 0.01% to 3.0%, such as from 0.1% to 1.0%.

In an illustrative example, the deposition process may comprise a nucleation process in which a nucleation layer 361 of the elemental metal nucleates on at least one surface of the cavity, a bulk-portion deposition process in which a bulk fill portion 362 of the metal layer is deposited on the nucleation layer 361, and an optional terminal deposition process that forms a capping portion 363 of the metal layer. In the example illustrated in FIGS. 15D-15F, the deposited metal layer may include a nucleation layer 46B1 of the metallic fill material layer 46B, a bulk fill portion 46B2 of the metallic fill material layer 46B, and a capping portion 46B3 of the metallic fill material layer 46B. In the example illustrated in FIGS. 16D-16F, the deposited metal layer may include a nucleation layer 76B1 of the metallic fill material portion 76B, a bulk fill portion 76B2 of the metallic fill material portion 76B, and a capping portion 76B3 of the metallic fill material portion 76B. In the example illustrated in FIGS. 18C-18E, the deposited metal layer may include a nucleation layer 96B1 of the metallic fill material portion 96B, a bulk fill portion 96B2 of the metallic fill material portion 96B, and a capping portion 96B3 of the metallic fill material portion 96B.

In one embodiment illustrated in FIGS. 15A-15G, the metal layer 46B is deposited over a structure which comprises a memory device comprising a stack of insulating layers 32 that are vertically spaced from each other by cavities 43, and memory opening fill structures 58 that each comprise a memory film 50 and a vertical semiconductor channel 60, and that vertically extend through each of the insulating layers within the stack of insulating layers. The metal layer 46B is deposited into the cavities 43 to form word lines 46.

In another embodiment illustrated in FIGS. 16A-16F, the metal layer 76B is deposited over a structure that comprises a memory device comprising memory opening fill structures 58 that each comprise a memory film 50 and a vertical semiconductor channel 60, and two stacks of insulating layers 32 and electrically conductive layers 46 that are laterally spaced apart by a line trench 79. The metal layer 76 is deposited into the line trench 79.

In another embodiment illustrated in FIGS. 18A-18F, the metal layer 96B is deposited over a structure that includes a transistor 700 and at least one dielectric material portion 770 containing a cavity 83 located over the transistor 700. The metal layer 96B is deposited into the cavity 83.

In one embodiment, the deposition method comprises a chemical vapor deposition process, and the step of providing the metal fluoride gas and the growth-suppressant gas into the process chamber comprises providing the tungsten hexafluoride gas and the tungsten growth-suppressant gas into the process chamber at the same time to deposit the tungsten layer.

In another embodiment, the metal deposition process comprises an atomic layer deposition process in which multiple repetitions of a unit process cycle are repeated. In one embodiment, the unit process cycle comprises a metal deposition step in which at least the metal fluoride gas is flowed into the process chamber and a reduction step in which hydrogen is flowed into the process chamber. In case the metal deposition process comprises a nucleation process, a bulk-portion deposition process, and a terminal deposition process, one, a plurality, or each, of the nucleation process, the bulk-portion deposition process, and the terminal deposition process may comprise a respective atomic layer deposition process in which multiple repetitions of a respective unit process cycle are repeated. In one embodiment, the respective unit process cycle comprises a reactant soak step in which the metal fluoride gas is flowed into the process chamber and a reduction step in which hydrogen is flowed into the process chamber.

Figure 15D:
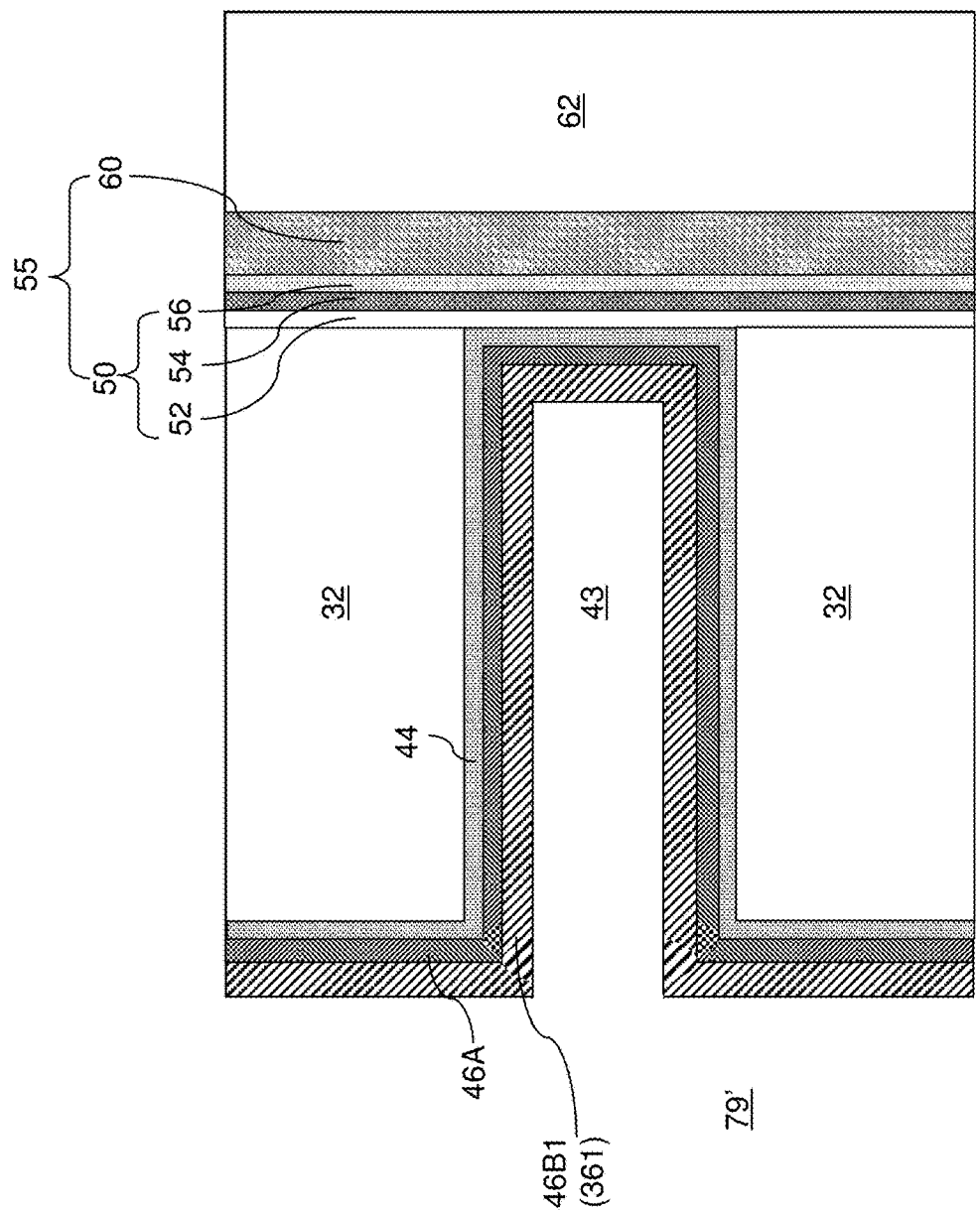
Figure 16D:
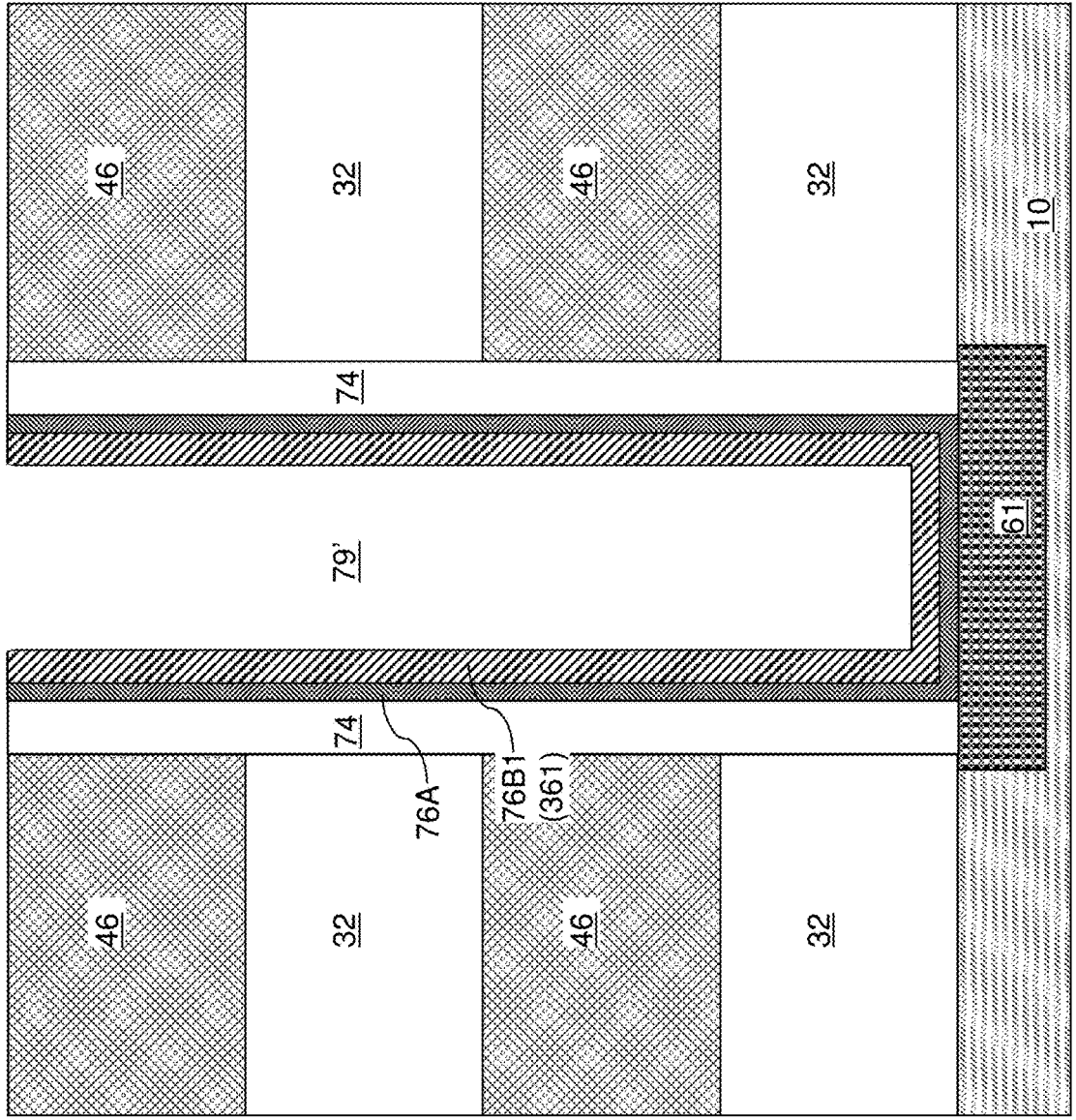

The nucleation process, the bulk-portion deposition process and the terminal deposition process conditions may differ between the three processes. For example, in the nucleation process the nucleation layer 361 of the elemental metal nucleates on at least one surface of the cavity as illustrated in FIGS. 15D, 16D, and 18C. In one embodiment, the nucleation process comprises first repetitions of the multiple repetitions of the unit process cycle. In the bulk-portion deposition process, a bulk fill portion 362 of the metal layer is deposited on the nucleation layer 361 of the elemental metal. The bulk-portion deposition process may comprise second repetitions of the multiple repetitions of the unit process cycle.

In one embodiment, the growth-suppressant gas is used during the nucleation process but not during the bulk-fill process. In another embodiment, a higher percentage (e.g., higher relative volume or flow rate) of the growth-suppressant gas is used during the nucleation process than during the bulk-fill process. In these embodiments, the bulk-portion deposition process differs from the nucleation process by greater number of incorporated atoms of the growth-suppressing element into the nucleation layer 361 than into the bulk fill portion 362. Thus, there is a gradient in the concentration of atoms of the growth-suppressing element (e.g., nitrogen and/or chlorine atoms) between the nucleation layer 361 and the bulk fill portion 362 of the metal (e.g., tungsten) layer. For example, the outer nucleation portion 361 of the metal (e.g., tungsten) layer (46, 76, 96, 86, 88) that is located closer to the walls of the cavity (43, 79, 83, 85, 87) containing the metal layer has a higher concentration of the growth-suppressing element than the inner bulk fill portion 362 of the metal (e.g., tungsten) layer (46, 76, 96, 86, 88) that is located farther from the walls of the cavity (43, 79, 83, 85, 87) than the outer nucleation portion 361. The concentration difference may comprise at least a 10% difference, such as a 20% to 100% difference.

In this embodiment, a semiconductor structure includes an active semiconductor device (e.g., transistor 700 and/or memory device containing memory opening fill structures) and a tungsten layer (46B, 76B, 96B) located in a cavity (43, 79, 83) in the semiconductor structure. The tungsten layer has a different concentration of at least one of chlorine or nitrogen atoms in a first portion 361 located closer to the cavity sidewalls than in a second portion 362 located farther from the cavity sidewalls. The tungsten layer also has a different concentration of fluorine atoms in the first portion 361 located closer to the cavity sidewalls than in the second portion 362 located farther from the cavity sidewalls. The amount of the fluorine atoms increases in an opposite direction through a thickness of the tungsten layer than the amount of the at least one of chlorine or nitrogen atoms.

In one embodiment, the concentration of at least one of chlorine or nitrogen atoms in the first portion located closer to the cavity sidewalls is greater than in the second portion located farther from the cavity sidewalls, and the concentration of the fluorine atoms in the first portion located closer to the cavity sidewalls is less than in the second portion located farther from the cavity sidewalls. In another embodiment, the concentration of at least one of chlorine or nitrogen atoms in the first portion located closer to the cavity sidewalls is less than in the second portion located farther from the cavity sidewalls, and the concentration of the fluorine atoms in the first portion located closer to the cavity sidewalls is greater than in the second portion located farther from the cavity sidewalls.

In one embodiment, the concentration of the at least one of chlorine or nitrogen atoms in the first portion 361 located closer to the cavity sidewalls differs by at least 10 atomic percent than in the second portion 362 located farther from the cavity sidewalls. The concentration of the fluorine atoms in the first portion 361 located closer to the cavity sidewalls differs by at least 10 atomic percent than in the second portion 362 located farther from the cavity sidewalls. In one embodiment, the atomic concentration of the chlorine atoms in the tungsten layer in the range from 0.01% to 3.0% and/or the atomic concentration of the nitrogen atoms in the tungsten layer in the range from 0.01% to 3.0%.

As described above, the controlled tungsten deposition process allows HF to get effectively purged out during tungsten deposition. Therefore, the fluorine concentration profile in the metal layer (e.g., tungsten layer) may vary in the opposite direction from the growth-suppressing element. In these embodiments, the bulk-portion deposition process differs from the nucleation process by smaller number of incorporated fluorine atoms into the nucleation layer 361 than into the bulk fill portion 362. Thus, there is a gradient in the concentration of the fluorine atoms between the nucleation layer 361 and the bulk fill portion 362 of the metal (e.g., tungsten) layer. For example, the outer nucleation portion 361 of the metal (e.g., tungsten) layer (46, 76, 96, 86, 88) that is located closer to the walls of the cavity (43, 79, 83, 85, 87) containing the metal layer has a lower concentration of fluorine than the inner bulk fill portion 362 of the metal (e.g., tungsten) layer (46, 76, 96, 86, 88) that is located farther from the walls of the cavity (43, 79, 83, 85, 87) than the outer nucleation portion 361. The fluorine concentration difference may comprise at least a 10% difference, such as a 20% to 100% difference.

Figure 15E:
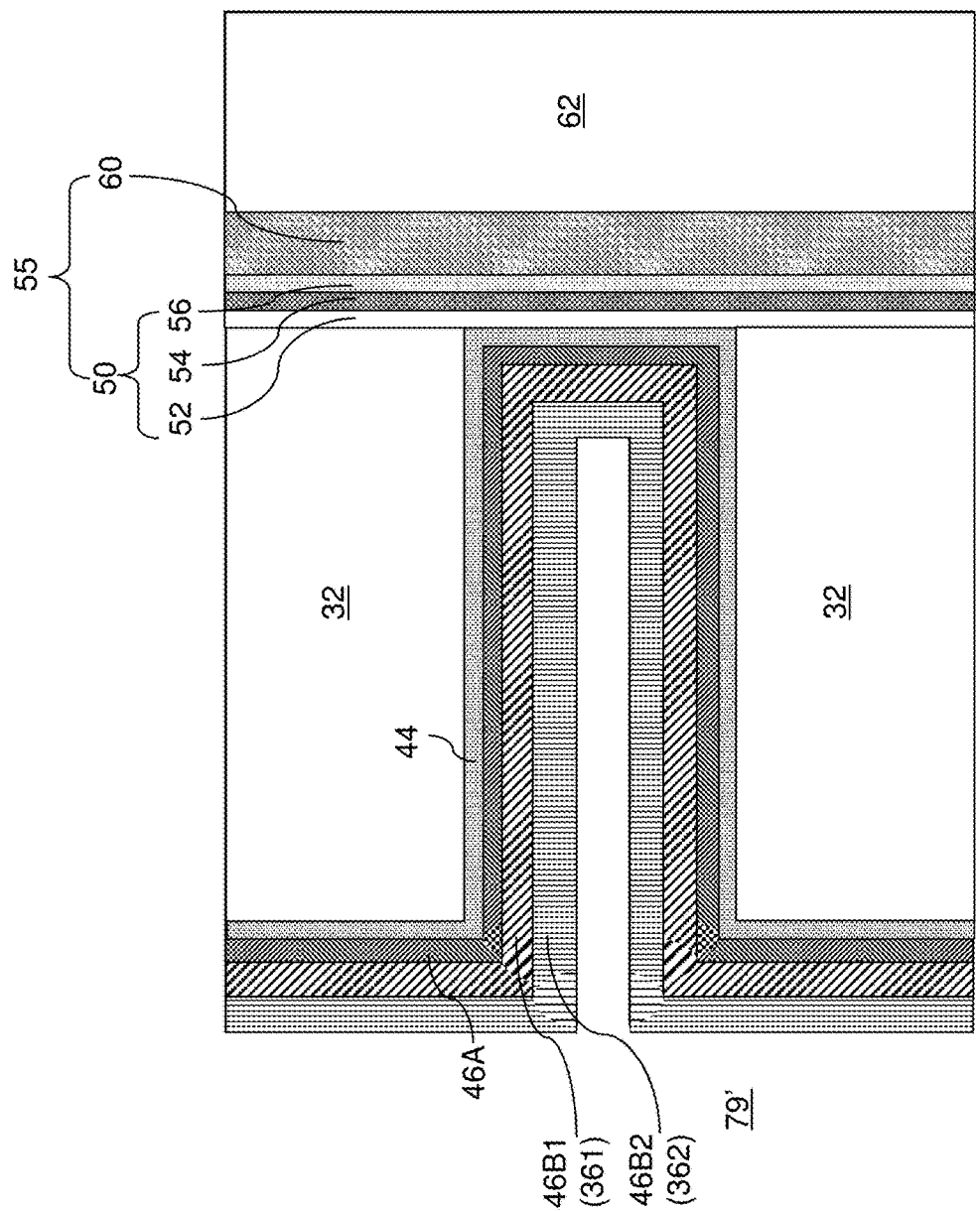
Figure 16E:
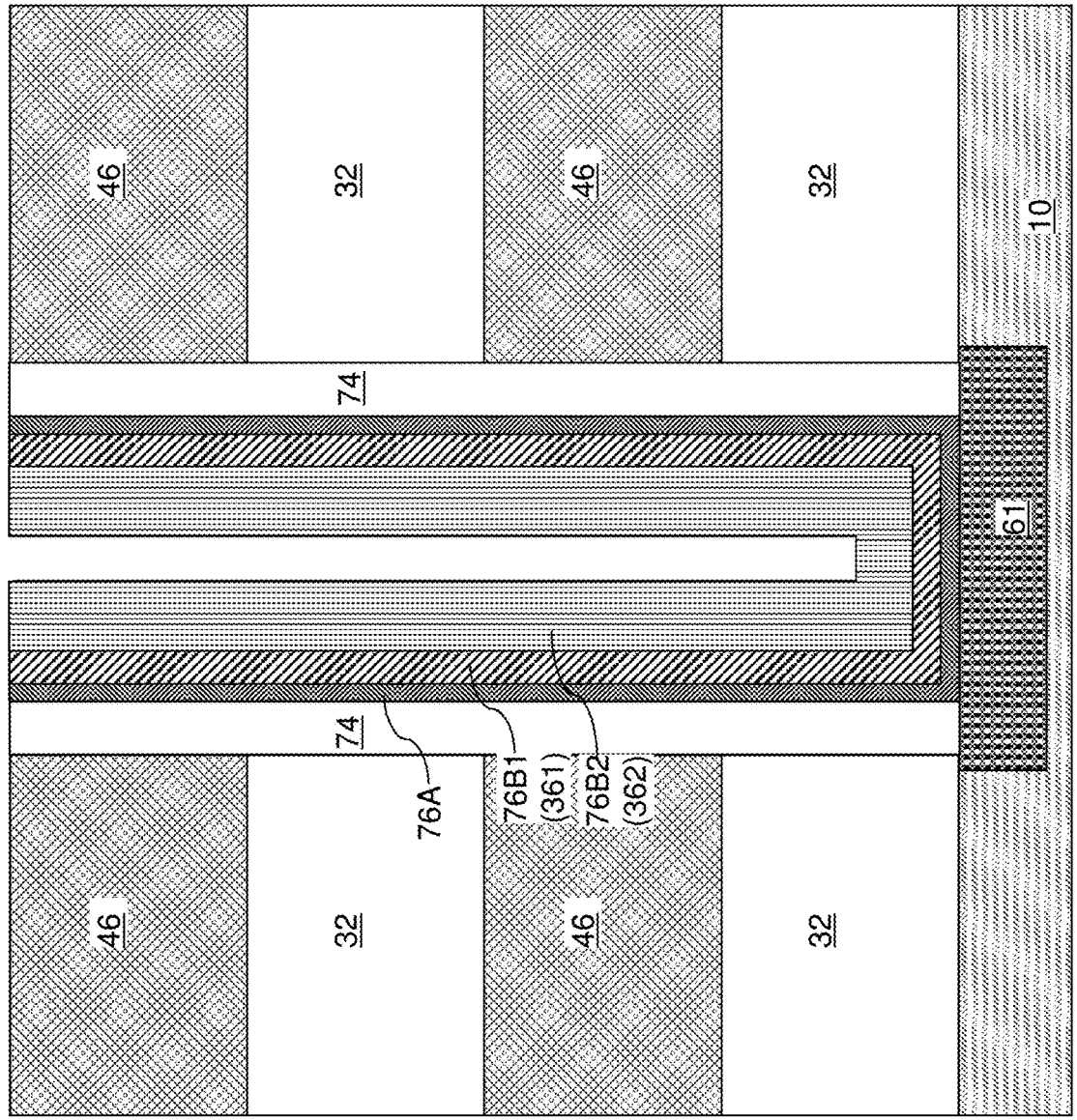

In the deposition process, more of the growth-suppressing element is incorporated per surface monolayer of the elemental metal per unit area during the nucleation process than during the bulk fill process. In other words, less atoms of the growth-suppressing element may be adsorbed per unit area on the growth surface during the bulk-portion deposition process than during the nucleation process. A bulk fill portion 362 of the metal layer can be deposited on the nucleation layer 361 during the bulk-portion deposition process as illustrated in FIGS. 15E, 16E, and 18D.

Figure 15F:
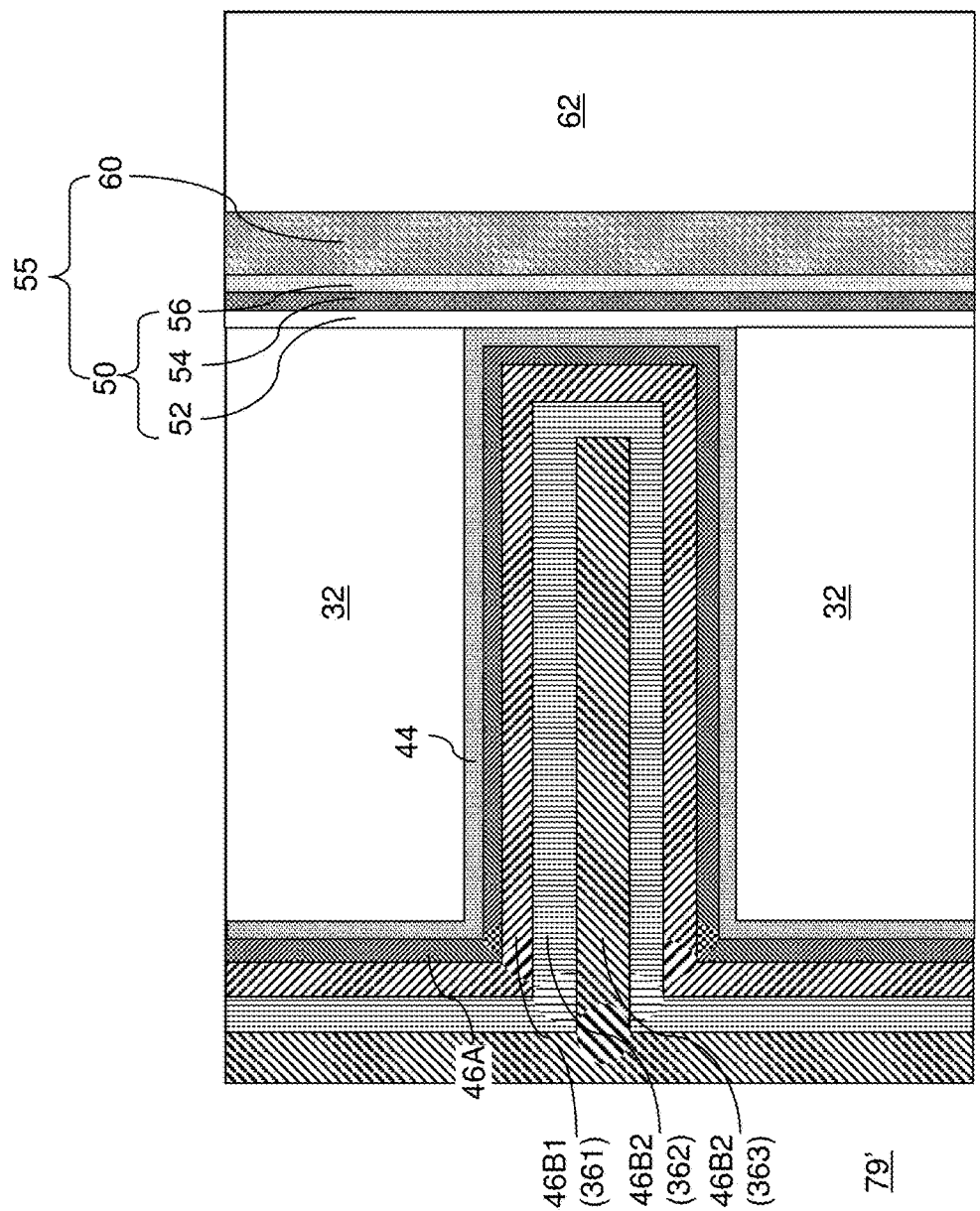
Figure 15G:
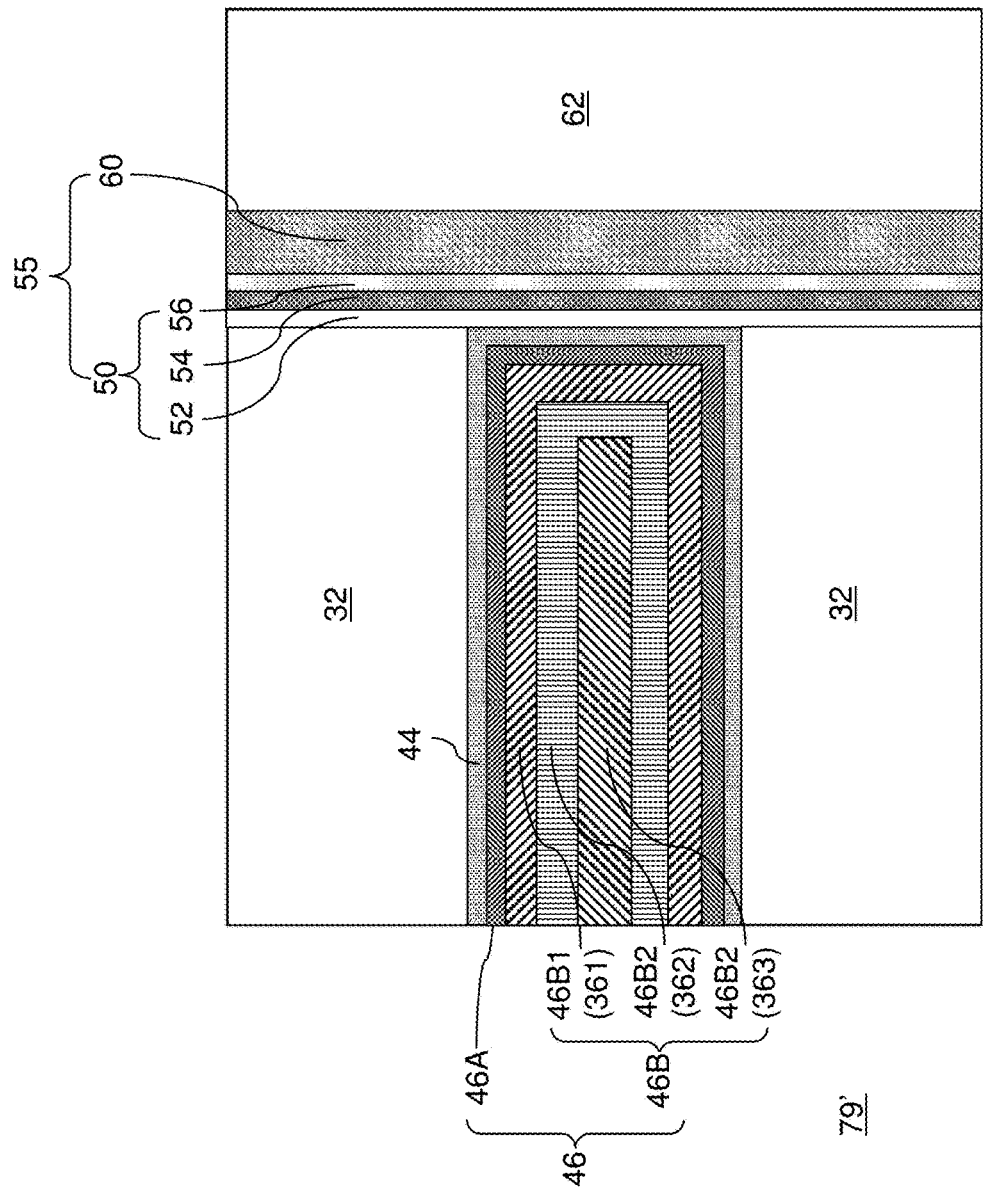
Figure 16F:
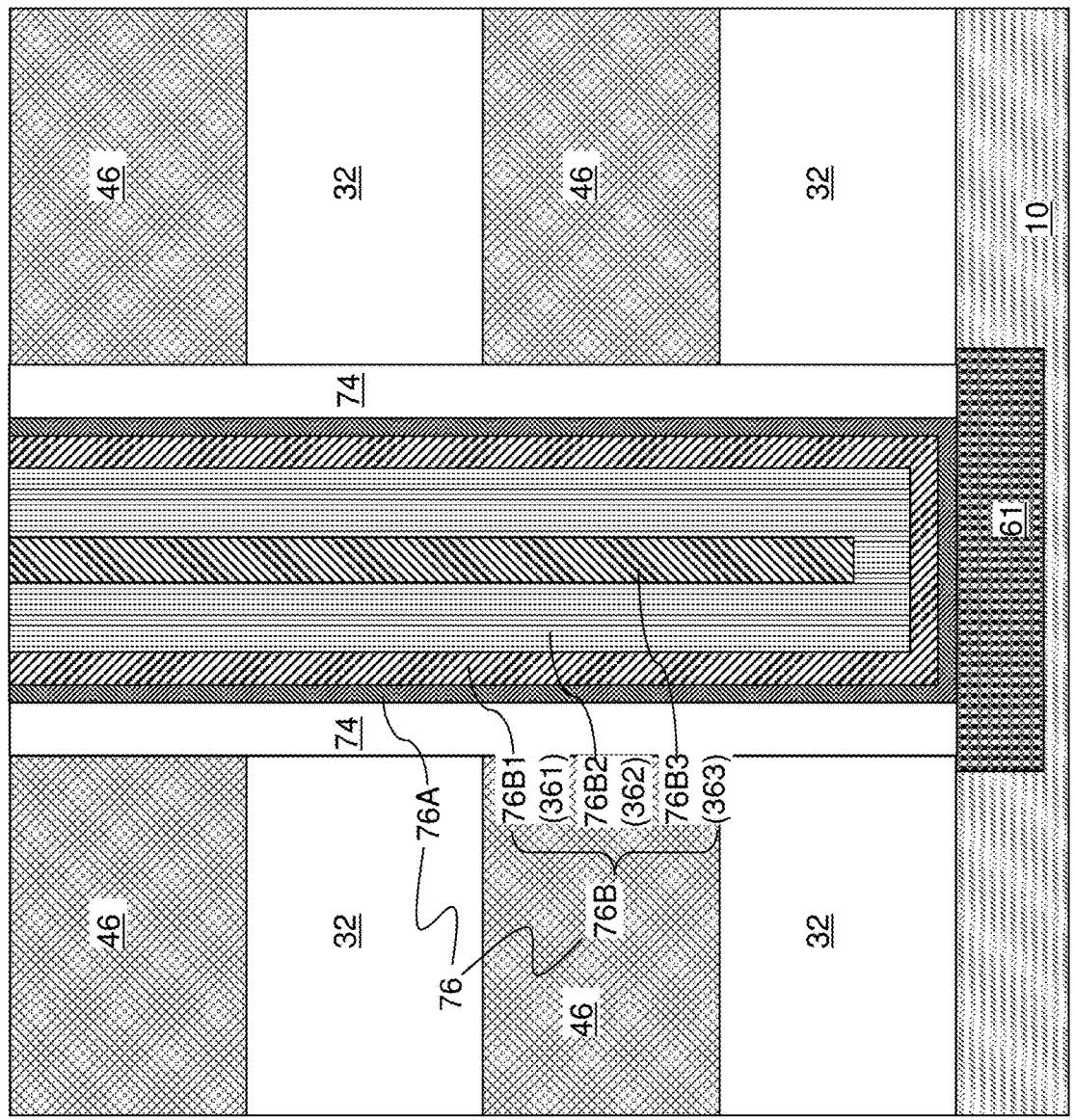

In one embodiment, the metal deposition process further comprises the optional terminal deposition process in which additional monolayers of the metal layer are deposited on the bulk fill portion 362 of the metal layer. In one embodiment, the terminal deposition process may comprise third repetitions of the multiple repetitions of the unit process cycle. In one embodiment, the terminal deposition process may differ from the bulk-portion deposition process by the total number of incorporated atoms of the growth-suppressing element per surface monolayer of the elemental metal per unit area. In other words, more, or less, atoms of the growth-suppressing element may be adsorbed per unit area on the growth surface during the terminal deposition process than during the bulk-portion deposition process. A capping portion 363 of the metal layer can be deposited on the bulk fill portion 362 during the terminal deposition process as illustrated in FIGS. 15F, 16F, and 18E.

Alternatively, the metal deposition process may comprise the chemical vapor deposition in which the metal fluoride gas is flowed into the process chamber throughout a deposition step, and the growth-suppressant gas is flowed into the process chamber at least during the nucleation deposition step, and is then either discontinued or provided at a reduced flow rate during the bulk-portion deposition process and/or during the capping deposition process to obtain the gradient distribution of the nucleation suppression element in the metal layer described above. In another embodiment, the growth-suppressant gas may be flowed into the process chamber through the entire duration of the metal layer deposition. Alternatively, the growth-suppressant gas may be flowed into the process chamber intermittently with periodic or non-periodic pauses in the flow of the growth-suppressant gas.

In one embodiment, the metal deposition process may comprise a nucleation process in which a nucleation layer 361 of the elemental metal nucleates on the at least one surface of the cavity, and a bulk-portion deposition process in which a bulk fill portion 362 of the metal layer is deposited on the nucleation layer of the elemental metal. In one embodiment, the bulk-portion deposition process differs from the nucleation process by a ratio of a flow rate of the metal fluoride gas to a flow rate of the growth-suppressant gas. In one embodiment, the metal deposition process may further comprise an optional terminal deposition process in which a capping portion 363 is deposited on the bulk fill portion 362 of the metal layer. In one embodiment, the terminal deposition process differs from the bulk-portion deposition process by a ratio of a flow rate of the metal fluoride gas to a flow rate of the growth-suppressant gas.

The above embodiments are described as having a higher chlorine and/or nitrogen concentration and a lower fluorine concentration in the outer nucleation portion 361 than in the inner bulk fill portion 362 of the metal (e.g., tungsten) layer. In an alternative embodiment, the growth-suppressant gas may be used during the bulk-fill process but not during the nucleation process. In this alternative embodiment described below with respect to FIG. 21, a lower chlorine and/or nitrogen concentration and a higher fluorine concentration may be presented in the outer nucleation portion 361 than in the inner bulk fill portion 362 of the metal (e.g., tungsten) layer.

Due to the difference in the fluorine and growth-suppressing element concentration profile between the inner bulk fill portion 362 of the metal (e.g., tungsten) layer (46, 76, 96, 86, 88) and the outer nucleation portion 361 of the metal layer, the stress and/or grain size of the inner bulk fill portion 362 may differ from that of the outer nucleation portion 361.

Referring to FIGS. 15G, 18F, 11, and 13A-13D, excess portion of the metal layer that is deposited outside the cavity may be removed as needed. For example, an etch back process employing an anisotropic etch process or an isotropic etch process may be employed to remove vertically-extending portion of the metal layer outside horizontally-extending cavities such as the backside recesses 43. Alternatively, an etch back process or a chemical mechanical polishing (CMP) process may be employed to remove horizontally-extending portions of the metal layer above vertically-extending cavities, such as the backside trenches 79, the drain contact via cavities 87, the word line contact via cavities 85, and/or the device contact via cavities 83.

Referring back to FIGS. 15A-15G, the metal layer 46B may be deposited into horizontally-extending cavities (i.e., backside recesses 43) located between the insulating layers 32 that are vertically spaced from each other by the cavities. In this case, the at least one surface of the cavity on and/or over which the metal layer is deposited may comprise horizontal surfaces of the neighboring pair of insulating layers 32 and cylindrical surface segments of the memory opening fill structures 58 (such as a cylindrical surface segment of an outer sidewall of a backside blocking dielectric layer 52). The suppression of the tungsten growth rate permits more time for tungsten deposition at memory opening fill structures 58 located distal from the backside trenches 79. This results in more uniform tungsten filling throughout the length of the backside recesses 43 and lower defects (e.g., voids) caused by fluorine degassing.

Referring back to FIGS. 16A-16F, the metal layer 76B may be deposited into vertically-extending cavities (i.e., backside trenches 79) that are located between two stacks of insulating layers 32 and electrically conductive layers 46. In this case, the at least one surface of the cavity on and/or over which the metal layer 76 is deposited comprises sidewalls of the two stacks of insulating layers 32 and electrically conductive layers 46 that are physically exposed to the backside trench 79.

Referring back to FIGS. 17 and 18A-18F, the metal layer 96B may be deposited into vertically-extending cavities 83 that are located in at least one dielectric material portion (such as a retro-stepped dielectric material portion 65) located over the semiconductor device 700. In this case, the at least one surface of the cavity on and/or over which the metal layer 83 is deposited comprises a top surface of an element (such as an active region, i.e., a source/drain region or a gate electrode) of the semiconductor device 700 and a sidewall surface of the via cavity 83 of the at least one dielectric material portion 65.

In the embodiment in which the metal deposition process comprises an atomic layer deposition process, the unit process cycle may have various types of gas flow sequences. FIGS. 19A-19D are exemplary gas flow sequences that may be employed in the ALD processes according to an embodiment of the present disclosure. The ALD process comprises a plurality of unit process cycles, and each unit process cycle comprises a tungsten deposition step, a tungsten hexafluoride purge step, a reducing step and a reducing gas purging step.

Figure 19A:
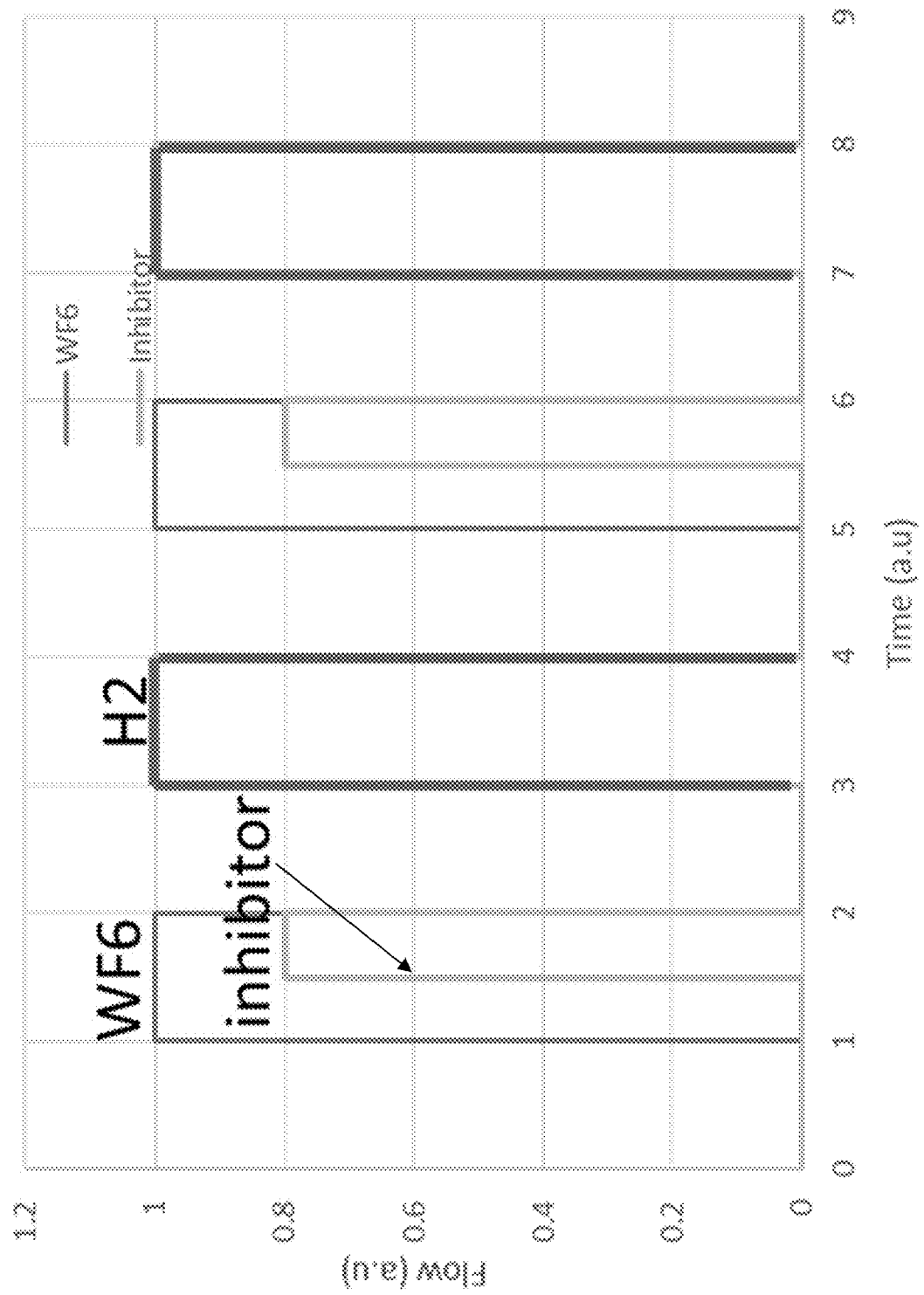
FIGS. 19A-19D are plots of flow rate versus time of exemplary gas flow sequences that may be employed in deposition processes according to an embodiment of the present disclosure.

In one embodiment shown in FIG. 19A, the metal fluoride gas (e.g. $WF_6$) and the growth-suppressant gas (e.g., inhibitor) are simultaneously flowed into the process chamber for a duration of time during the deposition step. In one embodiment, initiation of flow the growth-suppressant gas into the process chamber occurs during a flow of the metal fluoride gas into the process chamber and at after the initiation of flow of the metal fluoride gas into the process chamber. The flow of the growth-suppressant gas and the metal fluoride gas may be terminated at the same time prior to the initiation of the reducing step.

Figure 19B:
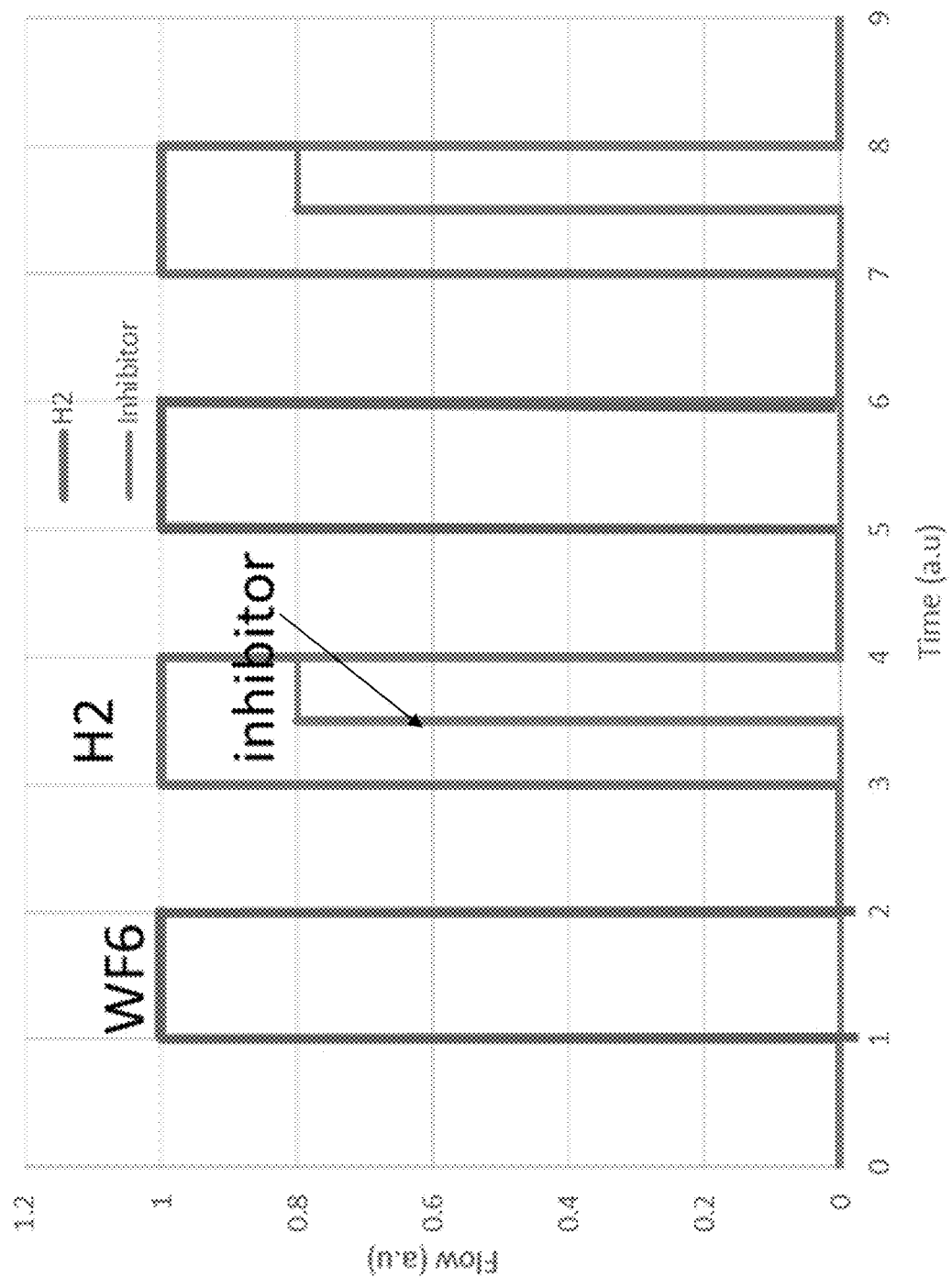

In another embodiment shown in FIG. 19B, the hydrogen gas ($H_2$) and the growth-suppressant gas (e.g., inhibitor) are simultaneously flowed into the process chamber for a duration of time during the reducing step. In one embodiment, initiation of flow the growth-suppressant gas into the process chamber occurs at a later time than initiation of flow of the hydrogen gas into the process chamber. The flow of the growth-suppressant gas and the hydrogen gas may be terminated at the same time prior to the initiation of the tungsten deposition step. Thus, the growth-suppressant gas may not be flowed into the process chamber when the tungsten hexafluoride gas is flowed into the process chamber in this embodiment.

Figure 19C:
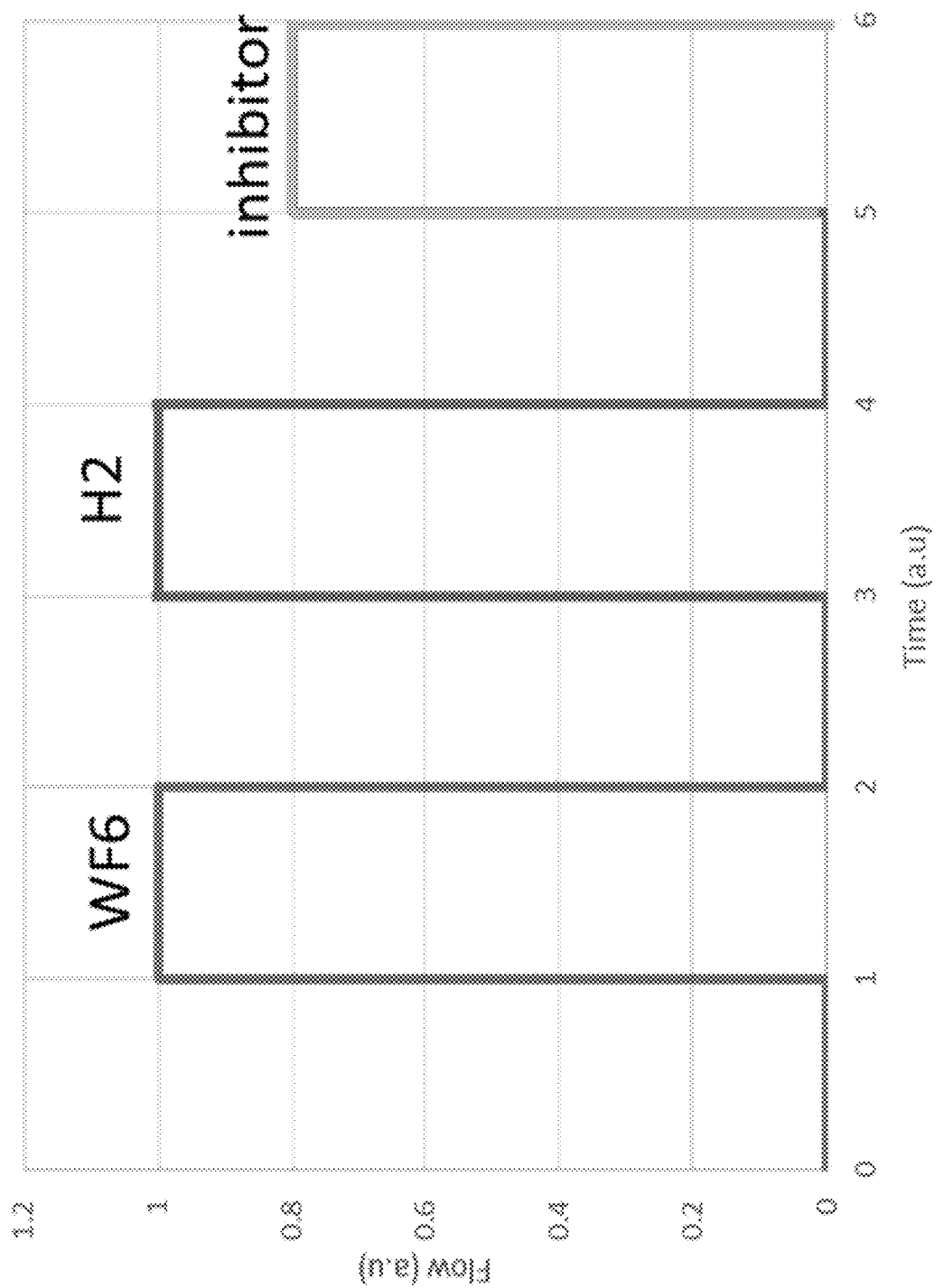

In another embodiment shown in FIG. 19C, the metal fluoride gas, the hydrogen gas ($H_2$) and the growth-suppressant gas (e.g., inhibitor) are separately flowed into the process chamber in separate steps. The growth-suppressant gas is flown into the process chamber occurs between each of the unit process cycles. The tungsten deposition step may be followed by the reducing step followed by the growth-suppressant gas flow step. The flow rate of the growth-suppressant gas may be lower than the flow rate of the tungsten hexafluoride gas.

Figure 19D:
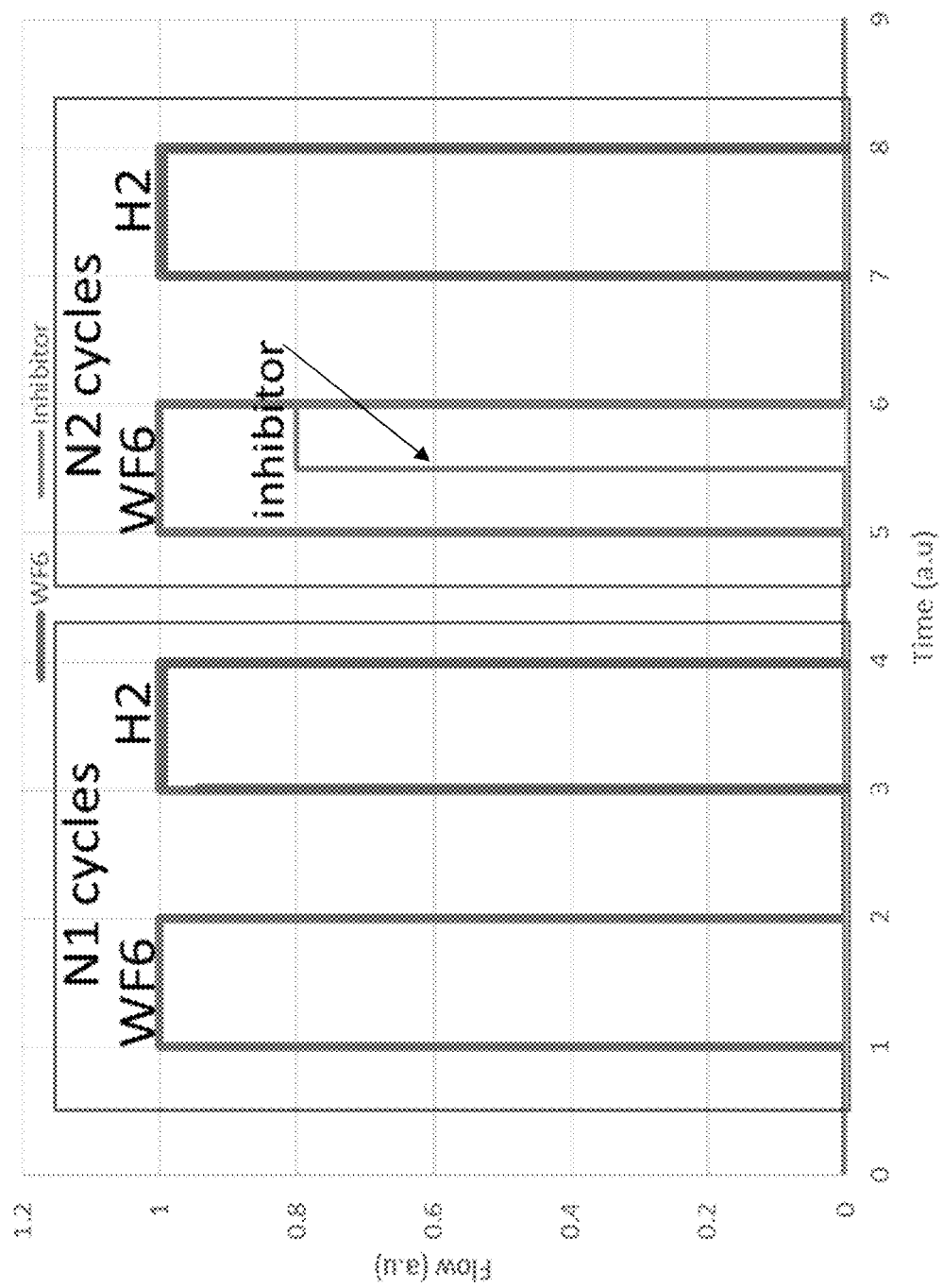

In another embodiment shown in FIG. 19D, the growth-suppressant gas is provided into the process chamber during some but not all cycles. For example, FIG. 19D illustrates an embodiment in which a first unit process cycle including first tungsten deposition step and a first reducing step are repeated N1 times, without flowing the growth-suppressant gas during or between these cycles. However, the growth-suppressant gas is flowed during a second unit process cycle including a second tungsten deposition step and a second reducing step which are repeated N2 times. For example, the growth-suppressant gas is flowed concurrently with the tungsten hexafluoride gas during the second unit process cycle. The number N1 may be in a range from 2 to 100, and the number N2 may be in a range from 2 to 100, although a higher number may be employed for each of N1 and N2.

Figure 20:
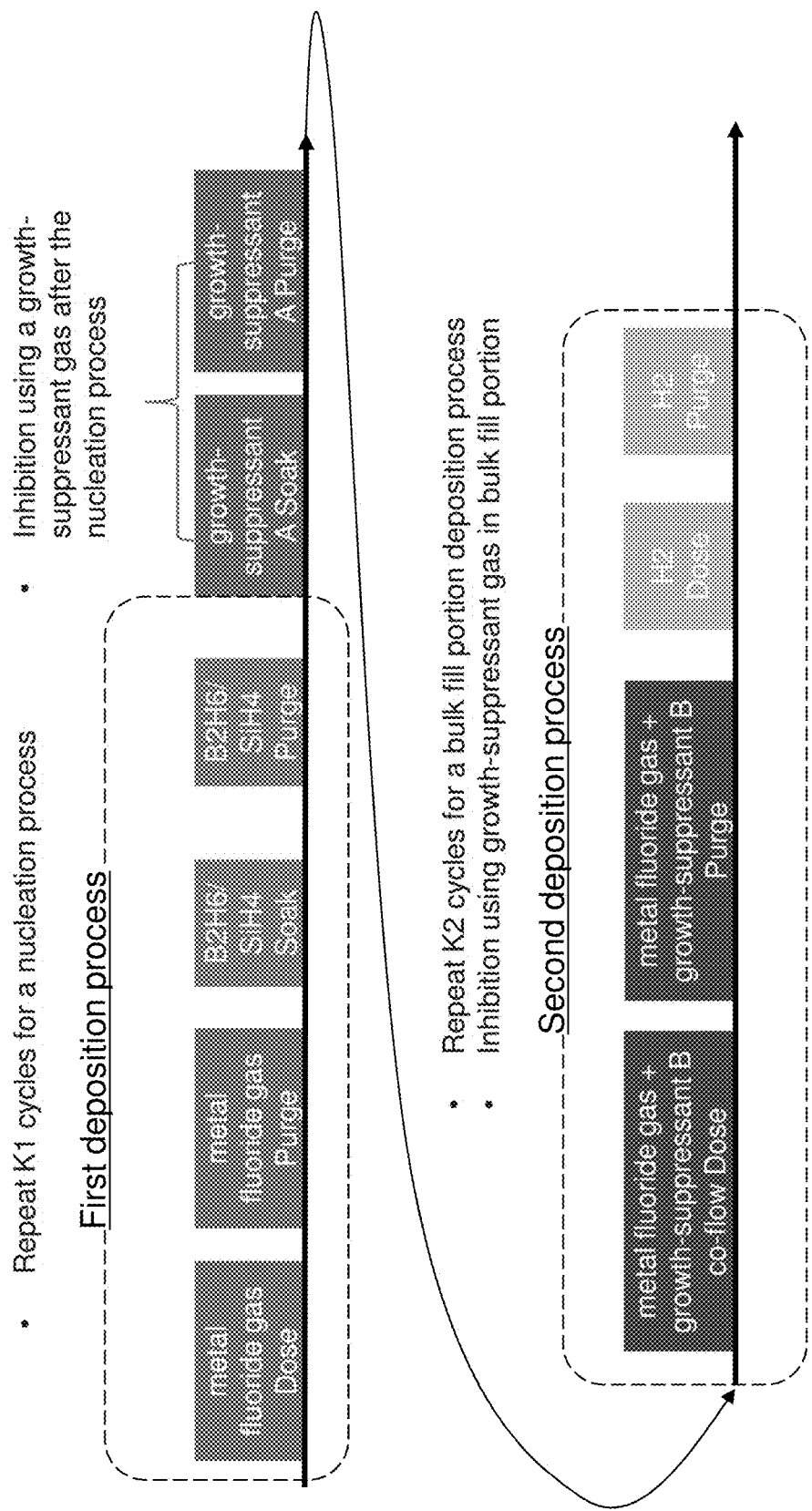
FIG. 20 is a flow chart of a first exemplary sequence of processing steps according to an embodiment of the present disclosure.

In another embodiment illustrated in FIG. 20, two different growth-suppressant gases may be used during different steps in process of forming the metal (e.g., tungsten) layer. The first growth-suppressant gas can be used to control initial reaction rate of tungsten deposition in the nucleation portion 361 of the tungsten layer, while a different second growth-suppressant gas can be used to control the reaction rate of tungsten deposition in the bulk fill portion 362 of the tungsten layer. In one aspect of this embodiment, ALD may be used to controllable deposit a smooth tungsten layer and avoid irregular initial tungsten growth during the nucleation step.

In a first deposition process the nucleation portion 361 of the metal (e.g., tungsten) layer is deposited in the cavity. The nucleation portion 361 may be deposited using K1 ALD cycles. The number K1 may be in a range from 2 to 100, although a higher number may be employed. Each of the K1 ALD cycles may include a metal (e.g., tungsten) deposition step by flowing a dose of the metal fluoride gas (e.g., tungsten hexafluoride) into the process chamber followed by a metal fluoride purge step. This is followed by a reducing step of flowing a hydrogen containing gas, such as silane and/or diborane, into the process chamber. The growth-suppressant gas may be omitted during the K1 ALD cycles.

The K1 ALD cycles are followed by a growth inhibition step. During the inhibition step, the first type of the growth-suppressant gas is provided into the process chamber. For example, a nitrogen containing growth-suppressant gas, such as $N_2$ and/or $NH_3$ is flowed into the process chamber, followed by a nitrogen containing growth-suppressant gas purge step.

The growth inhibition step is followed a second deposition process in which the bulk fill portion 362 is deposited on the nucleation portion 361 of the metal layer. The bulk fill portion 362 may be deposited using K2 ALD cycles. The number K2 may be in a range from 2 to 100, although a higher number may be employed. Each of the K2 ALD cycles may include a metal (e.g., tungsten) deposition step by flowing a dose of the metal fluoride gas (e.g., tungsten hexafluoride) and the second type of the growth-suppression gas into the process chamber using any of the sequences described above with respect to FIGS. 19A to 19D, followed by a purge step. The second type of the growth-suppressant gas may comprise a chlorine containing gas, such as a silicon and chlorine containing gas described above (e.g., DCS) and/or a boron and chlorine containing gas described above. This is followed by a reducing step which includes flowing the hydrogen gas into the process chamber, followed by the hydrogen gas purge step.

Figure 21:
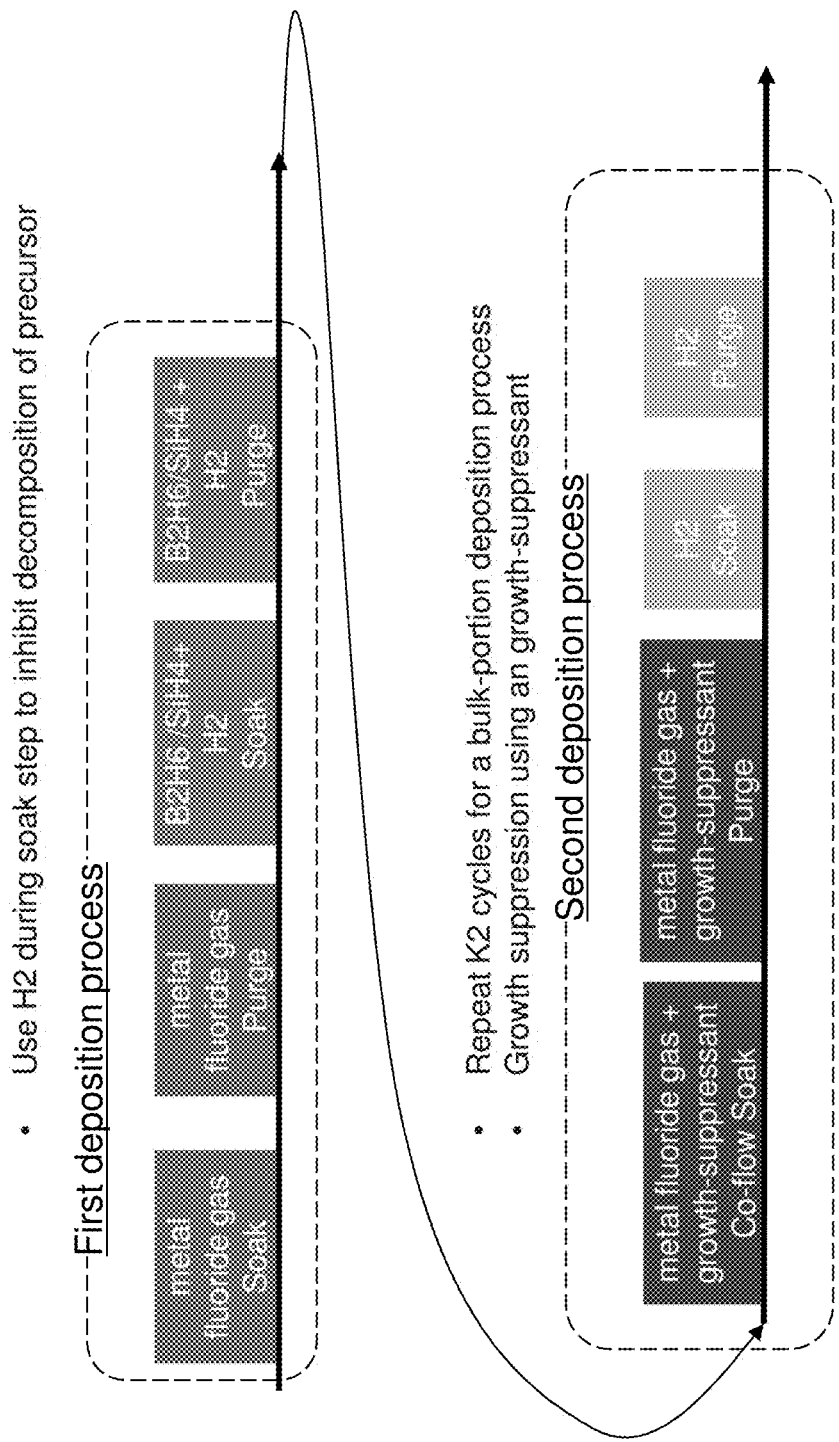
FIG. 21 is a flow chart of a second exemplary sequence of processing steps according to an embodiment of the present disclosure.

In another embodiment illustrated in FIG. 21, the nucleation portion 361 of the metal (e.g., tungsten) layer is omitted. Instead, hydrogen gas is used during the initial soak step to inhibit decomposition of the metal fluoride (e.g., tungsten hexafluoride) precursor. During the metal fluoride (e.g., tungsten hexafluoride) soak step, the metal fluoride gas is provided into the process chamber either concurrently with (e.g., in a CVD process) or sequentially with (e.g., in an ALD process) the hydrogen gas (e.g., $H_2$ gas) and a hydrogen containing gas (e.g., silane and/or diborane). In an ALD process, the metal fluoride soak step is followed by a first purge step, which is followed by the hydrogen gas and the hydrogen containing gas soak step followed by a second purge step.

The soak step is followed by a deposition process in which the bulk fill portion 362 is deposited in the cavity (e.g., directly on a barrier liner 46A, 76A or 96A). The bulk fill portion 362 may be deposited using K2 ALD cycles. The number K2 may be in a range from 2 to 100, although a higher number may be employed. Each of the K2 ALD cycles may include a metal (e.g., tungsten) deposition step by flowing a dose of the metal fluoride gas (e.g., tungsten hexafluoride) and the growth-suppression gas into the process chamber using any of the sequences described above with respect to FIGS. 19A to 19D, followed by a purge step. The growth-suppressant gas may comprise a nitrogen containing gas (e.g., nitrogen or ammonia) or a chlorine containing gas, such as a silicon and chlorine containing gas described above (e.g., DCS) and/or a boron and chlorine containing gas described above. This is followed by a reducing step which includes flowing the hydrogen gas into the process chamber, followed by the hydrogen gas purge step.

Figure 22A:
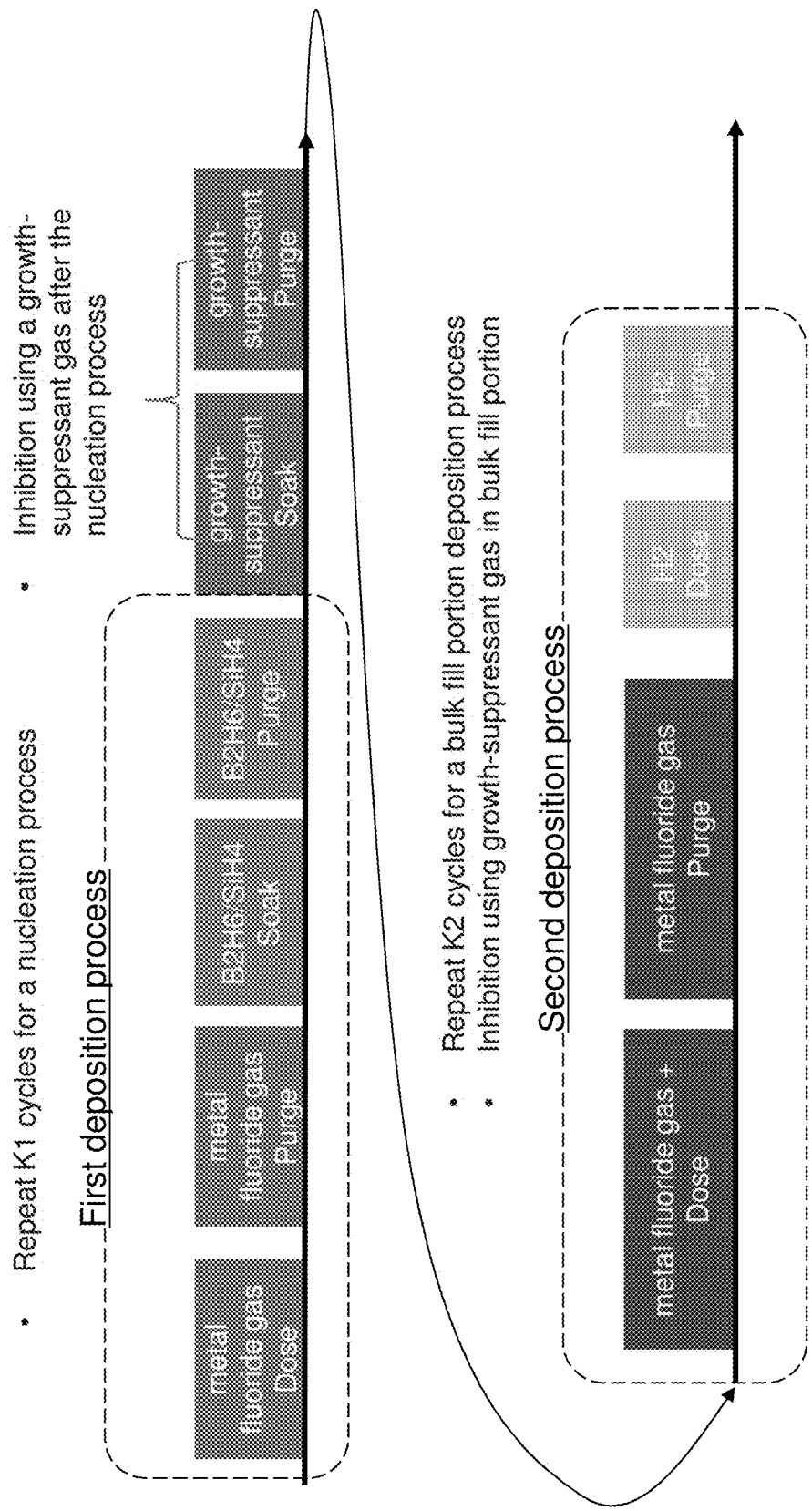
FIG. 22A is a flow chart of a third exemplary sequence of processing steps according to an embodiment of the present disclosure.

FIGS. 22A-22C illustrate a third exemplary sequence of processing steps according to an embodiment of the present disclosure. The third exemplary sequence differs from the first exemplary sequence in that the growth-suppressant gas is provided only between formation of the nucleation portion 361 (e.g., 46B1, 76B1, 96B1) and the bulk fill portion 362 (e.g., 46B, 76B, 96B) of the metal layer (e.g., 46B, 76B, 96B). Molecules of the growth-suppressant gas (e.g., a growth-suppressing element), such as chlorine and/or nitrogen, are located on the surface of the nucleation portion 361. The growth-suppressant gas may comprise a nitrogen containing gas (e.g., nitrogen or ammonia) or a chlorine containing gas, such as a silicon and chlorine containing gas described above (e.g., DCS) and/or a boron and chlorine containing gas described above. However, the growth-suppressant gas may be omitted during the deposition of the bulk fill portion 362 of the metal layer (e.g., 46B, 76B, 96B).

According to another embodiment, a growth-suppressant surface treatment may be provided on the barrier liner prior to deposition of the metal layer to reduce the deposition rate of the metal layer in a subsequent deposition process. FIGS. 23A-23B illustrate a fourth exemplary sequence of processing steps according to this embodiment of the present disclosure. After the barrier liner (46A, 76A, 96A) is formed in the cavity, the growth-suppressant gas is provided to the process chamber. Molecules of the growth-suppressant gas (e.g., a growth-suppressing element), such as chlorine and/or nitrogen, are located on the surface of the barrier liner. The growth-suppressing element decreases the deposition rate of the metal layer (46B, 76B, 96B) on the respective barrier liner (46A, 76A, 96A). The growth-suppressant gas may be omitted or may be provided during the subsequent deposition of the metal layer 46B, 76B, 96B.

In this embodiment, a method of depositing an electrically conductive layer (46, 76, 96) comprises providing a structure including a cavity (43, 79, 83) therein, disposing the structure in a process chamber, depositing a first portion (46A, 76A, 96A or 361) of the electrically conductive layer over at least one surface of the cavity, exposing the first portion of the electrically conductive layer to a tungsten growth-suppressant gas, and depositing a second tungsten portion (46B, 76B, 96B or 362) of the electrically conductive layer on the first portion of the electrically conductive layer by decomposition of tungsten hexafluoride.

In one embodiment shown in FIGS. 22A-22C, the first portion of the electrically conductive layer comprises a tungsten nucleation portion 361 of a tungsten layer (46B, 76B, 96B), and the second tungsten portion of the electrically conductive layer comprises a tungsten bulk fill portion 362 of the tungsten layer (46B, 76B, 96B).

In another embodiment shown in FIGS. 23A-23B, the first portion of the electrically conductive layer comprises an electrically conductive barrier liner (46A, 76A, 96A) and the second tungsten portion of the electrically conductive layer comprises a tungsten layer (46B, 76B, 96B). The barrier liner (46A, 76A, 96A) comprises Ru, Mo, TiN, TaN, WN, MoN, TiON, TiSiN, WCN, MoCN, TiC, TaC, WC, or a stack thereof.

Figure 24:
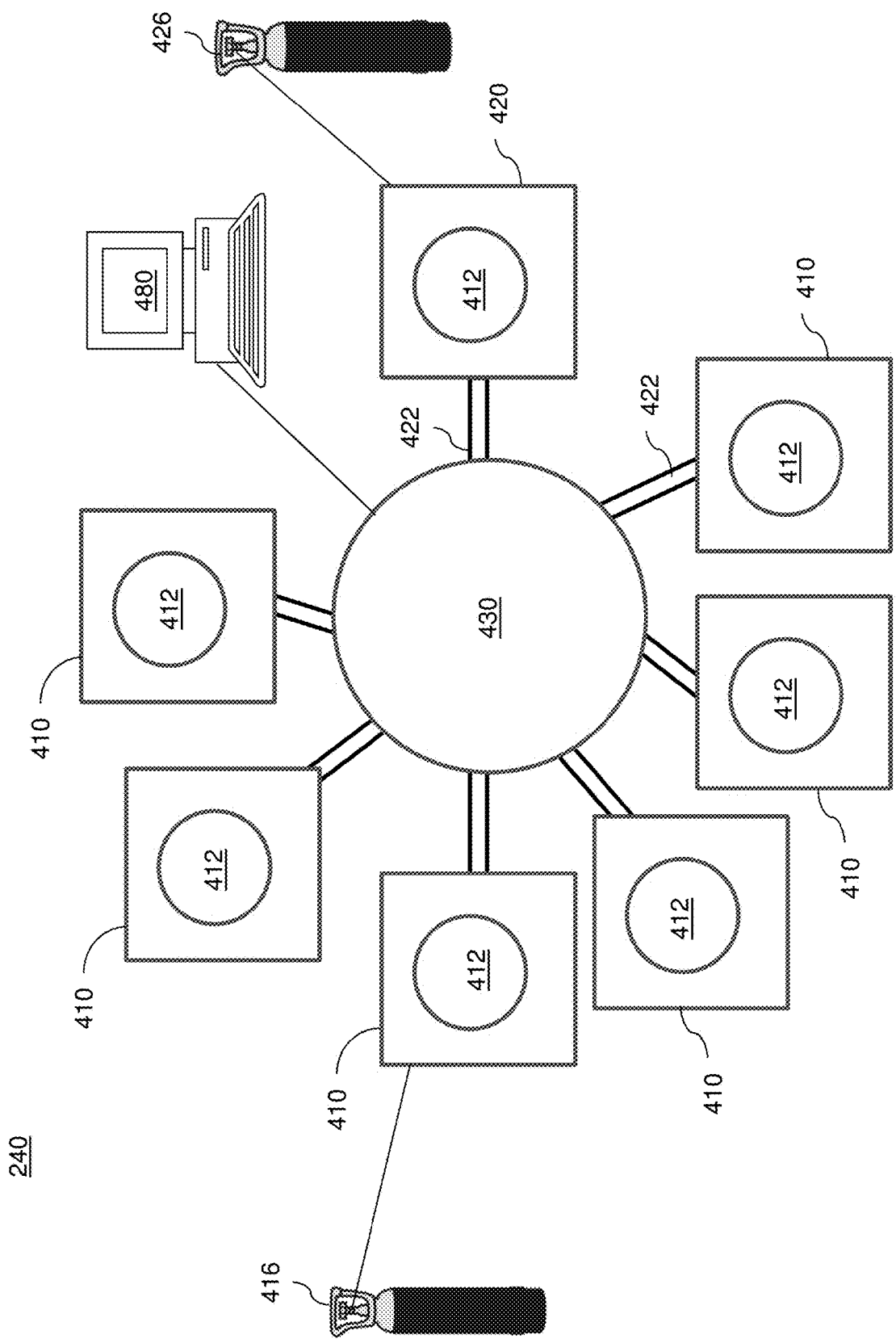
FIG. 24 is a schematic view of a first exemplary apparatus for implementing a deposition process according to an embodiment of the present disclosure.
Figure 25:
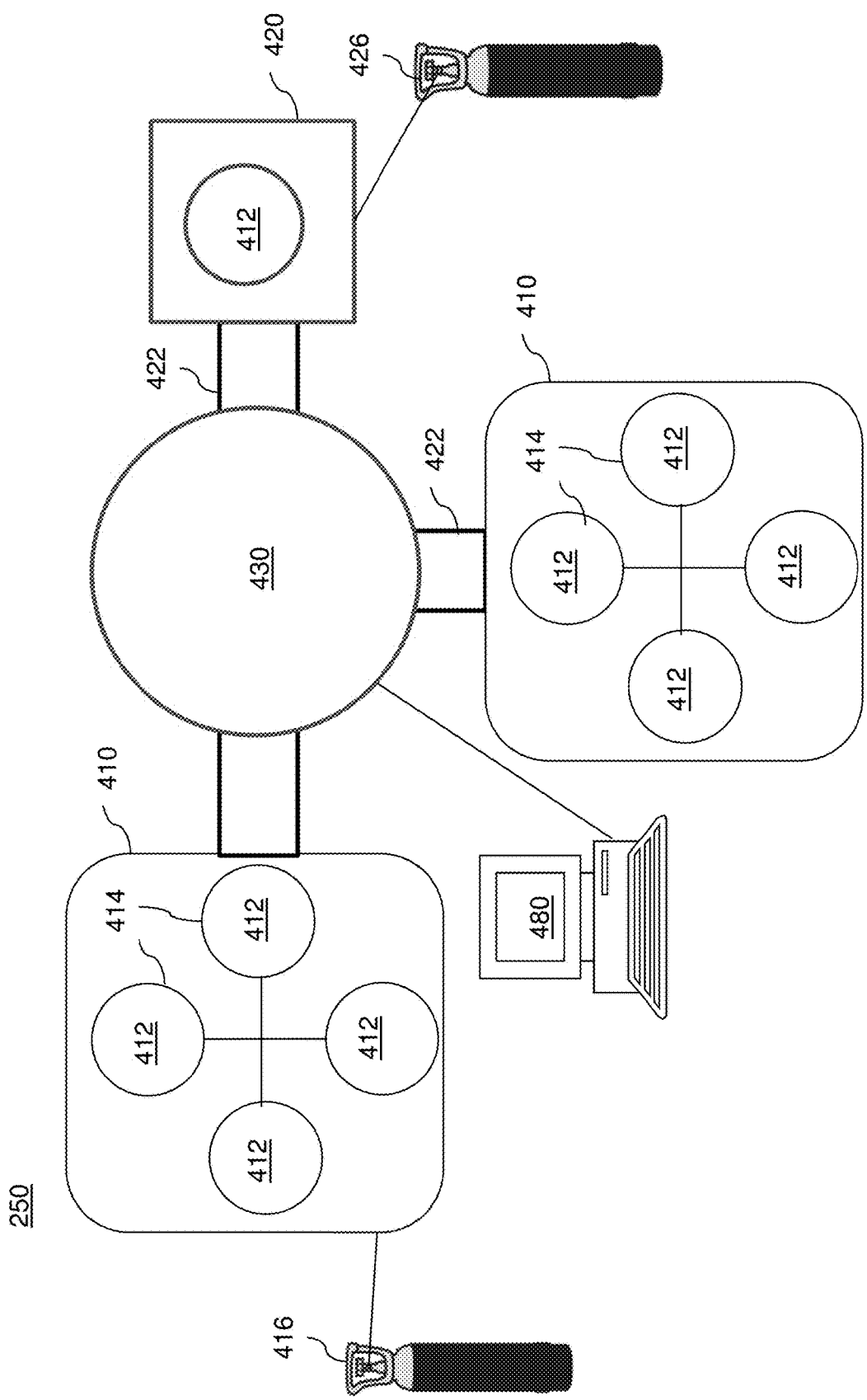
FIG. 25 is a schematic view of a second exemplary apparatus for implementing a deposition process according to an embodiment of the present disclosure.
Figure 26:
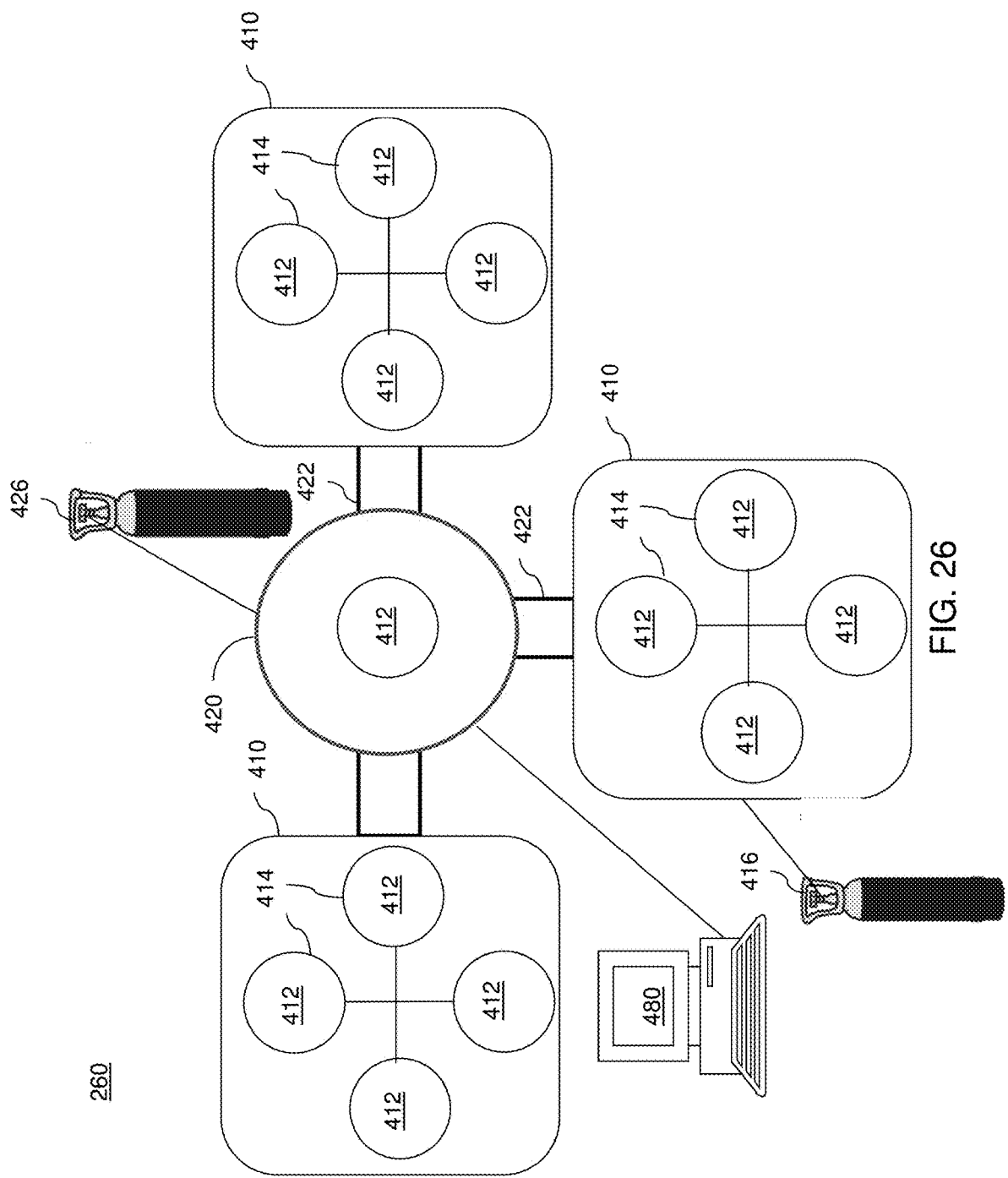
FIG. 26 is a schematic view of a third exemplary apparatus for implementing a deposition process according to an embodiment of the present disclosure.
Figure 27:
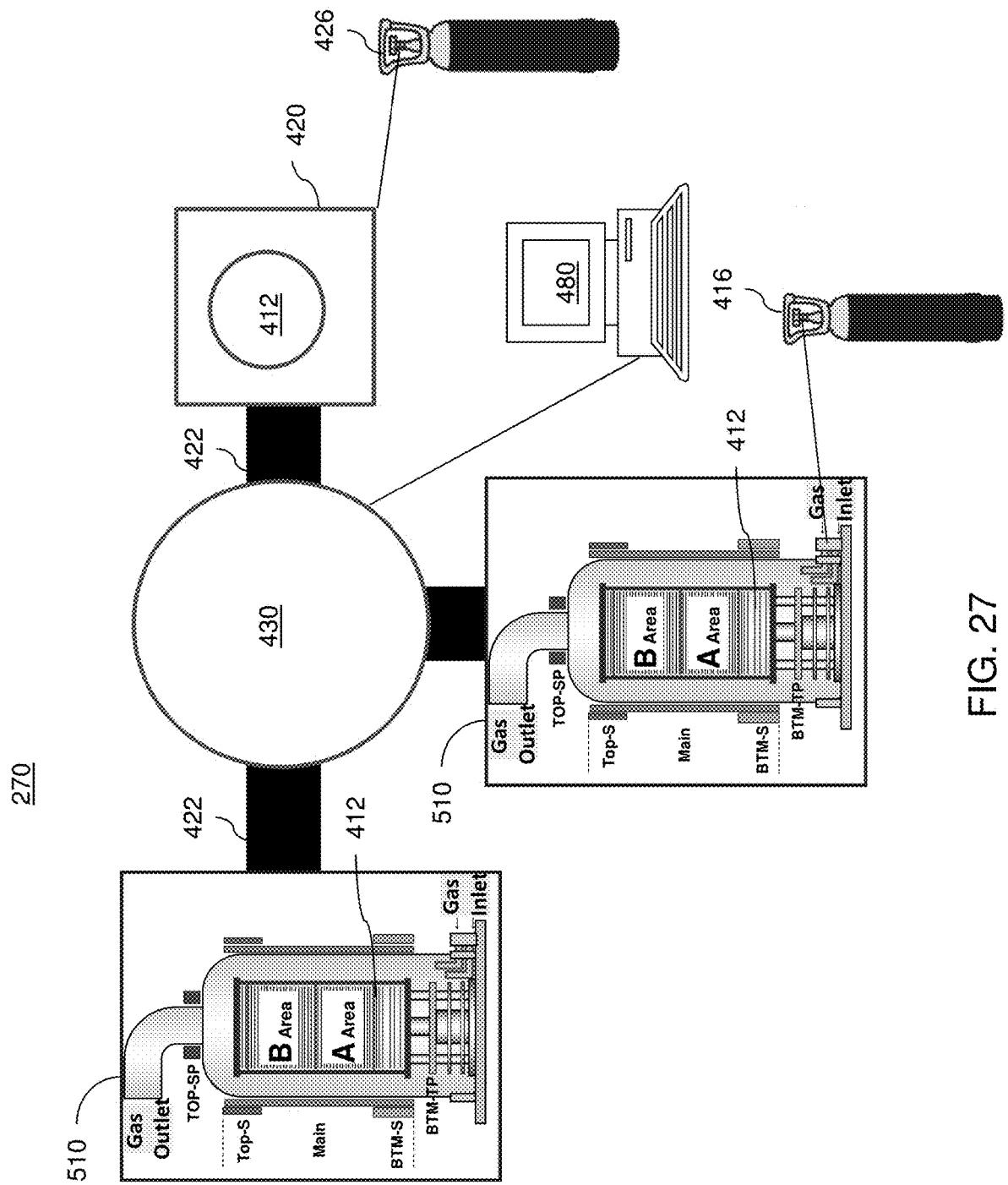
FIG. 27 is a schematic view of a fourth exemplary apparatus for implementing a deposition process according to an embodiment of the present disclosure.

According to an aspect of the present disclosure, apparatuses are provided for effecting the various deposition processes, soak processes, and purge processes of the metal layer of the embodiments of the present disclosure as described above. FIG. 24 is a schematic view of a first exemplary apparatus 240 for implementing a deposition process according to an embodiment of the present disclosure. FIG. 25 is a schematic view of a second exemplary apparatus 250 for implementing a deposition process according to an embodiment of the present disclosure. FIG. 26 is a schematic view of a third exemplary apparatus 260 for implementing a deposition process according to an embodiment of the present disclosure. FIG. 27 is a schematic view of a fourth exemplary apparatus 270 for implementing a deposition process according to an embodiment of the present disclosure.

Referring collectively to FIGS. 24-27, each of the metal deposition apparatuses comprises at least one metal deposition chamber (410, 510), which in one embodiment may be referred to as a "process chamber". Each of the at least one metal deposition chamber (410, 510) is configured to receive at least one substrate 412 loaded therein and to deposit a metal layer (e.g., tungsten layer) on each substrate 412 by flowing the metal fluoride gas therein during a respective deposition process. Generally, each metal deposition chamber (410, 510) may be configured to perform any of the metal deposition steps described with reference to FIGS. 15A-23B of the present disclosure. Each metal deposition chamber (410, 510) may comprise an ALD or a CVD deposition chamber. In one embodiment, the growth-suppressant gas may be provided into the metal deposition chamber (410, 510), as described above with respect to FIG. 19A, 19B, 19D, 20 or 21.

In another embodiment, the growth-suppressant gas may be provided into the surface treatment chamber 420 which is separate from the metal deposition chambers (410, 510). In this embodiment, the process chamber may comprise a volume of a combination of the metal deposition chamber(s) (410, 510), the surface treatment chamber 420 and any optional transfer chambers 430 which the wafer 412 may access without breaking vacuum. For example, the surface treatment chamber 420 may be connected to the at least one metal deposition chamber (410, 510) via one or more load locks 422 or conduits of a multi-chamber vacuum processing apparatus (240, 250, 260, 270). One or more first gas tanks 416 are fluidly connected to the deposition chambers 410 and contain tungsten hexafluoride. One or more second gas tanks 426 are fluidly connected to the surface treatment chamber 420 and contain the tungsten growth-suppressant gas selected from $SiH_3Cl$, $SiH_2Cl_2$, $SiHCl_3$, $SiCl_4$, $N_2$, $NH_3$, $BH_2Cl$, $BHCl_2$, or $BCl_3$. The separate metal deposition chamber(s) (410, 510) and surface treatment chamber 420 may be used to perform the methods described above with respect to FIG. 19C, 20, 22A-22C or 23A-23B.

The surface treatment chamber 420 is configured to receive substrate 412 loaded therein and to expose the substrate 412 to the growth-suppressant gas to perform any of the previously described inhibition (e.g., growth suppression) steps using the growth-suppressant gas. Molecules of the growth-suppressant gas may comprise a growth-suppressing element, such as nitrogen and/or chlorine, and atoms of the growth-suppressing element adsorb on a surface of the substrate 412. The surface treatment chamber 420 may comprise a single wafer deposition chamber configured to load only a single substrate, or may comprise a multi-wafer chamber configured to load multiple substrates and to perform a surface treatment process on the multiple substrates.

Each of the metal deposition apparatuses also comprises a process controller 480 configured to transfer each substrate 412 that is treated in the surface treatment chamber 420 to and/or from a respective one of the at least one metal deposition chamber (410, 510). The substrates 412 may be transferred between various chambers of the apparatus (240, 250, 260, 270) using a robot arm and/or a conveyor, as is known in the art.

In one embodiment, the at least one metal deposition chamber 410 comprises a plurality of single wafer deposition chambers 410 in the apparatus 240 illustrated in FIG. 24. In one embodiment, each of the plurality of single wafer deposition chambers 410 may be configured to receive a respective single substrate 412, and to deposit a respective metal layer on the respective single substrate 412. A transfer chamber 430 equipped with at least one substrate-transfer robotic arm (not illustrated) may be provided to facilitate transfer of substrates 412 from the surface treatment chamber 420 to the plurality of single wafer deposition chambers 410 and vice versa.

In another embodiment, the at least one metal deposition chamber 410 comprises at least one multi-wafer deposition chamber 410 in which a respective plurality of substrates 412 are loaded in different sub-chambers (e.g., areas) 414 within a respective metal deposition chamber 410 of apparatuses 250 or 260 as illustrated in FIGS. 25 and 26. A transfer chamber 430 equipped with at least one substrate-transfer robotic arm (not illustrated) may be provided to facilitate transfer of substrates from the surface treatment chamber 420 to the plurality of the deposition chambers 410 and vice versa in apparatus 250 as illustrated in FIG. 25. Alternatively, the surface treatment chamber 420 may be connected to each of the deposition chambers 410 through various load locks or conduits 422, and may function as a transfer chamber of apparatus 260 as illustrated in FIG. 26.

In another embodiment, the at least one metal deposition chamber comprises a furnace chamber 510 (or a plurality of furnace chambers 510) in which a plurality of substrates 412 are stacked into a cassette. The substrates may be stacked vertically over each other loaded such that areas of the plurality of substrates 412 overlap in a plan view (such as a top-down view) and the plurality of substrates 412 are vertically spaced from each other in apparatus 270 as illustrated in FIG. 27.

The use of the growth-suppressant gas during a pre-deposition soak step and/or during a deposition step reduces the deposition rate of a metal (e.g., tungsten) derived from a metal fluoride (e.g., tungsten hexafluoride) precursor gas, and increases the conformity of the deposition profile of the deposited metal layer Enhanced conformity in the deposition profile reduces the volume of voids in high aspect ratio cavities, and reduces the effect of seams in the deposited metal layer or metal portion. Fluorine trapping in voids is reduced or eliminated, and reliability of the devices can be enhanced by reducing fluorine induced voids.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of depositing a metal, comprising:
providing a structure a process chamber; and
providing a metal fluoride gas and two different growth-suppressant gases into the process chamber to deposit the metal over the structure;
wherein:
the metal comprises tungsten;
the metal fluoride gas comprises tungsten hexafluoride;
a first growth-suppressant gas comprises a nitrogen containing gas;
a second growth-suppressant gas comprises gas containing a halogen other than fluorine;
the method comprises an atomic layer deposition process comprising a plurality of unit process cycles, and each unit process cycle comprises a tungsten deposition step, a tungsten hexafluoride purge step, a reducing step and a reducing gas purging step; and
during the tungsten deposition step, initiation of flow the second growth-suppressant gas into the process chamber occurs during a flow of the metal fluoride gas into the process chamber and after the initiation of flow of the metal fluoride gas into the process chamber.

2. A method of depositing a metal, comprising:
providing a structure a process chamber; and
providing a metal fluoride gas and two different growth-suppressant gases into the process chamber to deposit the metal over the structure;
wherein:
the metal comprises tungsten;
the metal fluoride gas comprises tungsten hexafluoride;
a first growth-suppressant gas comprises a nitrogen containing gas;
a second growth-suppressant gas comprises gas containing a halogen other than fluorine;
the method comprises an atomic layer deposition process comprising a plurality of unit process cycles, and each unit process cycle comprises a tungsten deposition step, a tungsten hexafluoride purge step, a reducing step and a reducing gas purging step; and
the growth-suppressant gas is flown into the process chamber occurs during the reducing step.

3. The method of claim 2, wherein the second growth-suppressant gas is flown into the process chamber occurs between each of the unit process cycles.

4. A method of depositing a metal, comprising:
providing a structure a process chamber; and
providing a metal fluoride gas and two different growth-suppressant gases into the process chamber to deposit the metal over the structure;
wherein:
the metal comprises tungsten;
the metal fluoride gas comprises tungsten hexafluoride;
a first growth-suppressant gas comprises a nitrogen containing gas;
a second growth-suppressant gas comprises gas containing a halogen other than fluorine;
the method comprises an atomic layer deposition process comprising a plurality of unit process cycles, and each unit process cycle comprises a tungsten deposition step, a tungsten hexafluoride purge step, a reducing step and a reducing gas purging step; and
the second growth-suppressant gas is not flown into the process chamber during a first set of the unit process cycles, and the second growth-suppressant gas is flown into the process chamber during a second set of the unit process cycles.

* * * * *